(12) United States Patent
Maekawa et al.

(10) Patent No.: US 12,119,293 B2
(45) Date of Patent: Oct. 15, 2024

(54) THROUGH ELECTRODE SUBSTRATE AND MOUNTING SUBSTRATE

(71) Applicant: DAI NIPPON PRINTING CO., LTD., Tokyo-to (JP)

(72) Inventors: Shinji Maekawa, Tokyo-to (JP);
Hiroshi Kudo, Tokyo-to (JP);
Takamasa Takano, Tokyo-to (JP);
Hiroshi Mawatari, Tokyo-to (JP);
Masaaki Asano, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 274 days.

(21) Appl. No.: 17/497,261

(22) Filed: Oct. 8, 2021

(65) Prior Publication Data
US 2022/0028772 A1    Jan. 27, 2022

Related U.S. Application Data

(62) Division of application No. 16/322,741, filed as application No. PCT/JP2017/028429 on Aug. 4, 2017, now abandoned.

(30) Foreign Application Priority Data

Aug. 4, 2016 (JP) ................................. 2016-153977

(51) Int. Cl.
*H01L 23/498*    (2006.01)
*H01L 21/48*    (2006.01)
(Continued)

(52) U.S. Cl.
CPC ...... *H01L 23/49827* (2013.01); *H01L 21/481* (2013.01); *H01L 21/486* (2013.01);
(Continued)

(58) Field of Classification Search
CPC ........... H01L 23/49827; H01L 23/5384; H01L 23/49894; H01L 21/486; H01L 21/4857; H01L 23/49822
See application file for complete search history.

(56) References Cited

U.S. PATENT DOCUMENTS 4,740,414 A     4/1988  Shaheen
2007/0090546 A1*  4/2007  Shioga .................... H01L 23/50
                                           257/E23.079
(Continued)

FOREIGN PATENT DOCUMENTS

JP     2010-258320 A    11/2010
JP     2010-278202 A    12/2010
(Continued)

OTHER PUBLICATIONS

NPL documents submitted in U.S. Appl. No. 16/322,741, filed Oct. 17, 2017 International Search Report issued in International Patent Application No. PCT/JP2017/028429.
(Continued)

*Primary Examiner* — Mohsen Ahmadi
(74) *Attorney, Agent, or Firm* — Oliff PLC

(57) ABSTRACT

A through electrode substrate includes a substrate provided with a through hole, a through electrode positioned in the through hole, and a first wiring structure including at least a first wiring layer positioned on a first surface of the substrate, and a second wiring layer positioned on the first wiring layer. The first wiring layer and the second wiring layer respectively have an insulation layer and an electro-conductive layer. A first insulation layer of the first wiring layer includes at least an organic layer. At least one wiring layer of the first wiring structure includes an inorganic layer having insulation properties, the inorganic layer being posi-
(Continued)

tioned to a first side of the organic layer of the first insulation layer of the first wiring layer.

15 Claims, 36 Drawing Sheets

(51) Int. Cl.
    *H01L 21/683*      (2006.01)
    *H01L 23/15*      (2006.01)
    *H05K 3/46*      (2006.01)

(52) U.S. Cl.
    CPC ........ *H01L 23/15* (2013.01); *H01L 23/49838* (2013.01); *H05K 3/46* (2013.01); *H01L 23/49894* (2013.01); *H01L 2221/68345* (2013.01)

(56) References Cited

U.S. PATENT DOCUMENTS

| | | | |
|---|---|---|---|
| 2008/0253097 A1* | 10/2008 | Kawano | H01L 23/49816 361/766 |
| 2011/0048788 A1* | 3/2011 | Wang | H01L 23/481 174/262 |
| 2011/0056740 A1 | 3/2011 | Takano | |
| 2011/0133343 A1 | 6/2011 | Wada | |
| 2012/0153430 A1* | 6/2012 | Bachman | H01L 21/76224 438/653 |
| 2015/0235955 A1 | 8/2015 | Kudo et al. | |
| 2015/0303139 A1* | 10/2015 | Wu | C23F 1/00 216/13 |
| 2017/0018492 A1 | 1/2017 | Imayoshi et al. | |
| 2018/0011046 A1* | 1/2018 | Brown | G01N 27/3335 |
| 2018/0019197 A1 | 1/2018 | Boyapati et al. | |

FOREIGN PATENT DOCUMENTS

| | | |
|---|---|---|
| JP | 2011-082496 A | 4/2011 |
| WO | 2014/069662 A1 | 5/2014 |

OTHER PUBLICATIONS

Feb. 5, 2019 International Preliminary Report on Patentability issued in International Patent Application No. PCT/JP2017/028429.

Jun. 30, 2021 Office Action issued in Taiwanese Patent Application No. 110106480.

* cited by examiner

THROUGH ELECTRODE SUBSTRATE AND MOUNTING SUBSTRATE

This is a Divisional of application Ser. No. 16/322,741 filed May 3, 2019, which in turn is a National Phase of PCT International Patent Application No. PCT/JP2017/028429 filed Aug. 4, 2017, which claims the benefit of Japanese Patent Application No. 2016-153977 filed Aug. 4, 2016. The disclosure of the prior applications is hereby incorporated by reference herein in its entirety.

BACKGROUND OF THE INVENTION

Field of the Invention

The embodiment of the disclosure relates to a through electrode substrate. In addition, the embodiment of the disclosure relates to a mounting substrate comprising the through electrode substrate.

Background Art

A member so-called through electrode substrate, which includes a substrate having a first surface and a second surface, a plurality of through holes provided in the substrate, and an electrode provided inside each through hole is widely used. For example, a through electrode substrate is used as an interposer interposed between two LSI chips, when a plurality of LSI chips are stacked in order to increase a packaging density of an LSI. In addition, a through electrode substrate is sometimes interposed between an element such as an LSI chip and a mounting substrate such as a motherboard. In the following description, an electrode provided inside a through hole is sometimes referred to as "through electrode".

The through electrode substrate includes a plurality of wiring layers stacked on a through electrode. Each wiring layer has an electroconductive layer and an insulation layer positioned between electroconductive layers of respective wiring layers. As disclosed in Patent Document 1, for example, an organic material such as polyimide is used as a material for forming an insulation layer. A metal material such as copper is used as a material for forming an electroconductive layer. A step of forming an electroconductive layer includes a step of forming copper by plating, a step of annealing the copper formed by plating, and so on.

Patent Document 1: WO2014/69662

SUMMARY OF THE INVENTION

When a through electrode substrate is manufactured, a substrate and a through electrode are repeatedly exposed to a high temperature, e.g., a temperature of not less than 200° C., in an organic-material baking step, a copper annealing step, etc. On the other hand, a coefficient of thermal expansion of a metal material, such as copper, forming a through electrode is generally larger than a coefficient of thermal expansion of an inorganic material, such as glass or silicon, forming a substrate. Thus, each time when a temperature rises, it is considered that a through electrode thermally expands greatly as compared with a substrate, so that an electroconductive layer of a wiring layer connected to a through electrode is subjected to stress. When the electroconductive layer of the wiring layer is repeatedly subjected to stress, a defect may occur at a position where a plurality of electroconductive layers of wiring layers are connected to one another, resulting in connection failure between the electroconductive layers.

The embodiment of the disclosure has been made in view of such a point. The object thereof is to provide a through electrode substrate capable of reducing generation of connection failure.

One embodiment of the disclosure is:
a through electrode substrate comprising:
a substrate including a first surface positioned on a first side, and a second surface positioned on a second side opposite to the first side, the substrate being provided with a through hole;
a through electrode positioned in the through hole of the substrate, the through electrode having a first end surface on the first side and a second end surface on the second side; and
a first wiring structure including at least a first wiring layer positioned on the first surface of the substrate, and a second wiring layer positioned on the first wiring layer;
wherein:
the first wiring layer has a first insulation layer provided with a first opening positioned on the first end surface of the through electrode, and a first electroconductive layer connected to the first end surface of the through electrode through the first opening of the first insulation layer;
the second wiring layer has a second insulation layer provided with a second opening positioned on the first electroconductive layer of the first wiring layer, and a second electroconductive layer connected to the first electroconductive layer of the first wiring layer through the second opening of the second insulation layer;
the first insulation layer of the first wiring layer includes at least an organic layer;
at least any one layer selected from the group of the first insulation layer of the first wiring layer, the second insulation layer of the second wiring layer, and a layer of the first wiring structure not included in the first wiring layer and the second wiring layer, includes an inorganic layer having insulation properties; and
the inorganic layer is positioned to the first side of the organic layer of the first insulation layer of the first wiring layer.

In the through electrode substrate according to the one embodiment of the disclosure, the organic layer of the first insulation layer of the first wiring layer may be in contact with the first end surface of the through electrode.

In the through electrode substrate according to the one embodiment of the disclosure, the second insulation layer of the second wiring layer may include the inorganic layer.

In the through electrode substrate according to the one embodiment of the disclosure, the inorganic layer of the second insulation layer of the second wiring layer may at least partially cover the first electroconductive layer of the first wiring layer.

In the through electrode substrate according to the one embodiment of the disclosure, the second insulation layer of the second wiring layer may further have an organic layer positioned to the first side of the inorganic layer.

In the through electrode substrate according to the one embodiment of the disclosure,
the first wiring structure may further include a third wiring layer positioned on the second wiring layer; and
the third wiring layer may include: a third insulation layer including an inorganic layer and an organic layer positioned to the first side of the inorganic layer, the third insulation layer being provided with a third opening positioned on the second electroconductive layer of the second wiring layer; and a third electroconductive layer connected to the second electroconductive layer of the second wiring layer through the third opening of the third insulation layer.

The through electrode substrate according to the one embodiment of the disclosure may further comprise a second wiring structure including at least a first wiring layer positioned on the second surface of the substrate, and a second wiring layer positioned on the first wiring layer. In this case, the first wiring layer of the second wiring structure may have a first insulation layer provided with a first opening positioned on the second end surface of the through electrode, and a first electroconductive layer connected to the second end surface of the through electrode through the first opening of the first insulation layer, and the second wiring layer of the second wiring structure may have a second insulation layer provided with a second opening positioned on the first electroconductive layer of the first wiring layer, and a second electroconductive layer connected to the first electroconductive layer of the first wiring layer through the second opening of the second insulation layer, and the first insulation layer of the first wiring layer of the second wiring structure may include at least an organic layer. In this case, the insulation layer of the second wiring layer of the second wiring structure may include an inorganic layer having insulation properties.

In the through electrode substrate according to the one embodiment of the disclosure, the inorganic layer of the second insulation layer of the second wiring layer of the second wiring structure may at least partially cover the first electroconductive layer of the first wiring layer of the second wiring structure.

In the through electrode substrate according to the one embodiment of the disclosure, the number of layers of the electroconductive layer included in the first wiring structure, and the number of layers of the electroconductive layer included in the second wiring structure may differ from each other. For example, the number of layers of the electroconductive layer included in the second wiring structure may be smaller than the number of layers of the electroconductive layer included in the first wiring structure. In this case, the organic layer of the first wiring layer of the second wiring structure may include a portion that is not covered with the inorganic layer of the second wiring layer of the second wiring structure. In this case, a ratio of a portion of the organic layer of the first wiring layer of the second wiring structure, which portion is covered with the inorganic layer of the second wiring layer of the second wiring structure, may be lower than a ratio of a portion of the organic layer of the first wiring layer of the first wiring structure, which portion is covered with the inorganic layer of the second wiring layer of the first wiring structure.

In the through electrode substrate according to the one embodiment of the disclosure,
the through electrode substrate may further comprise a second wiring structure including at least a first wiring layer positioned on the second surface of the substrate;
the first wiring layer of the second wiring structure may have a first insulation layer provided with a first opening positioned on the second end surface of the through electrode, and a first electroconductive layer connected to the second end surface of the through electrode through the first opening of the first insulation layer;
the first insulation layer of the first wiring layer of the second wiring structure may include at least an organic layer; and
the first electroconductive layer and the organic layer of the first wiring layer of the second wiring structure may not be covered with an inorganic layer having insulation properties.

In the through electrode substrate according to the one embodiment of the disclosure, the through hole may be filled with the through electrode.

In the through electrode substrate according to the one embodiment of the disclosure, the first opening of the first insulation layer of the first wiring layer, which first opening is for connecting the through electrode and the first electroconductive layer of the first wiring layer, may be at least partially overlapped with the through hole of the substrate, when seen along the normal direction of the first surface of the substrate.

In the through electrode substrate according to the one embodiment of the disclosure, the through electrode may have a sidewall portion that extends along a sidewall of the through hole, and a first portion connected to the sidewall portion from the first side, and including the first end surface connected to the electroconductive layer of the first wiring layer.

In the through electrode substrate according to the one embodiment of the disclosure, the first portion of the through electrode may be at least partially positioned on the first surface of the substrate, and the first electroconductive layer of the first wiring layer may be connected to the first portion positioned on the first surface of the substrate.

In the through electrode substrate according to the one embodiment of the disclosure, the first portion of the through electrode may extend along a plane direction of the first surface of the substrate so as to be at least partially overlapped with the though hole of the substrate, when seen along the normal direction of the first surface of the substrate, and the first electroconductive layer of the first wiring layer may be connected to the first portion at a position that is overlapped with the through hole of the substrate, when seen along the normal direction of the first surface of the substrate.

In the through electrode substrate according to the one embodiment of the disclosure, the first insulation layer of the first wiring layer may include the inorganic layer positioned to the first side of the organic layer.

In the through electrode substrate according to the one embodiment of the disclosure, the inorganic layer of the first insulation layer of the first wiring layer may be at least partially in contact with the first electroconductive layer of the first wiring layer from the second side.

In the through electrode substrate according to the one embodiment of the disclosure, the second insulation layer of the second wiring layer may have an organic layer and an inorganic layer positioned to the first side of the organic layer.

In the through electrode substrate according to the one embodiment of the disclosure,
the first wiring structure may further include a third wiring layer positioned on the second wiring layer; and
the third wiring layer may have: a third insulation layer including an organic layer and an inorganic layer positioned to the first side of the organic layer, the third insulation layer being provided with a third opening positioned on the electroconductive layer of the second wiring layer; and a third electroconductive layer connected to the second electroconductive layer of the second wiring layer through the third opening of the third insulation layer.

The through electrode substrate according to the one embodiment of the disclosure may further comprise a second wiring structure including at least a first wiring layer positioned on the second surface of the substrate, and a second wiring layer positioned on the first wiring layer. In this case, the first wiring layer of the second wiring structure may have a first insulation layer provided with a first opening positioned on the second end surface of the through electrode, and a first electroconductive layer connected to the second end surface of the through electrode through the first opening of the first insulation layer, the second wiring layer of the second wiring structure may have a second insulation layer provided with a second opening positioned on the first electroconductive layer of the first wiring layer, and a second electroconductive layer connected to the first electroconductive layer of the first wiring layer through the second opening of the second insulation layer, and the first insulation layer of the first wiring layer of the second wiring structure may include at least an organic layer. In this case, the first insulation layer of the first wiring layer of the second wiring structure may further include an inorganic layer having insulation properties, the inorganic layer being positioned to the second side of the organic layer.

In the through electrode substrate according to the one embodiment of the disclosure, the inorganic layer of the first insulation layer of the first wiring layer of the second wiring structure may be at least partially in contact with the first electroconductive layer of the first wiring layer of the second wiring structure from the first side.

In the through electrode substrate according to the one embodiment of the disclosure, the number of layers of the electroconductive layer included in the first wiring structure, and the number of layers of the electroconductive layer included in the second wiring structure may differ from each other. For example, the number of layers of the electroconductive layer included in the second wiring structure may be smaller than the number of layers of the electroconductive layer included in the first wiring structure. In this case, the organic layer of the first wiring layer of the second wiring structure may include a portion that is not covered with the inorganic layer of the first wiring layer of the second wiring structure. In this case, a ratio of a portion of the organic layer of the first wiring layer of the second wiring structure, which portion is covered with the inorganic layer of the first wiring layer of the second wiring structure, may be lower than a ratio of a portion of the organic layer of the first wiring layer of the first wiring structure, which portion is covered with the inorganic layer of the first wiring layer of the first wiring structure.

The through electrode substrate according to the one embodiment of the disclosure may further comprise a second wiring structure including at least a first wiring layer positioned on the second surface of the substrate; the first wiring layer of the second wiring structure may have a first insulation layer provided with a first opening positioned on the second end surface of the through electrode, and a first electroconductive layer connected to the second end surface of the through electrode through the first opening of the first insulation layer; the first insulation layer of the first wiring layer of the second wiring structure may include at least an organic layer; and the first electroconductive layer and the organic layer of the first wiring layer of the second wiring structure may not be covered with an inorganic layer having insulation properties.

In the through electrode substrate according to the one embodiment of the disclosure, the through hole may be filled with the through electrode.

In the through electrode substrate according to the one embodiment of the disclosure, the first opening of the first insulation layer of the first wiring layer, which first opening is for connecting the through electrode and the first electroconductive layer of the first wiring layer, may be at least partially overlapped with the through hole of the substrate, when seen along the normal direction of the first surface of the substrate.

In the through electrode substrate according to the one embodiment of the disclosure, the through electrode may have a sidewall portion that extends along a sidewall of the through hole, and a first portion connected to the sidewall portion from the first side, and including the first end surface connected to the electroconductive layer of the first wiring layer.

In the through electrode substrate according to the one embodiment of the disclosure, the first portion of the through electrode may be at least partially positioned on the first surface of the substrate, and the first electroconductive layer of the first wiring layer may be connected to the first portion positioned on the first surface of the substrate.

In the through electrode substrate according to the one embodiment of the disclosure, the first portion of the through electrode may extend along a plane direction of the first surface of the substrate so as to be at least partially overlapped with the though hole of the substrate, when seen along the normal direction of the first surface of the substrate, and the first electroconductive layer of the first wiring layer may be connected to the first portion at a position that is overlapped with the through hole of the substrate, when seen along the normal direction of the first surface of the substrate.

In the through electrode substrate according to the one embodiment of the disclosure, the organic layer may contain at least polyimide, epoxy or acryl.

In the through electrode substrate according to the one embodiment of the disclosure, the inorganic layer may contain at least silicon oxide or silicon nitride.

One embodiment of the disclosure is:
a mounting substrate comprising:
a through electrode substrate; and
an element loaded on the through electrode substrate;
wherein:
the through electrode substrate comprises:
a substrate including a first surface positioned on a first side, and a second surface positioned on a second side opposite to the first side, the substrate being provided with a through hole;
a through electrode positioned in the through hole of the substrate, the through electrode having a first end surface on the first side and a second end surface on the second side; and
a first wiring structure including at least a first wiring layer positioned on the first surface of the substrate, and a second wiring layer positioned on the first wiring layer;
the first wiring layer has a first insulation layer provided with a first opening positioned on the first end surface of the through electrode, and a first electroconductive layer connected to the first end surface of the through electrode through the first opening of the first insulation layer;
the second wiring layer has a second insulation layer provided with a second opening positioned on the first electroconductive layer of the first wiring layer, and a second electroconductive layer connected to the first electroconductive layer of the first wiring layer through the second opening of the second insulation layer;

the first insulation layer of the first wiring layer includes at least an organic layer;

at least any one layer selected from the group of the first insulation layer of the first wiring layer, the second insulation layer of the second wiring layer, and a layer of the first wiring structure not included in the first wiring layer and the second wiring layer, includes an inorganic layer having insulation properties; and the inorganic layer is positioned to the first side of the organic layer of the first insulation layer of the first wiring layer.

According to the through electrode substrate, generation of connection failure can be prevented.

DETAILED DESCRIPTION OF THE INVENTION

First Embodiment

Figure 1:
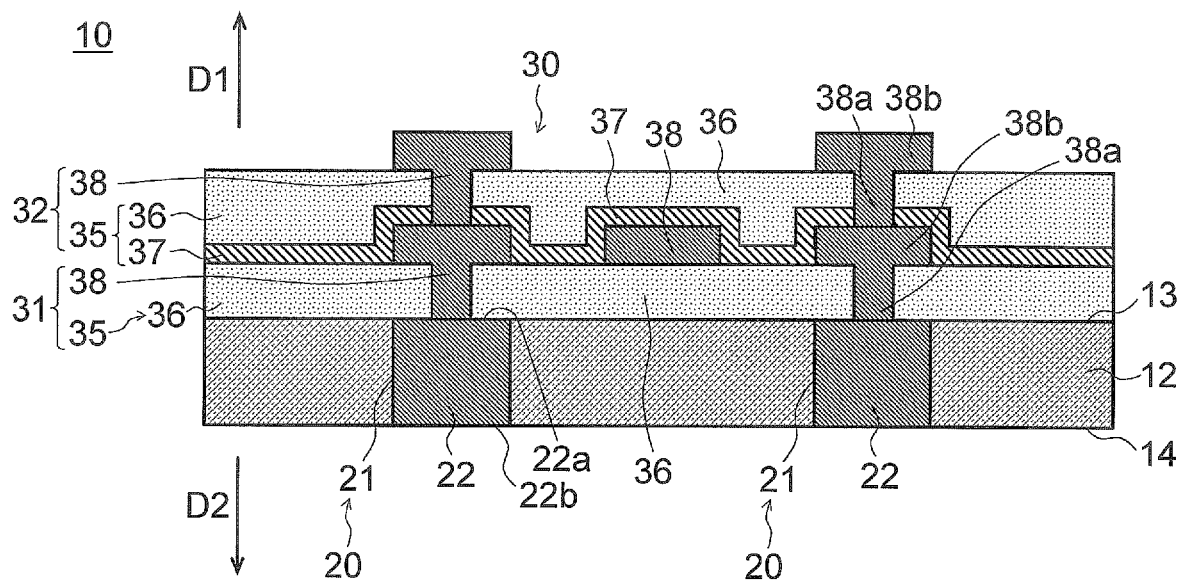
FIG. 1 is a sectional view showing a through electrode substrate according to a first embodiment.

A structure of a through electrode substrate according to the embodiment of the disclosure and a manufacturing method thereof are described in detail herebelow. The below embodiments are mere examples of this embodiments of the disclosure, and the disclosure should not be construed to be limited to these embodiments. In this specification, the terms "substrate", "base member", "sheet" and "film" are not differentiated from one another, based only on the difference in terms. For example, the "substrate" or the "base member" is a concept including a member that can be referred to as sheet or film. Further, terms specifying shapes, geometric conditions and their degrees, e.g., terms such as "parallel", "orthogonal", etc. and values of a length and an angle, etc., are not limited to their strict definitions, but should be construed to include a range capable of exerting a similar function. In addition, in the drawings referred in this embodiments, the same parts or parts having a similar function have the same reference number or similar reference number, and repeated description may be omitted. In addition, a scale size may be different from the actual one, for the convenience of easiness in illustration and understanding, and a part of a structure may be omitted from the drawings.

Through Electrode Substrate

Figure 2:
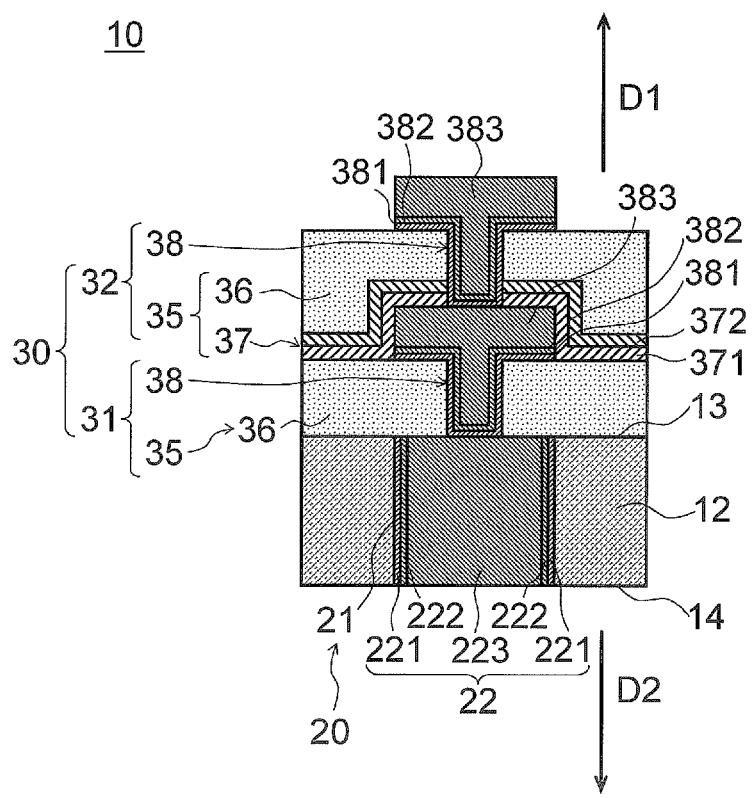
FIG. 2 is an enlarged sectional view of the through electrode substrate of FIG. 1.

Embodiments of the disclosure are described herebelow. Firstly, a structure of a through electrode substrate 10 according to an embodiment is described with reference to FIGS. 1 and 2. FIG. 1 is a sectional view showing the through electrode substrate 10. FIG. 2 is an enlarged sectional view showing the through electrode substrate 10 of FIG. 1.

The through electrode substrate 10 comprises a substrate 12, a through electrode 22, and a first wiring structure 30. The respective constituent elements of the through electrode substrate 10 are described below.

(Substrate)

The substrate 12 includes a first surface 13 positioned on a first side D1, and a second surface 14 positioned on a second side D2 opposite to the first side D1. In addition, the substrate 12 is provided with a plurality of through holes 20 running from the first surface 13 to reach the second surface 14.

The substrate 12 is formed of an organic material having certain insulation properties. For example, the substrate 12 may be a glass substrate, a quartz substrate, a sapphire substrate, a resin substrate, a silicon substrate, a silicon carbide substrate, an alumina ($Al_2O_3$) substrate, an aluminum nitride (AlN) substrate, a zirconium oxide ($ZrO_2$) substrate and so on, or a substrate made by stacking these substrates. The substrate 12 may include a substrate formed of a material having electroconductive properties, such as an aluminum substrate, a stainless substrate and so on.

A thickness of the substrate 12 is not particularly limited, but the use of the substrate 12 having a thickness of not less than 100 µm and not more than 800 µm is preferred. More preferably, the substrate 12 has a thickness of not less than 200 µm and not more than 600 µm. When the substrate 12 has a thickness of not less than 100 µm, warp of the substrate 12 can be prevented from increasing. Thus, it can be prevented that handling of the substrate 12 during a manufacturing step becomes difficult, and that the substrate 12 is warped because of an internal stress of a membrane formed on the substrate 12. In addition, when the substrate 12 has a thickness of not more than 800 µm, it can be prevented that a period of time required for a step of forming the through holes 20 in the substrate 12 is elongated to increase a manufacturing cost of the through electrode substrate 10.

As shown in FIG. 1, a sidewall 21 of the through hole 20 may extend along a normal direction of the first surface 13 of the substrate 12. Alternatively, although not shown, the sidewall 21 may extend along a direction displaced from the normal direction of the first surface 13 of the substrate 12, or a part of the sidewall 21 may be curved.

(Through Electrode)

The through electrode 22 is a member positioned at least partially inside the through hole 20, and having electroconductive properties. The through electrode 22 has a first end surface 22a on the first side D1, and a second end surface 22b on the second side D2. In this embodiment, the through hole 20 is filled with the through electrode 22. Namely, the through electrode 22 is a so-called filled via. The through hole 20 may not be completely filled with the through electrode 22. For example, when the through electrode 22 is seen along the normal direction of the first surface 13 of the substrate 12, a hole may be present partially in the through electrode 22, or a gap may be present partially between the sidewall 21 of the through hole 20 and the through electrode 22.

As long as the through electrode 22 has electroconductive properties, a method of forming the through electrode 22 is not particularly limited. For example, the through electrode 22 may be formed by a physical film deposition method such as a vapor deposition method or a sputtering method, or may be formed by a chemical film deposition method or a plating method. In addition, the through electrode 22 may be composed of a single layer having electroconductive properties, or may include a plurality of layers having electroconductive properties. Herein, as shown in FIG. 2, an example in which the through electrode 22 includes a barrier layer 221, a seed layer 222 and a plated layer 223, which are arranged side by side in this order from the side of the sidewall 21 of the through hole 20 to the center side of the through hole 20, is described.

The barrier layer 221 is a layer positioned between other constituent elements of the through electrode 22, such as the seed layer 222, the plated layer 223 or the like, and the sidewall 21 of the through hole 20. The barrier layer 221 is provided according to need, in order to prevent that metal elements in the constituent elements of the though electrode 22, such as the seed layer 222, the plated layer 223, etc., diffuse inside the substrate 12 via the sidewall 21 of the through hole 20. When the seed layer 222 or the plated layer 223 contains copper, as a material of the barrier layer 221, titanium, titanium nitride, molybdenum, molybdenum nitride, tantalum, tantalum nitride, etc., or stack of them may be used. In addition, as a material of the barrier layer 221, an electroconductive material having high adhesion properties to the substrate 12 can be used. For example, as a material of the barrier layer 221, titanium, molybdenum, tungsten, tantalum, nickel, chrome, aluminum, a compound of them, an alloy of them, or lamination of them may be used. A thickness of the barrier layer 221 is, for example, not less than 10 nm and not more than 1 µm. The barrier layer 221 is formed by, for example, a physical film deposition method such as a vapor deposition method or a sputtering method.

The seed layer 222 is a layer which has electroconductive properties, and serves as a base on which metal ions in a plating solution deposit to grow the plated layer 223, during an electrolytic plating step of forming the plated layer 223 by a plating process. As a material of the seed layer 222, the same metal material as that of the plated layer 223, such as copper, can be used. A thickness of the seed layer 222 is, for example, not les than 10 nm and not more than 3 µm. The seed layer 222 is formed by, for example, a physical film deposition method such as a vapor deposition method or a sputtering method.

Although not shown, a single layer capable of serving both the barrier layer and the seed layer may be provided between the sidewall 21 of the through hole 20 and the plated layer 223.

The plated layer 223 is a layer having electroconductive properties, which is formed by a plating process. As a material forming the plated layer 223, a metal such as copper, gold, silver, platinum, rhodium, tin, aluminum, nickel and chrome, alloy of them, or lamination of them may be used.

(First Wiring Structure)

As shown in FIG. 1, the first wiring structure 30 includes, on the side of the first surface 13 of the substrate 12, a first wiring layer 31 positioned on the first surface 13, for example, and a second wiring layer 32 positioned on the first wiring layer 31. Herebelow, structures of the first wiring layer 31 and the second wiring layer 32 are described.

[First Wiring Layer]

As shown in FIG. 1, the first wiring layer 31 has an insulation layer 35 and an electroconductive layer 38. The insulation layer 35 is provided with an opening positioned on the first end surface 22a of the through electrode 22. In this embodiment, the opening of the insulation layer 35 is at least partially overlapped with the through hole 20 of the substrate 12, when seen along the normal direction of the first surface 13 of the substrate 12. The electroconductive layer 38 is connected to the first end surface 22a of the though electrode 22 through the opening of the insulation layer 35. For example, the electroconductive layer 38 includes a first portion 38a, which is positioned inside the opening of the insulation layer 35 and is connected to the first end surface 22a of the through electrode 22, and a second portion 38b positioned to the first side D1 of the insulation layer 35. A part of the second portion 38b is connected to the first portion 38a.

The insulation layer 35 of the first wiring layer 31 includes an organic layer 36 formed of an organic material having insulation properties. Preferably, the organic layer 36 is in contact with the first end surface 22a of the though electrode 22. As an organic material of the organic layer 36, polyimide, epoxy, acryl and so on can be used, for example.

A thickness of the insulation layer 35 is, for example, not less than 0.5 µm and not more than 10 µm.

As shown in FIG. 2, the electroconductive layer 38 may include a barrier layer 381, a seed layer 382 and a plated layer 383, which are arranged side by side in this order from the side of the sidewall of the opening of the insulation layer 35 to the center side of the opening. The functions and the structures of the barrier layer 381, the seed layer 382 and the plated layer 383 are the same as the functions and the structures of the barrier layer 221, the seed layer 22 and the plated layer 223 of the through electrode 22, which are described above.

[Second Wiring Layer]

Next, the second wiring layer 32 is described. Constituent elements of the second wiring layer 32, which are in common with the constituent elements of the first wiring layer 31, have the same reference numerals, and description thereof is omitted.

Similarly to the first wiring layer 31, the second wiring layer 32 has an insulation layer 35 and an electroconductive layer 38. The insulation layer 35 is provided with an opening positioned on the electroconductive layer 38 of the first wiring layer 31. The electroconductive layer 38 is connected to the electroconductive layer 38 of the first wiring layer 31 through the opening of the insulation layer 35.

The insulation layer 35 of the second wiring layer 32 has an inorganic layer 37 positioned on the insulation layer 35 and the electroconductive layer 38 of the first wiring layer 31, and an organic layer 36 positioned to the first side D1 of the inorganic layer 37. The inorganic layer 37 at least partially covers the second portion 38b of the electroconductive layer 38 of the first wiring layer 31. The term "cover" means that, when the through electrode substrate 10 is seen along the normal direction of the first surface 13 of the substrate 12, the inorganic layer 37 of the second wiring layer 32 and the second portion 38b of the electroconductive layer 38 of the first wiring layer 31 are at least partially overlapped.

The inorganic layer 37 is a layer formed of an inorganic material having insulation properties. An inorganic material of the inorganic layer 37, silicon oxide such as $SiO_2$, and silicon nitride such as SiN may be used. Otherwise, SiOC, SiC, SiOF, SiON, SiCN may be used as an inorganic material of the organic layer 37, for example.

As shown in FIG. 2, the inorganic layer 37 may include a plurality of inorganic layers. For example, the inorganic layer 37 includes a first inorganic layer 371, and a second inorganic layer 372 positioned on the first side D1 of the inorganic layer 371. Preferably, as compared with the second inorganic layer 372, the first inorganic layer 371 has higher adhesion properties to the plated layer 383. In addition, preferably, the second inorganic layer 372 has a lower relative dielectric constant than that of the first inorganic layer 371. For example, the first inorganic layer 371 contains silicon nitride such as SiN, and the second inorganic layer 372 contains silicon oxide such as $SiO_2$. A thickness of the first inorganic layer 371 is, for example, not less than 0.05 µm and not more than 5 µm. A thickness of the second inorganic layer 372 is, for example, not less than 0.1 µm and not more than 10 µm. Preferably, the thickness of the first inorganic layer 371 is smaller than the thickness of the second inorganic layer 372.

The organic layer 36 of the second wiring layer 32 is formed of an organic material having insulation properties. Similarly to the aforementioned organic layer 36 of the first wiring layer 31, polyimide, epoxy, acryl and so on can be used as an organic material of the organic layer 36 of the second wiring layer 36.

The insulation layer belonging to the first wiring layer 31 is sometimes referred to as a first insulation layer. The opening formed in the first insulation layer is sometimes referred to as a first opening. The insulation layer belonging to the second wiring layer 32 is sometimes referred to as a second insulation layer. The opening formed in the second insulation layer is sometimes referred to as a second opening. Similarly, the electroconductive layer belonging to the first wiring layer 31 is sometimes referred to as a first electroconductive layer, and the electroconductive layer belonging to the second wiring layer 32 is sometimes referred to as a second electroconductive layer.

Manufacturing Method of Through Electrode Substrate

Herebelow, an example of a manufacturing method of the through electrode substrate 10 is described with reference to FIGS. 3 to 15.

(Through-Hole Forming Step)

Figure 3:
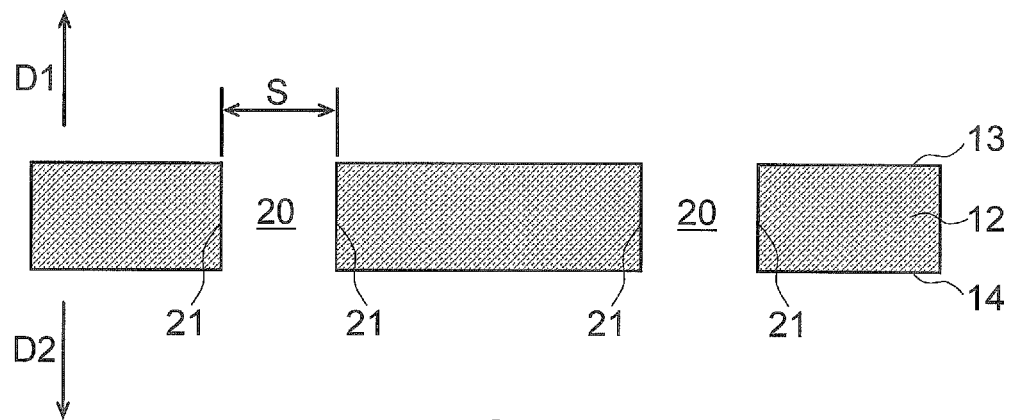
FIG. 3 is a view showing a manufacturing step of the through electrode substrate according to the first embodiment.

Firstly, the substrate 12 is prepared. Next, a resist layer is provided on at least any one of the first surface 13 and the second surface 14. Thereafter, an opening is provided in the resist layer at a position corresponding to each of the through holes 20. Then, by processing the substrate 12 in the opening of the resist layer, as shown in FIG. 3, the through hole 20 can be formed in the substrate 12. A size S of the through hole 20 is, for example, not less than 20 µm and not more than 150 µm. As a method of processing the substrate 12, a dry etching method, such as a reactive ion etching method or a deep reactive ion etching method, a wet etching method and the like may be used.

The through holes 20 may be formed in the substrate 12 by irradiating the substrate 12 with a laser. In this case, the resist layer may not be provided. As a laser for the laser machining, an excimer laser, an Nd:YAG laser, a femtosecond laser and so on may be used. When an Nd:YAG laser is used, a fundamental wave having a wavelength of 1064 nm, a second radiofrequency having a wavelength of 532 nm, and a third radiofrequency having a wavelength of 355 nm and so on may be used.

In addition, laser radiation and wet etching may suitably be combined. To be specific, an altered layer is formed by laser radiation on an area of the substrate 12, in which the through holes 20 should be formed. Then, the substrate 12 is immersed in hydrogen fluoride to etch the altered layer. Thus, the through holes 20 can be formed in the substrate 12.

In addition thereto, the through holes 20 may be formed in the substrate 12 by a blasting process that sprays an abrasive onto the substrate 12.

(Through-Electrode Forming Step)

Figure 4:
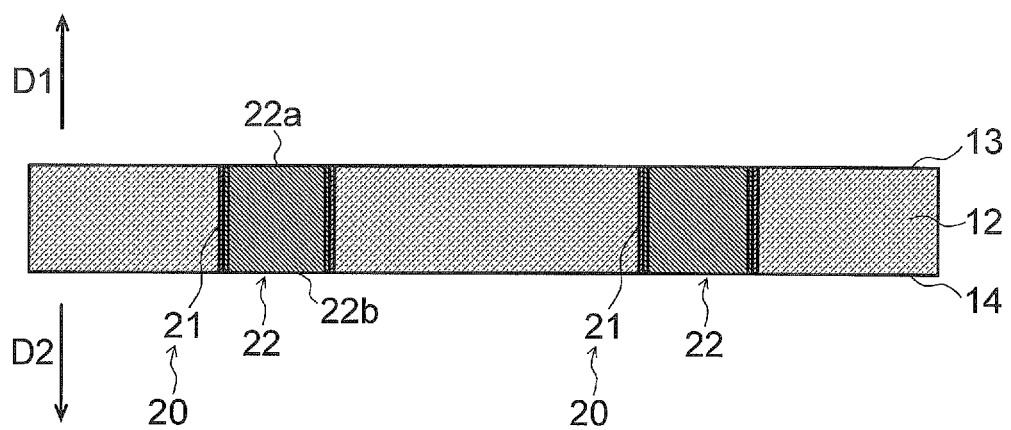
FIG. 4 is a view showing a manufacturing step of the through electrode substrate according to the first embodiment.

Next, as shown in FIG. 4, the through electrode 22 is formed in the through hole 20 of the substrate 12. For example, the seed layer 222 is formed on a part of the sidewall 21 of the through hole 20 on the side of the second surface 14, by a physical film deposition method such as a vapor deposition method or a sputtering method. When the through electrode 22 includes the barrier layer 221, a step of forming the barrier layer 221 on a part of the sidewall 21 of the through hole 20 on the side of the second surface 14 is performed by a physical film deposition method such as a vapor deposition method or a sputtering method, prior to the step of forming the seed layer 222. Following thereto, the plated layer 223 is formed on the seed layer 222 by electrolytic plating, on a part of the sidewall 21 on the side of the second surface 14, so that the through hole 20 is closed by the plated layer 223 on the side of the second surface 14.

Following thereto, the barrier layer 221 and the seed layer 222 are formed on a part of the sidewall 21 of the through hole 20 on the side of the first surface 13. Following thereto, the plated layer 223 is formed by electrolytic plating, on a part of the sidewall 21 on the side of the first surface 13. Thus, as shown in FIG. 4, the through hole 20 can be filled with the through electrode 22.

(Step of Forming Organic Layer of First Wiring Layer)

Figure 5:
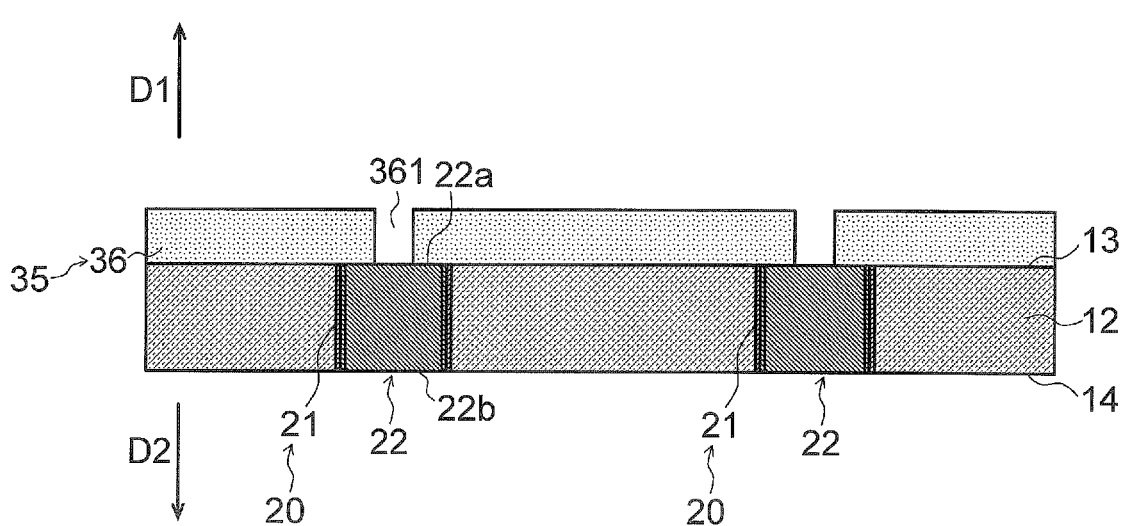
FIG. 5 is a view showing a manufacturing step of the through electrode substrate according to the first embodiment.

Next, as shown in FIG. 5, the organic layer 36 provided with an opening 361 positioned on the first end surface 22a of the through electrode 22 is formed. For example, firstly, an organic material such as photosensitive polyimide is deposited on the substrate 12 by a spin coating method or the like, so as to form the organic layer 36. Following thereto, the organic layer 36 is exposed and developed such that a part of the organic layer 36, which corresponds to the opening 361, is removed. Following thereto, the organic layer 36 is baked to cure the organic layer 36. A baking temperature of the organic layer 36 is not less than 200° C., for example.

(Step of Forming Electroconductive Layer of First Wiring Layer)

Figure 6:
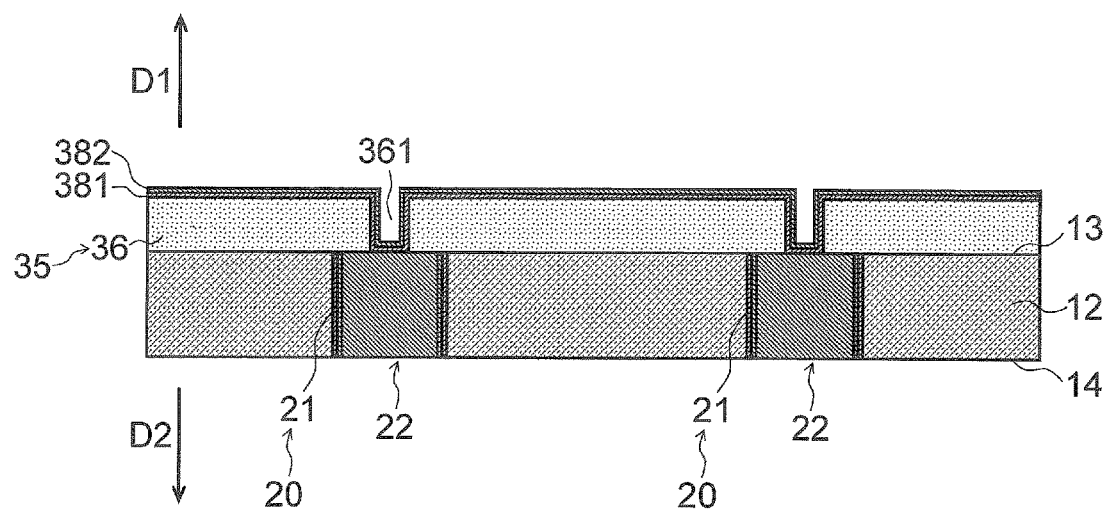
FIG. 6 is a view showing a manufacturing step of the through electrode substrate according to the first embodiment.

Next, as shown in FIG. 6, the barrier layer 381 is formed on the surface of the organic layer 36 and the sidewall of the opening 361 by a physical film deposition method. In addition, the seed layer 382 is formed on the barrier layer 381 by a physical film deposition method.

Figure 7:
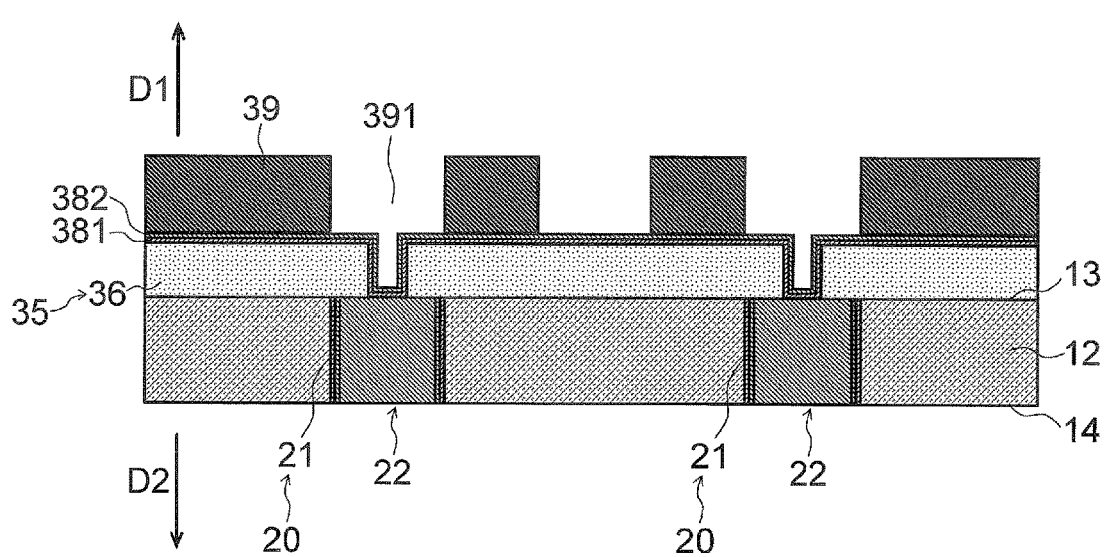
FIG. 7 is a view showing a manufacturing step of the through electrode substrate according to the first embodiment.
Figure 8:
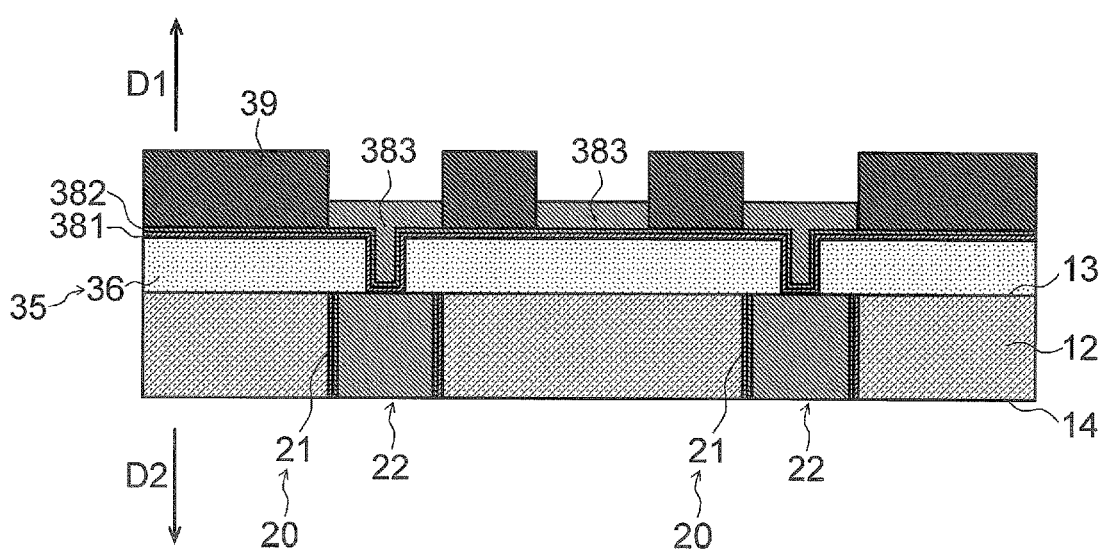
FIG. 8 is a view showing a manufacturing step of the through electrode substrate according to the first embodiment.
Figure 9:
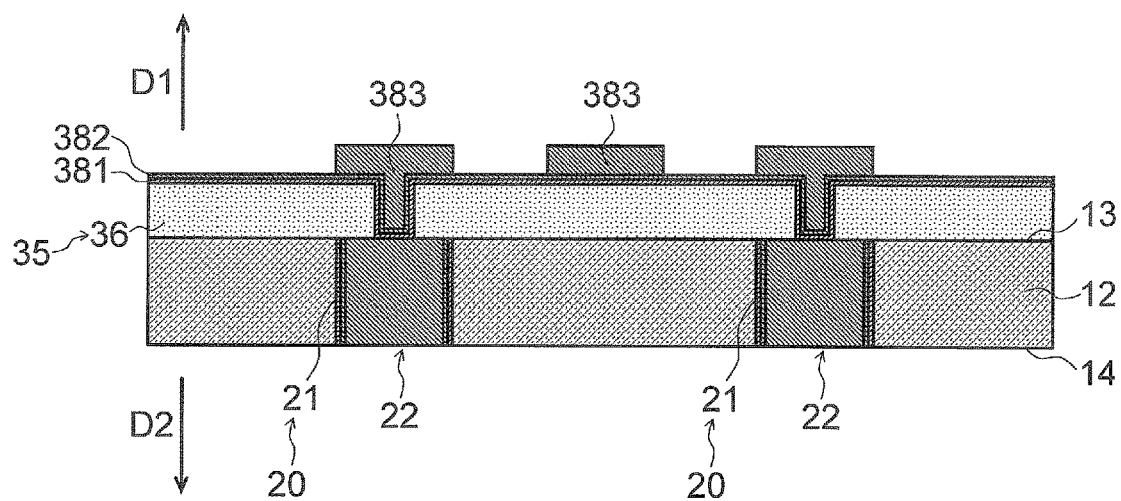
FIG. 9 is a view showing a manufacturing step of the through electrode substrate according to the first embodiment.
Figure 10:
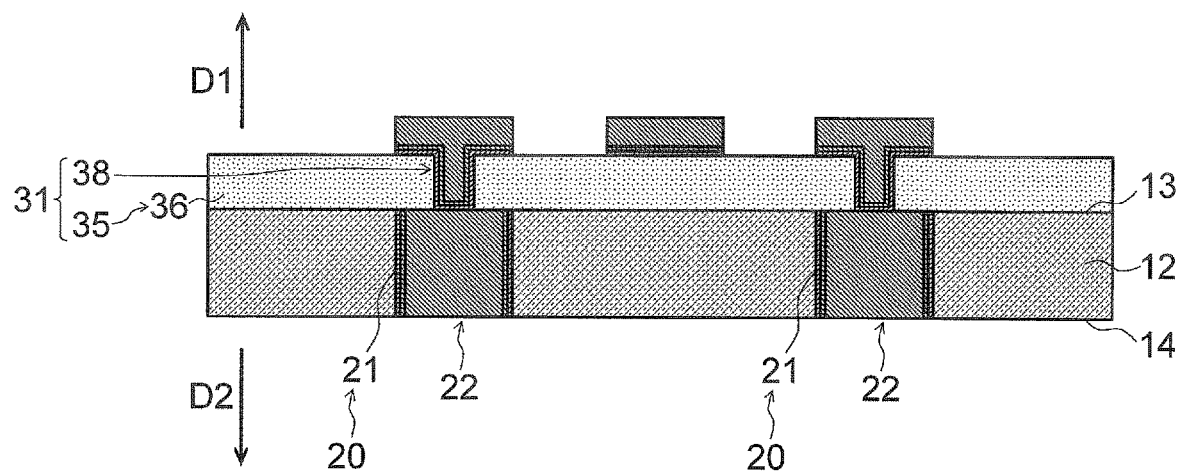
FIG. 10 is a view showing a manufacturing step of the through electrode substrate according to the first embodiment.

Following thereto, as shown in FIG. 7, a resist layer 39 provided with an opening 391 is formed on the seed layer 382. Following thereto, as shown in FIG. 8, the opening 391 of the resist layer 39 is supplied with a plating solution, so that the plated layer 383 is formed on the seed layer 382 by electrolytic plating. Then, as shown in FIG. 9, the resist layer 39 is removed. Following thereto, as shown in FIG. 10, portions of the barrier layer 381 and the seed layer 382, which are covered with the resist layer 39, are removed by wet etching, for example. In this manner, the electroconductive layer 38, which includes the barrier layer 381, the seed layer 382 and the plated layer 383, can be formed. Thereafter, a step of annealing the plated layer 383 may be performed. An annealing temperature of the plated layer 383 is not less than 200° C., for example.

In this manner, the first wiring layer 31 including the organic layer 36 and the electroconductive layer 38 can be formed.

(Step of Forming Inorganic Layer of Second Wiring Layer)

Figure 11:
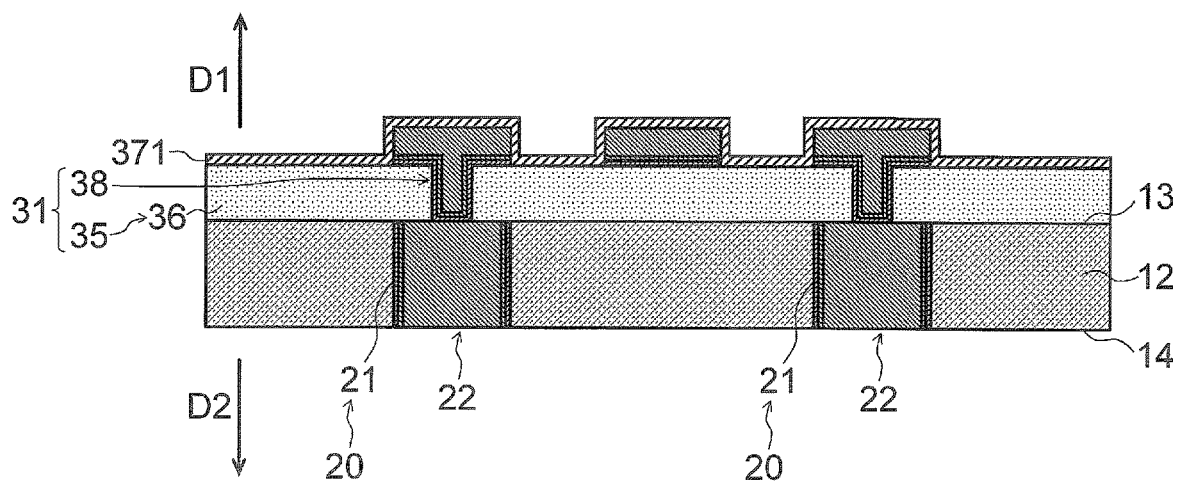
FIG. 11 is a view showing a manufacturing step of the through electrode substrate according to the first embodiment.
Figure 12:
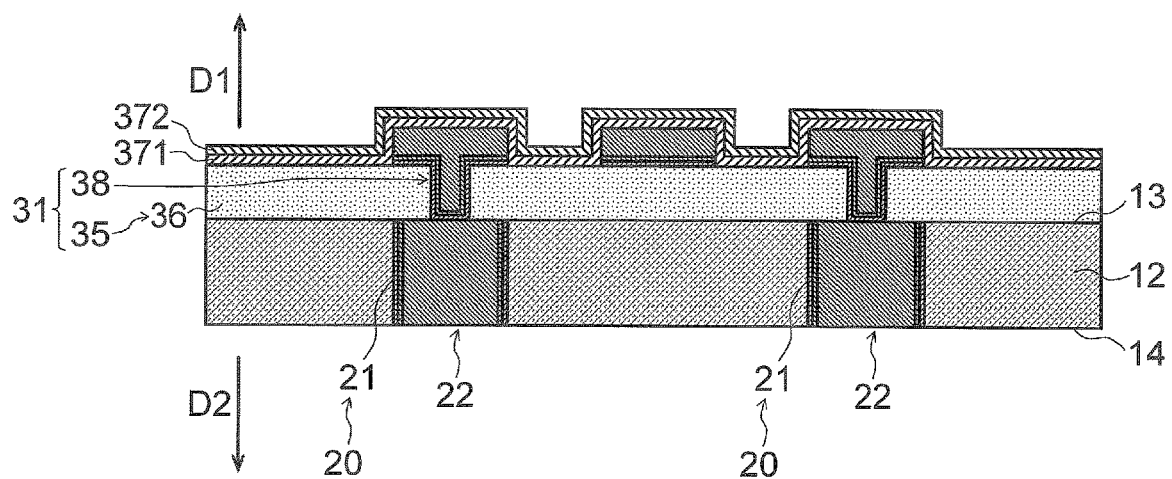
FIG. 12 is a view showing a manufacturing step of the through electrode substrate according to the first embodiment.

Next, as shown in FIG. 11, the first inorganic layer 371 is formed on the organic layer 36 and the electroconductive layer 38 of the first wiring layer 31 by plasma CVD. Following thereto, as shown in FIG. 12, the second inorganic layer 372 is formed on the first inorganic layer 371 by plasma CVD.

(Step of Forming Organic Layer of Second Wiring Layer)

Figure 13:
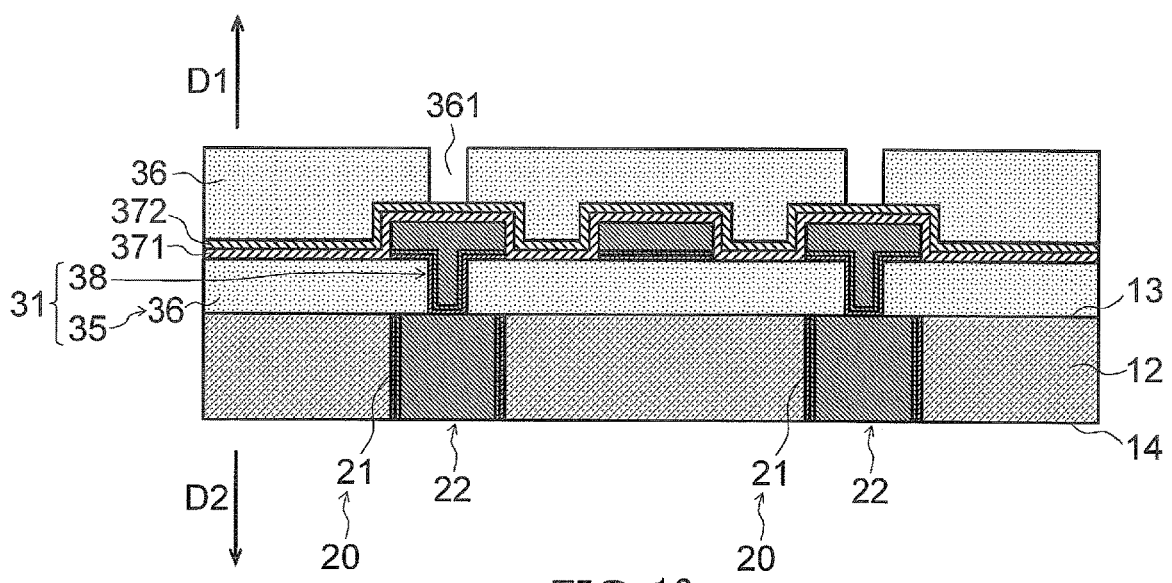
FIG. 13 is a view showing a manufacturing step of the through electrode substrate according to the first embodiment.

Next, as shown in FIG. 13, an organic layer 36 is formed such that the organic layer 36 is provided with an opening 361 at a position overlapped with the conductive layer 38 of the first wiring layer 31, when seen along the normal direction of the first surface 13 of the substrate 12. For example, firstly, an organic material such as photosensitive polyimide is deposited on the second inorganic layer 372 by spin coating method, so as to form the organic layer 36. Following thereto, the organic layer 36 is exposed and removed such that a part of the organic layer 36, which corresponds to the opening 361, is removed. Following thereto, the organic layer 36 is baked to cure the organic layer 36. A baking temperature of the organic layer 36 is not less than 200° C., for example.

(Step of Processing Inorganic Layer of Second Wiring Layer)

Figure 14:
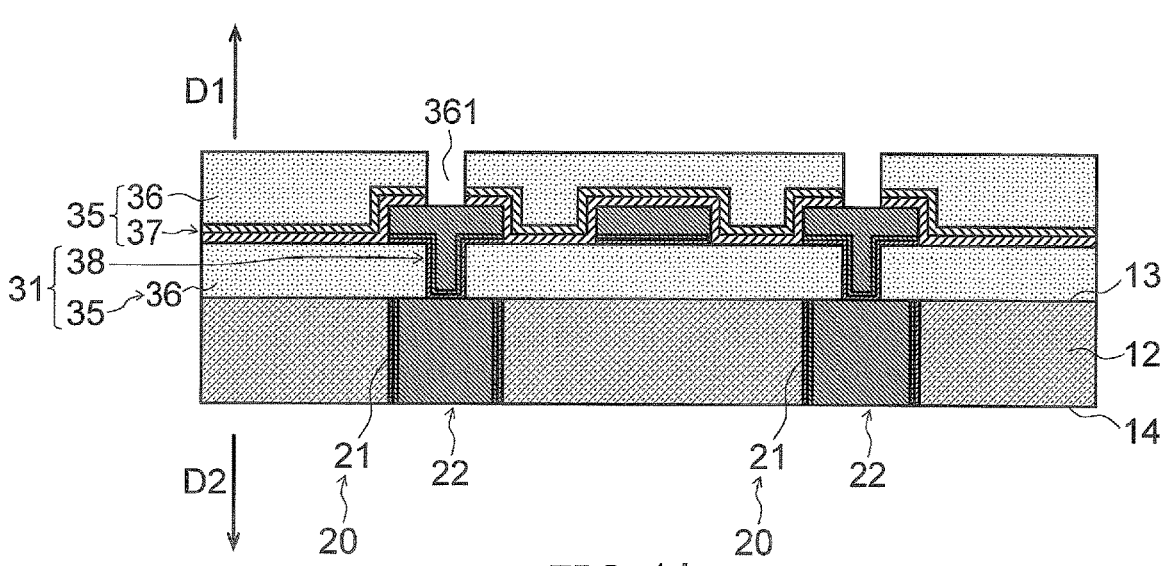
FIG. 14 is a view showing a manufacturing step of the through electrode substrate according to the first embodiment.

Next, the first inorganic layer 371 and the second inorganic layer 372 of the inorganic layer 37, which are exposed to the opening 361 of the inorganic layer 36, are etched by plasma etching, with the organic layer 36 being used as a mask. Thus, as shown in FIG. 14, an opening communicating with the opening 361 of the organic layer 36 is formed in the inorganic layer 37. As an etching gas, a mixed gas of $CF_4$ and $H_2$ may be used, for example. If the surface of the organic layer 36 is damaged by plasma etching, the damaged surface of the organic layer 36 is removed by thermally processing the organic layer 36. A thermal processing temperature of the organic layer 36 is not less than 200° C., for example.

(Step of Forming Electroconductive Layer of Second Wiring Layer)

Figure 15:
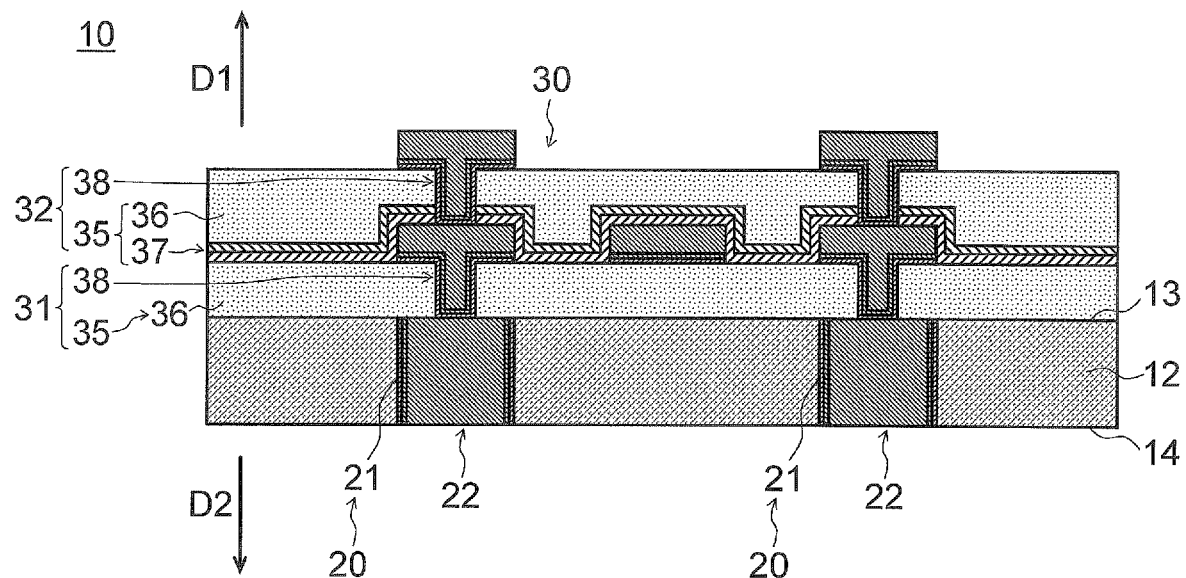
FIG. 15 is a view showing a manufacturing step of the through electrode substrate according to the first embodiment.

Next, as shown in FIG. 15, an electroconductive layer 38, which is connected to the electroconductive layer 38 of the first wiring layer 31 and reaches the first side D1 of the organic layer 36, is formed. In this manner, the second wiring layer 32, which includes the organic layer 36, the inorganic layer 37 and the electroconductive layer 38, can be formed on the first side D1 of the first wiring layer 31.

(Operation of Through Electrode Substrate)

Figure 16:
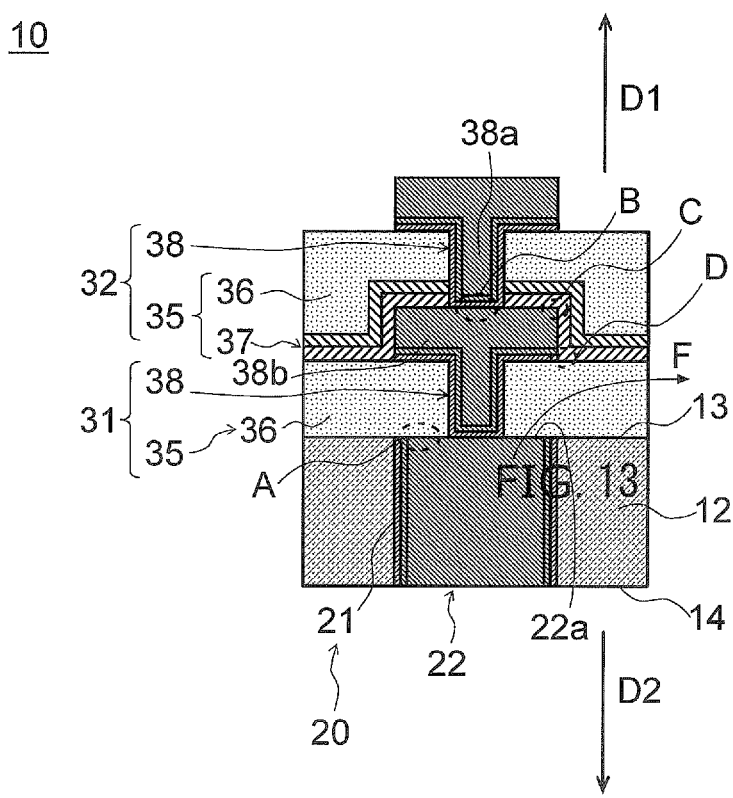
FIG. 16 is a view for describing an operation of the through electrode substrate according to the first embodiment.

An operation of the through electrode substrate 10 according to this embodiment is described. FIG. 16 is a view for describing the operation of the through electrode substrate 10 according to this embodiment.

(Operation of Preventing Transmission Delay and Crosstalk)

The insulation layer 35 of wiring layers such as the first wiring layer 31 and the second wiring layer 32 is formed of an organic material such as polyimide, and includes the organic layer 36 in contact with the electroconductive layer 38. The organic material of the organic layer 36 has a relative dielectric constant smaller than that of an inorganic material forming the inorganic layer 37. For example, the relative dielectric constant of the organic material of the organic layer 36 is not less than 2.0 and not more than 3.3, while the relative dielectric constant of $P-SiO_2$, which is an example of the inorganic material of the inorganic layer 37, is 4.1. By positioning the organic layer 36 formed of such an organic material between the adjacent two electroconductive layers 38 in the wiring layers, a wiring capacity between the electroconductive layers 38 can be decreased, so that an amount of delay of a signal that transmits through the electroconductive layers 38 can be decreased. In addition, crosstalk between the adjacent two electroconductive layers 38 can be prevented. From the point of view of preventing the transmission delay and the crosstalk, a ratio of the organic layer 36 with respect to the whole thickness of the insulation layer 35 is preferably not less than 40% and not more than 90%, in the wiring layers such as the first wiring layer 31 and the second wiring layer 32.

(Degassing Operation)

Components such as water and/or hydrogen sometimes remain in the through electrode 22 positioned in the through hole 20 of the substrate 12. In this case, when a temperature of the through electrode 22 rises during the baking step of the organic layer 36 and/or the annealing step of the electroconductive layer 38, the water and/or hydrogen may be discharged as a gas from the through electrode 22. In this case, there is a risk that the electroconductive layer 38 of the first wiring layer 31 is pushed up or blown off.

In this embodiment, the organic layer 36 of the insulation layer 35 of the first wiring layer 31 is in contact with the first end surface 22a of the through electrode 22. Thus, as shown by the arrow F in FIG. 16, a gas generated in the through electrode 22 can be discharged outside the through electrode substrate 10 through the organic layer 36. As a result, it can be prevented that the electroconductive layer 38 of the first wiring layer 31 is pushed up or blown off.
(Operation of Preventing Warp)

A coefficient of thermal expansion of the organic material, such as polyimide, forming the organic layer 36 is larger than a coefficient of thermal expansion of the inorganic material forming the substrate 12 and the through electrode 22. For example, the coefficient of thermal expansion of the organic material forming the organic layer 36 is 50 to 100E-6/K, while the coefficient of thermal expansion of copper forming the through electrode 22 is about 16E-6/K. In addition, a coefficient of thermal expansion of glass, which is an example of the material of the substrate 12, is about 3E-6K, while a coefficient of thermal expansion of silicon, which is another example of the material of the substrate 12, is about 2.4E-6/K. Thus, in the baking step of the organic layer 36 and the annealing step of the electroconductive layer 38, when an atmospheric temperature becomes not less than 200° C., there is a possibility that a tensile stress is generated in the substrate 12 and the through electrode 22 because of the thermal expansion of the organic layer 36. As a result, the substrate 12 may be warped.

In this embodiment, the first wiring structure 30 includes the inorganic layer 37 in addition to the organic layer 36. For example, the second wiring layer 32 of the first wiring structure 30 includes the organic layer 36 of the first wiring layer 31 and the inorganic layer 37 positioned on the electroconductive layer 38. A coefficient of thermal expansion of the inorganic material forming the inorganic layer 37 is smaller than the coefficient of thermal expansion of the organic material forming the organic layer 36, e.g., not less than 0.3E-6/K and not more than 10.0E-6/K. Thus, it can be prevented that a tensile stress is generated in the substrate 12 and the through electrode 22 because of the thermal expansion of the organic layer 36. As a result, it can be prevented that the substrate 12 is warped. From the point of view of preventing warp, a ratio of the thickness of the inorganic layer 37 with respect to the whole thickness of the insulation layer 35 is preferably not less than 10% and not more than 60%, in the wiring layers such as the first wiring layer 31 and the second wiring layer 32.
(Operation of Preventing Diffusion of Copper into Organic Layer)

In addition, in this embodiment, the inorganic layer 37 is positioned between the plated layer 383 and the organic layer 36, and includes the first inorganic layer 371 formed of silicon nitride such as SiN. Thus, when an atmospheric temperature is high, it can be prevented that atoms, molecules and ions of a metal material, such as copper, forming the plated layer 383 diffuse into the organic layer 36. Thus, it can be prevented that the adjacent two electroconductive layers 38 communicate with each other, and that the organic layer 36 suffers electric breakdown.
(Operation of Reducing Residual Stress in Electroconductive Layer)

A coefficient of thermal expansion of a metal material, such as copper, forming the through electrode 22 is larger than a coefficient of thermal expansion of an insulating inorganic material, such a glass or silicon, forming the substrate 12. Thus, in the baking step of the organic layer 36 and the annealing step of the electroconductive layer 38, when an atmospheric temperature becomes not less than 200° C., there is a possibility that the through electrode 22 expands in the thickness direction of the substrate 12. For example, there is a possibility that, in a part surrounded by the dotted lines to which a reference numeral A is assigned in FIG. 16, the first end surface 22a of the through electrode 22 projects from the first surface 13 of the substrate 12 toward the first side D1. For example, when the thickness of the substrate 12 is not less than 100 μm and not more than 400 μm, and an atmospheric temperature is 200° C., there is a possibility that the through electrode 22 projects from the first surface 13 of the substrate 12 to the first side D1 by about 1.1 μm. When a step in which an atmospheric temperature becomes not less than 200° C. is repeatedly performed, a phenomenon in which the through electrode 22 projects from the first surface 13 of the substrate 12 toward the first side D1 repeatedly occurs. Thus, a residual stress is generated in the electroconductive layer 38 of the first wiring layer 31 connected to the first end surface 22a of the through electrode 22. In this case, a defect such as a void may be formed in a part surrounded by the dotted lines to which a reference numeral B is assigned in FIG. 16, between the second portion 38b of the electroconductive layer 38 of the first wiring layer 31 and the first portion 38a of the electroconductive layer 38 of the second wiring layer 32, which part has relatively a low mechanical connection strength. As a result, there is a possibility that electric connection failure may occur between the electroconductive layer 38 of the first wiring layer 31 and the electroconductive layer 38 of the second wiring layer 32.

On the other hand, in this embodiment, the second wiring layer 32 includes the inorganic layer 37 that covers the second portion 38b of the electroconductive layer 38 of the first wiring layer 31. The coefficient of thermal expansion of the inorganic material forming the inorganic layer 37 is small, e.g., not less than 0.3E-6/K and not more than 10.0E-6/K. Thus, a residual stress generated in the electroconductive layer 38 of the first wiring layer 31 can be reduced, whereby it can be prevented that a defect such as a void is formed in the electroconductive layer 38 of the first wiring layer 31 and the electroconductive layer 38 of the second wiring layer 32. In addition, a Young's modulus of the inorganic material forming the inorganic layer 37 is high, e.g., not less than 70 GPa. This also contributes the reduction in residual stress generated in the electroconductive layer 38 of the first wiring layer 31. Due to these facts, it can be prevented that electric connection failure occurs between the electroconductive layer 38 of the first wiring layer 31 and the electroconductive layer 38 of the second wiring layer 32.
(Buffering Operation of Organic Layer)

In addition, in this embodiment, the organic layer 36 is positioned between the first end surface 22a of the through electrode 22 and the second portion 38b of the electroconductive layer 38 of the first wiring layer 31. A Young's modulus of the organic material forming the organic layer 36 is low, e.g., not less than 3 GPa and not more than 7 GPa. Thus, even when the through electrode 22 expands toward the first side D1 because of elevation of an atmospheric temperature, it can be prevented that a stress caused by the thermal expansion of the through electrode 22 is transmitted to a portion of the second portion 38b of the electroconductive layer 38 of the first wiring layer 31, which is positioned above the organic layer 36. Thus, in a part between the portion of the second portion 38b of the electroconductive layer 38 of the first wiring layer 31, which is positioned above the organic layer 36, and the inorganic layer 37 of the second wiring layer 32, e.g., in a part surrounded by the dotted lines to which a reference numeral C is assigned in FIG. 16, a stress which is received by the inorganic layer 37 from the electroconductive layer 38 can be reduced. Similarly, in a part surrounded by the dotted lines to which a reference numeral D is assigned in FIG. 16, a stress which is received by the inorganic layer 37 from the electroconductive layer 38 can be reduced. Thus, it can be prevented that a defect such as crack is generated in the inorganic layer 37. As a result, it can be prevented that the metal material, such as copper, forming the electroconductive layer 38 diffuses into the organic layer 36 through a crack of the inorganic layer 37.

First Comparative Embodiment

Figure 17:
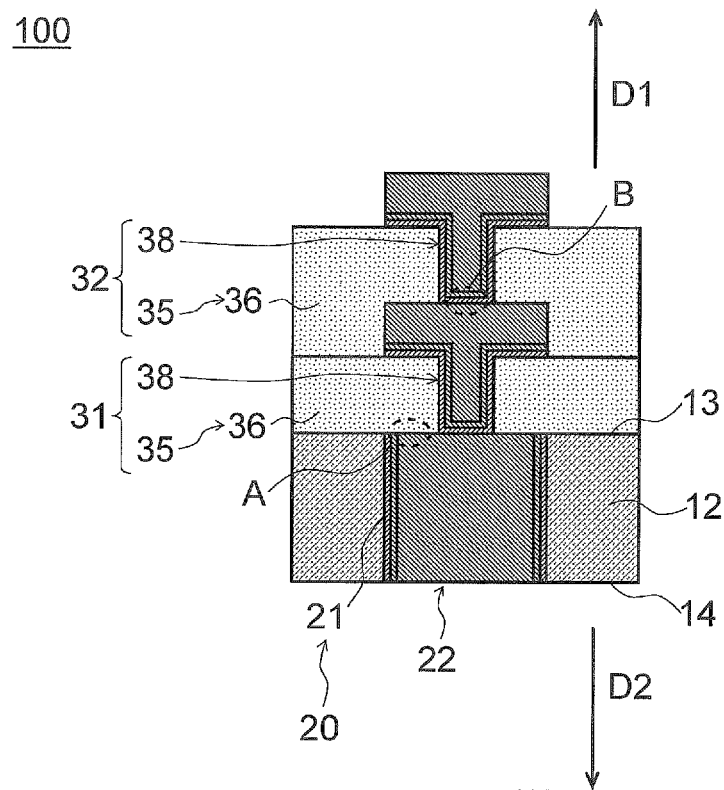
FIG. 17 is a view showing a through electrode substrate according to a first comparative embodiment.

Next, the operation of the through electrode substrate 10 according to this embodiment is described, in comparison with a through electrode substrate 100 according to a first comparative embodiment shown in FIG. 17.

As shown in FIG. 17, in the through electrode substrate 100 according to the first comparative embodiment, neither the first wiring layer 31 nor the second wiring layer 32 has the inorganic layer 37. Thus, when an atmospheric temperature becomes high, a large residual stress is generated in the electroconductive layer 38 of the first wiring layer 31 because of the thermal expansion of the through electrode 22. As a result, in a part surrounded by the dotted lines to which a reference numeral B is assigned in FIG. 17, there is a possibility that connection failure occurs between the electroconductive layer 38 of the first wiring layer 31 and the electroconductive layer 38 of the second wiring layer 32.

On the other hand, according to this embodiment, since the second wiring layer 32 includes the inorganic layer 37 that covers the second portion 38b of the electroconductive layer 38 of the first wiring layer 31, a residual stress generated in the electroconductive layer 38 of the first wiring layer 31 can be reduced. Thus, it can be prevented that electric connection failure occurs between the electroconductive layer 38 of the first wiring layer 31 and the electroconductive layer 38 of the second wiring layer 32.

Second Comparative Embodiment

Figure 18:
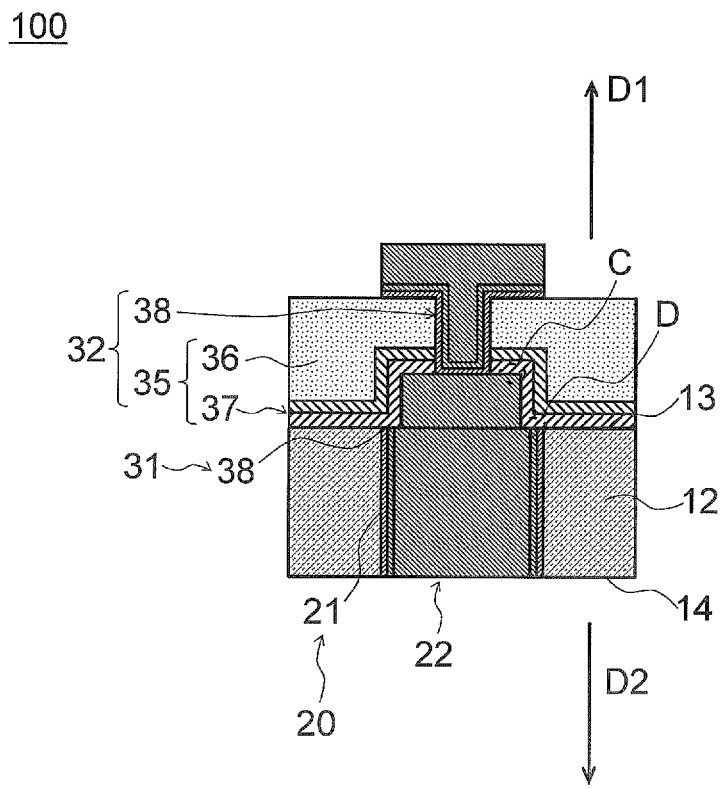
FIG. 18 is a view showing a through electrode substrate according to a second comparative embodiment.

Next, the operation of the through electrode substrate 10 according to this embodiment is described, in comparison with a through electrode substrate 100 according to a second comparative embodiment shown in FIG. 18.

As shown in FIG. 17, in the through electrode substrate 100 according to the first comparative embodiment, the organic layer 36 is not present between the through electrode 22 and the electroconductive layer 38 of the first wiring layer 31. Thus, when an atmospheric temperature becomes high, a large stress applies to a portion of the electroconductive layer 38 of the first wiring layer 31, which is covered with the inorganic layer 37 of the second wiring layer 32, because of the thermal expansion of the through electrode 22. As a result, there is a possibility that a defect such as a crack occurs in the inorganic layer 37 of the second wiring layer 32.

On the other hand, according to this embodiment, the organic layer 36 is positioned between the first end surface 22a of the through electrode 22 and the second portion 38b of the electroconductive layer 38 of the first wiring layer 31. Thus, it can be prevented that a stress caused by the thermal expansion of the through electrode 22 is transmitted to a portion of the second portion 38b of the electroconductive layer 38 of the first wiring layer 31, which is positioned on the organic layer 36. As a result, it can be prevented that a defect such as a crack occurs in the inorganic layer 37.

(Mounting Substrate)

Herebelow, an example of the use of the through electrode substrate 10 according to this embodiment is described. Herein, an example in which a mounting substrate 60 is formed by loading an element 61 on the through electrode substrate 10 is described.

Figure 19:
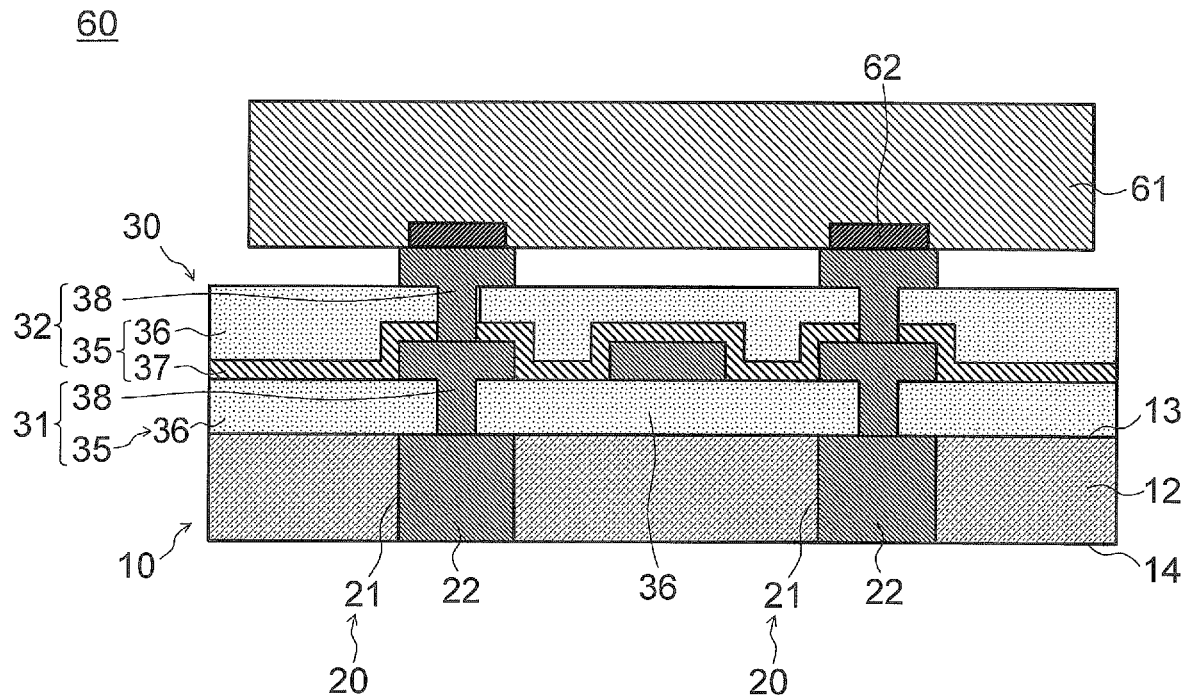
FIG. 19 is a sectional view showing an example of a mounting substrate comprising a through electrode substrate.

FIG. 19 is a sectional view showing the mounting substrate 60. The mounting substrate 60 comprises the through electrode substrate 10, and an element 61 loaded on the through electrode substrate 10 on the side of the first surface 13 of the substrate 12. The element 61 is an LSI chip such as a logic IC or a memory IC. The element 61 may be a MEMS (Micro Electro Mechanical Systems) chip. A MEMS chip is an electronic device in which a mechanical component, a sensor, an actuator, an electronic circuit and so on are integrated on one substrate. As shown in FIG. 19, the element 61 has a terminal 62 connected to the electroconductive layer 38 of the first wiring structure 30 of the through electrode substrate 10.

The aforementioned first embodiment can be variously modified. Herebelow, modification examples are described with reference to the drawings according to need. In the below description and the drawings for the description, the same part as that of the first embodiment is shown by the same reference number, and detailed description thereof is omitted. In addition, when the effect obtained in the first embodiment is apparently obtained also in the modification examples, description thereof may be omitted.

First Modification Example

Figure 20:
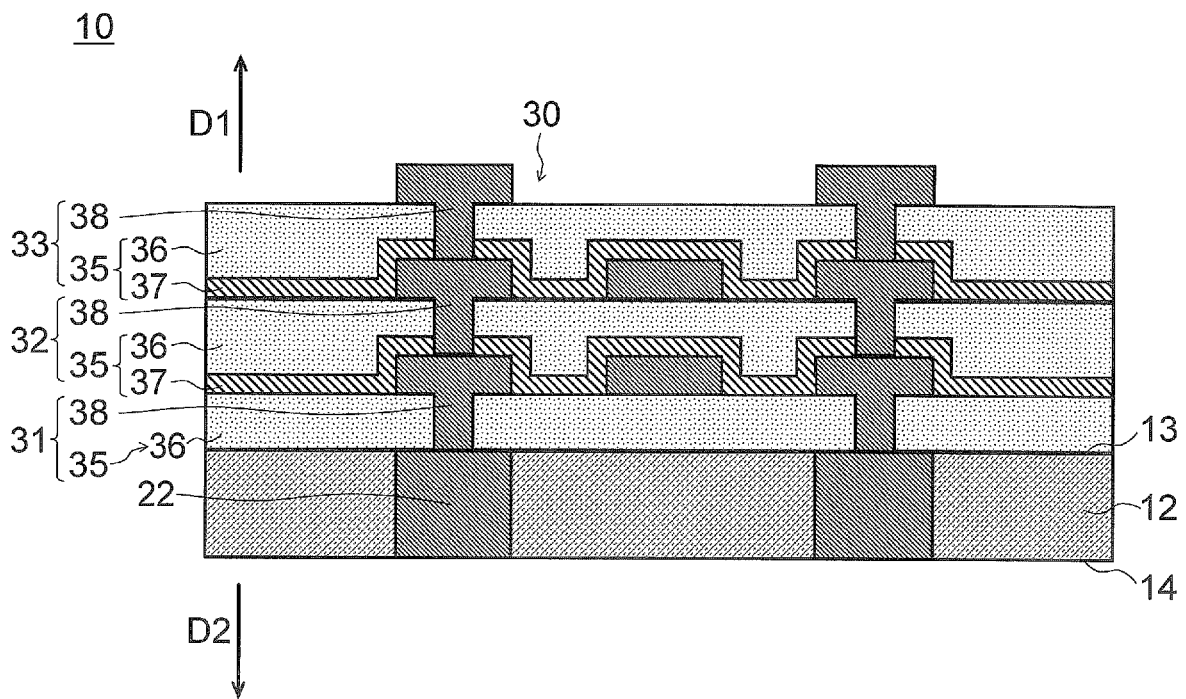
FIG. 20 is a sectional view showing a through electrode substrate according to a first modification example.

FIG. 20 is a sectional view showing a through electrode substrate 10 according to a first modification example. As shown in FIG. 20, the first wiring structure 30 of the through electrode substrate 10 may further include a third wiring layer 33 positioned on the second wiring layer 32. The third wiring layer 33 has an insulation layer 35 provided with an opening positioned on the electroconductive layer 38 of the second wiring layer 32, and an electroconductive layer 38 connected to the electroconductive layer 38 of the second wiring layer 32 through the opening of the insulation layer 35. The insulation layer 35 of the third wiring layer 33 includes an inorganic layer 37, and an organic layer 36 positioned to the first side D1 of the inorganic layer 37. The inorganic layer 37 of the third wiring layer 33 at least partially covers the electroconductive layer 38 of the second wiring layer 32.

The insulation layer belonging to the third wiring layer 33 is sometimes referred to as a third insulation layer. The opening formed in the third insulation layer is sometimes referred to as the third opening. Similarly, the electroconductive layer belonging to the third wiring layer 33 is sometimes referred to as a third electroconductive layer.

Second Modification Example

Figure 21:
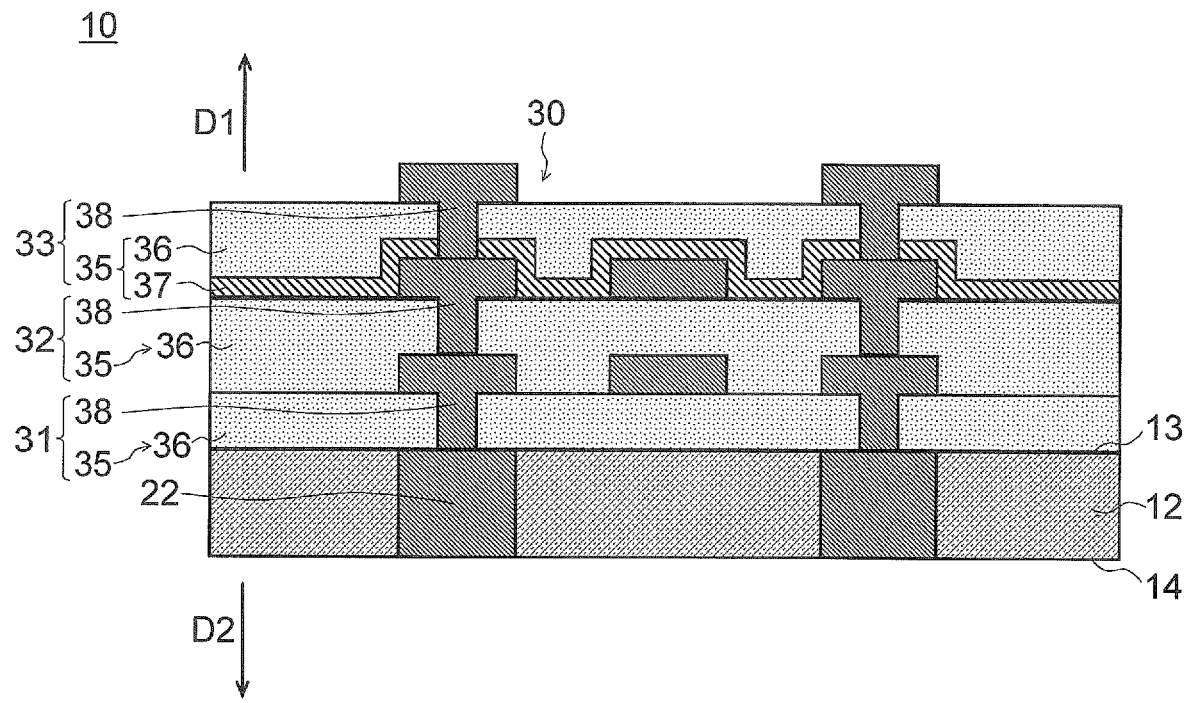
FIG. 21 is a sectional view showing a through electrode substrate according to a second modification example.

In the first modification example shown in FIG. 20, both the second wiring layer 32 and the third wiring layer 33 have the inorganic layer 37. However, not limited thereto, at least one of the plurality of wiring layers of the first wiring structure 30 may include the inorganic layer 37. For example, as shown in FIG. 21, the insulation layer 35 of the third wiring layer 33 includes the inorganic layer 37, but the insulation layer 35 of the second wiring layer 32 may not include the inorganic layer 37. Alternatively, although not shown, the insulation layer 35 of the second wiring layer 32 includes the inorganic layer 37, but the insulation layer 35 of the third wiring layer 33 may not include the inorganic layer 37. Since at least one of the plurality of wiring layers of the first wiring structure 30 includes the inorganic layer 37, it can be prevented that the substrate 12 is warped. In addition, since a residual stress generated in the electroconductive layer 38, which is positioned to the second side D2 of the inorganic layer 37, can be reduced, it can be prevented that a defect such as a void is formed in the electroconductive layer 38.

Third Modification Example

Figure 22:
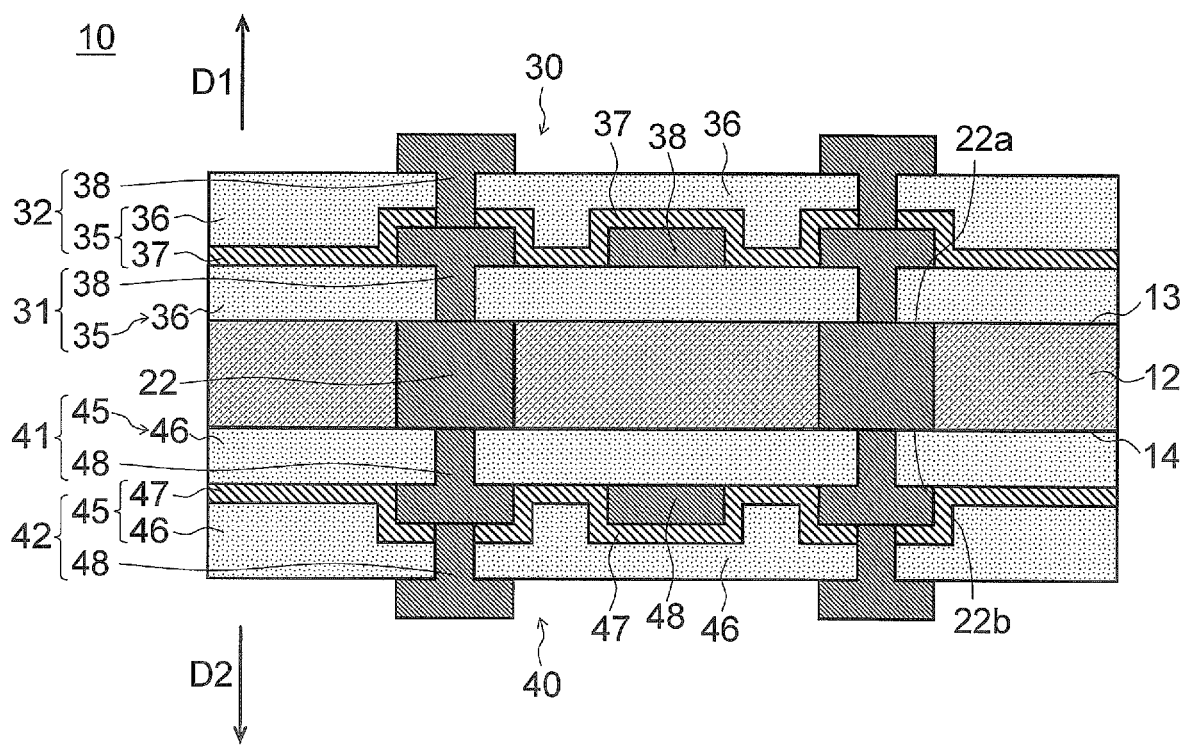
FIG. 22 is a sectional view showing a through electrode substrate according to a third modification example.

As shown in FIG. 22, the through electrode substrate 10 may further comprise, on the side of the second surface 14 of the substrate 12, a second wiring structure 40 including at least a first wiring layer 41 positioned on the second surface 14, for example, and a second wiring layer 42 positioned on the first wiring layer 41.

Similarly to the first wiring layer 31 of the first wiring structure 30, the first wiring layer 41 has an insulation layer 45 and an electroconductive layer 48. The insulation layer 45 is provided with an opening positioned on the second end surface 22b of the through electrode 22. The electroconductive layer 48 is connected to the second end surface 22b of the through electrode 22 through the opening of the insulation layer 45.

Similarly to the insulation layer 35 of the first wiring layer 31, the insulation layer 45 of the first wiring layer 41 includes an organic layer 46 formed of an organic material having insulation properties. Preferably, the organic layer 46 is in contact with the second end surface 22b of the through electrode 22. Thus, a gas discharged from the second end surface 22b of the through electrode 22 can be discharged outside the through electrode substrate 10 through the organic layer 46. As an organic material of the organic layer 46, polyimide, epoxy, acryl and so on can be used, for example. A thickness of the insulation layer 45 is, for example, not less than 0.5 µm and not more than 10 µm.

Similarly to the electroconductive layers 38 of the first wiring layer 31 and the second wiring layer 32, the electroconductive layer 48 includes a metal material having electroconductive properties. As described later, the electroconductive layer 48 may include a plurality of layers, such as a barrier layer, a seed layer and a plated layer, which are arranged side by side in this order from the side of the sidewall of the opening of the insulation layer 45 to the center side of the opening.

Similarly to the first wiring layer 41, the second wiring layer 42 also has an insulation layer 45 and an electroconductive layer 48. The insulation layer 45 is provided with an opening positioned on the electroconductive layer 48 of the first wiring layer 48. The electroconductive layer 48 is connected to the electroconductive layer 48 of the first wiring layer 41 through the opening of the insulation layer 45.

The insulation layer 45 of the second wiring layer 42 has an inorganic layer 47 positioned on the insulation layer 45 and the electroconductive layer 48 of the first wiring layer 41, and an organic layer 46 positioned to the second side D2 of the inorganic layer 47. The inorganic layer 47 at least partially covers the electroconductive layer 48 of the first wiring layer 41. The term "cover" means that, when the through electrode substrate 10 is seen along the normal direction of the second surface 14 of the substrate 12, the inorganic layer 47 of the second wiring layer 42 and the electroconductive layer 48 of the first wiring layer 41 are at least partially overlapped. Similarly to the inorganic layer 37 of the first wiring structure 30, the inorganic layer 47 is a layer formed of an inorganic material having insulation properties. Since the inorganic material forming the inorganic layer 47 and the layer structure of the inorganic layer 47 are the same as those of the inorganic layer 37, description thereof is omitted.

The organic layer 46 of the second wiring layer 42 is formed of an organic material having insulation properties. Similarly to the aforementioned organic layer 46 of the first wiring layer 41, as an organic material of the organic layer 46 of the second wiring layer 42, polyimide, epoxy, acryl and so on can be used, for example.

The insulation layer belonging to the first wiring layer 41 is sometimes referred to as a first insulation layer. The opening formed in the first insulation layer is sometimes referred to as a first opening. The insulation layer belonging to the second wiring 42 is sometimes referred to as a second insulation layer. The opening formed in the second insulation layer is sometimes referred to as the second opening. Similarly, the electroconductive layer belonging to the first wiring layer 41 is sometimes referred to as a first electroconductive layer, and the electroconductive layer belonging to the second wiring layer 42 is referred to as a second electroconductive layer.

(First Manufacturing Method of Through Electrode Substrate)

An example of a manufacturing method of the through electrode substrate 10 according to the modification example is described with reference to FIGS. 23 to 30.

Figure 23:
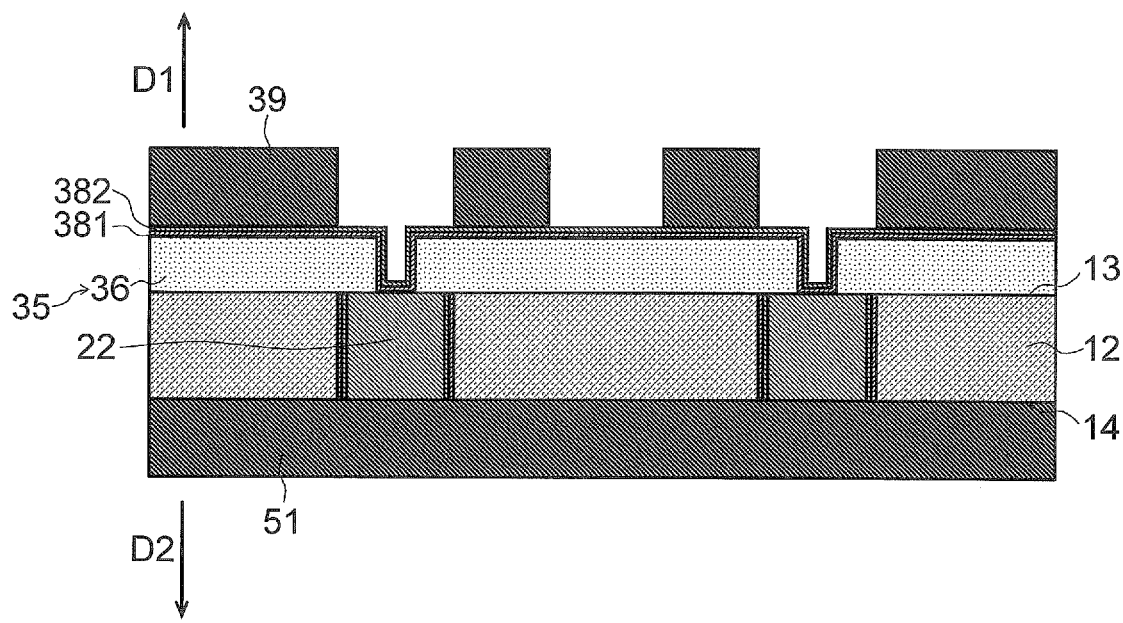
FIG. 23 is a view showing a first manufacturing method of the through electrode substrate according to the third modification example.

Firstly, similarly to the aforementioned first embodiment, the through hole 20, the through electrode 22, the organic layer 36 of the first wiring layer 31, and the barrier layer 381 and the seed layer 382 of the electroconductive layer 38 of the first wiring layer 31 are formed, so as to obtain a laminate shown in FIG. 6. Following thereto, as shown in FIG. 23, a resist layer 39 is formed on the first side D1 of the laminate, while a protective layer 51 is formed on the second side D2 of the laminate. The protective layer 51 is a layer for preventing that a plated layer is formed on the second side D2 of the substrate 12, when the plated layer 383 is formed on the first side D1 of the substrate 12 by electrolytic plating.

Figure 24:
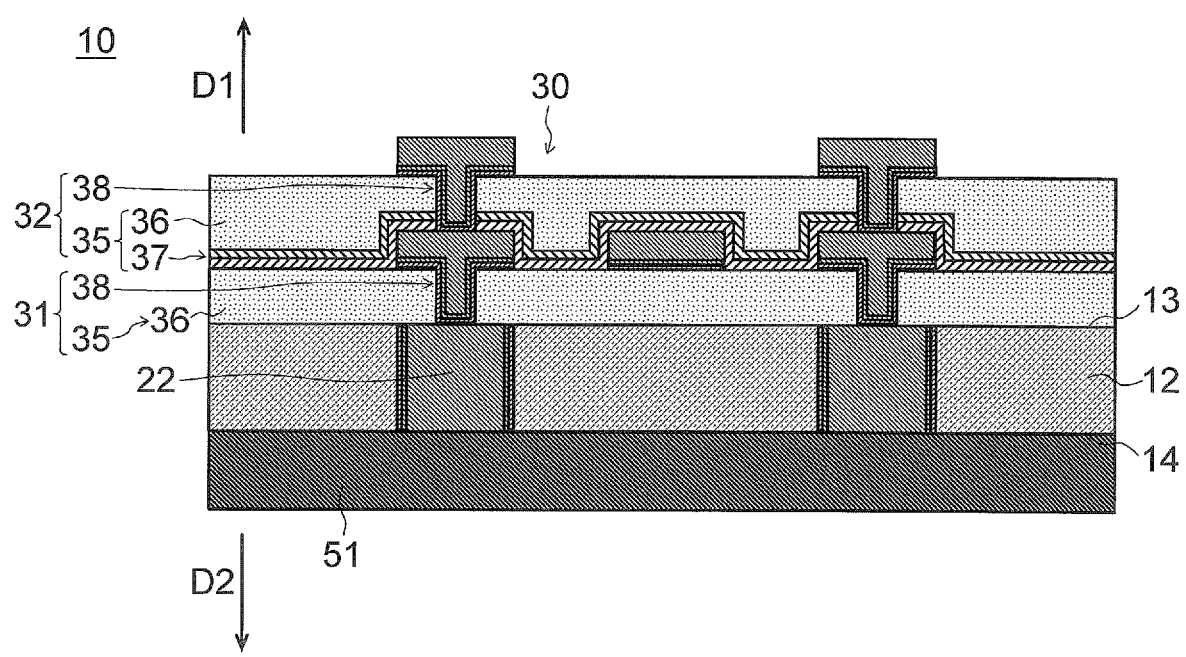
FIG. 24 is a view showing the first manufacturing method of the through electrode substrate according to the third modification example.

Following thereto, similarly to the aforementioned first embodiment shown in FIGS. 8 to 15, as shown in FIG. 24, the first wiring structure 30 including the first wing layer 31 and the second wiring layer 32 is formed on the first side D1 of the substrate 12.

Figure 25:
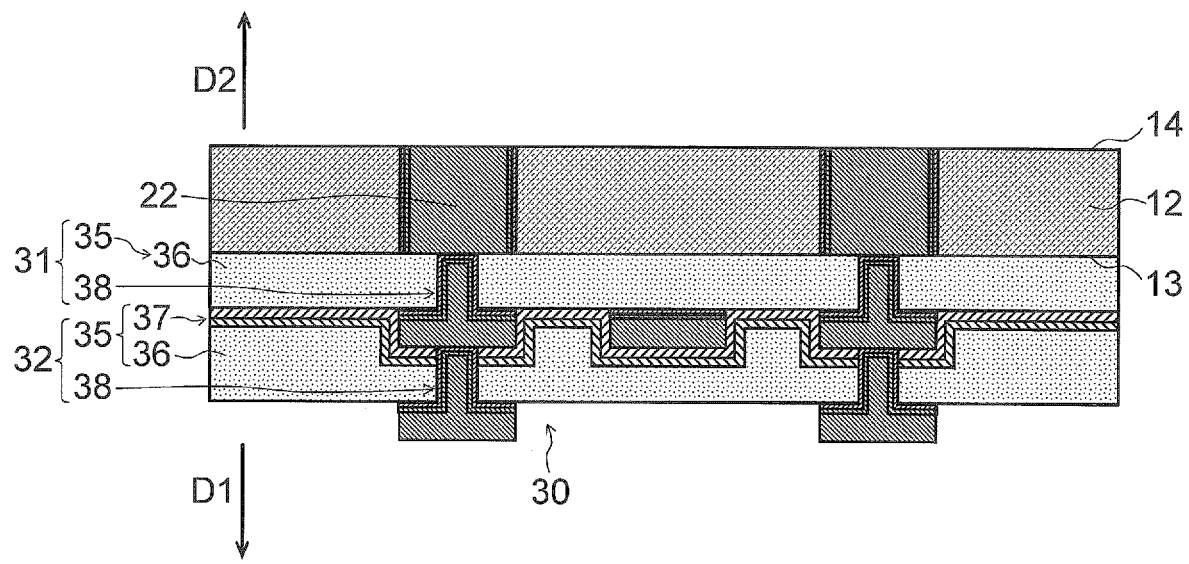
FIG. 25 is a view showing the first manufacturing method of the through electrode substrate according to the third modification example.
Figure 26:
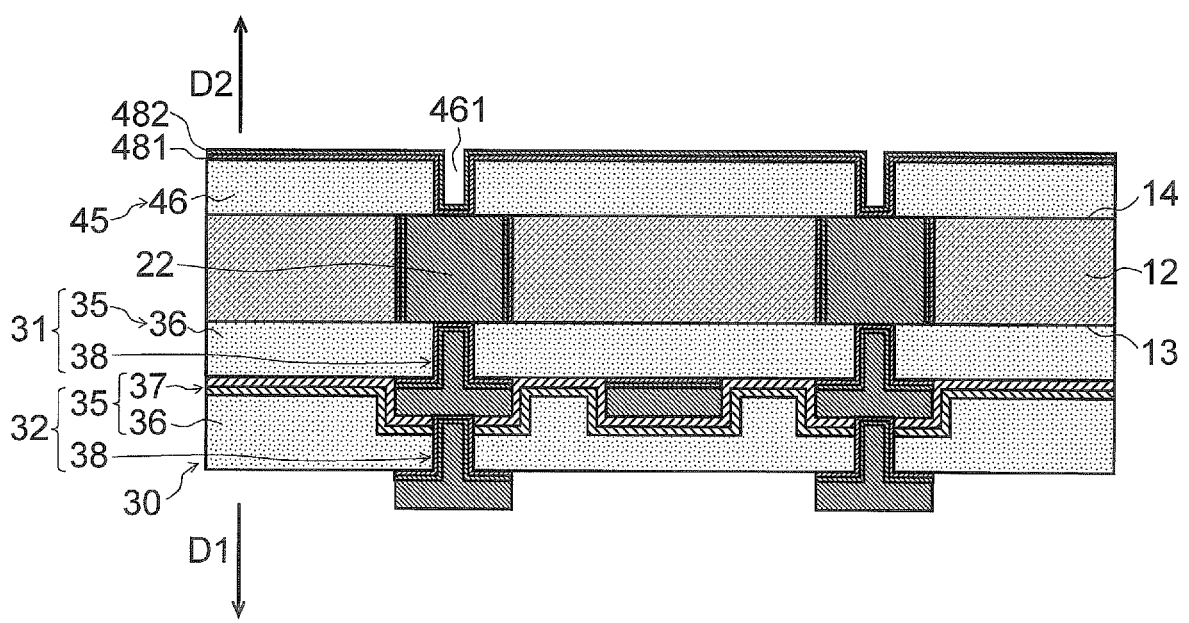
FIG. 26 is a view showing the first manufacturing method of the through electrode substrate according to the third modification example.

Following thereto, as shown in FIG. 25, the protective layer 51 on the second side D2 is removed. In addition, the first surface 13 and the second surface 14 of the substrate 12 are reversed. Following thereto, similarly to the step of forming the organic layer 36, the barrier layer 381 and the seed layer 382 on the first side D1 of the substrate 12, as shown in FIG. 26, the organic layer 46, the barrier layer 481 and the seed layer 482 are formed on the second side D2 of the substrate 12.

Figure 27:
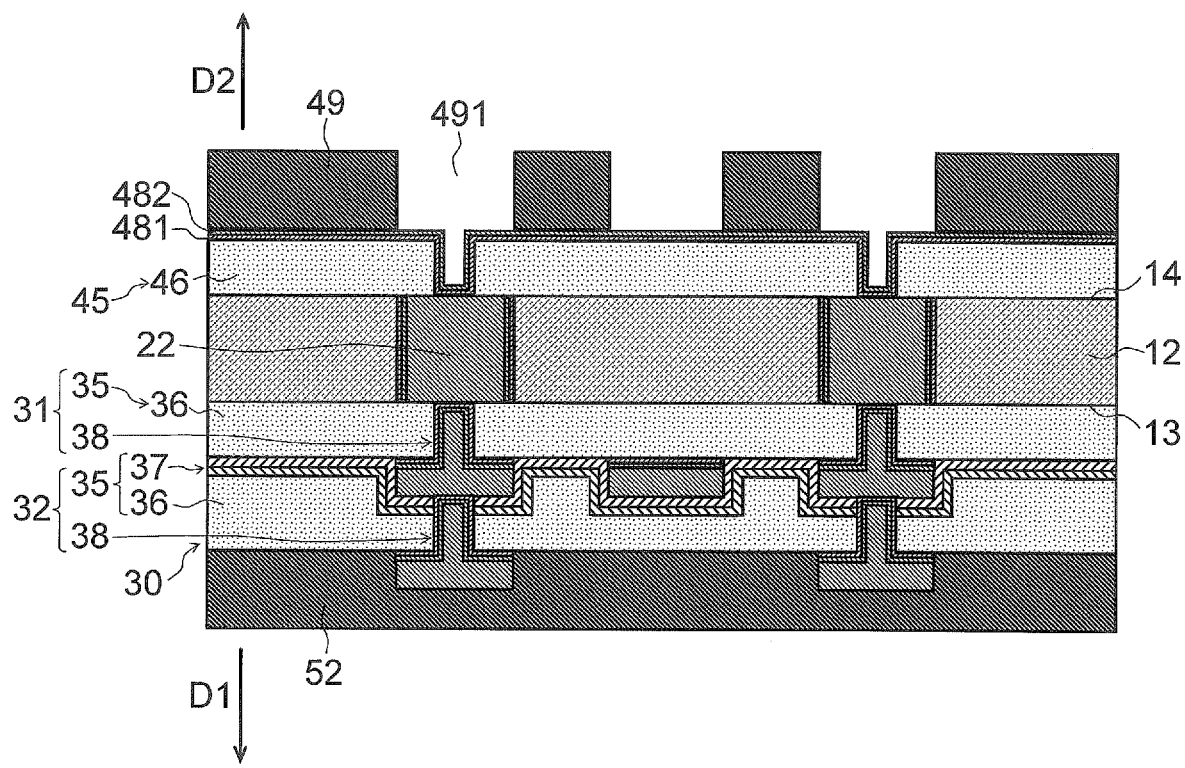
FIG. 27 is a view showing the first manufacturing method of the through electrode substrate according to the third modification example.
Figure 28:
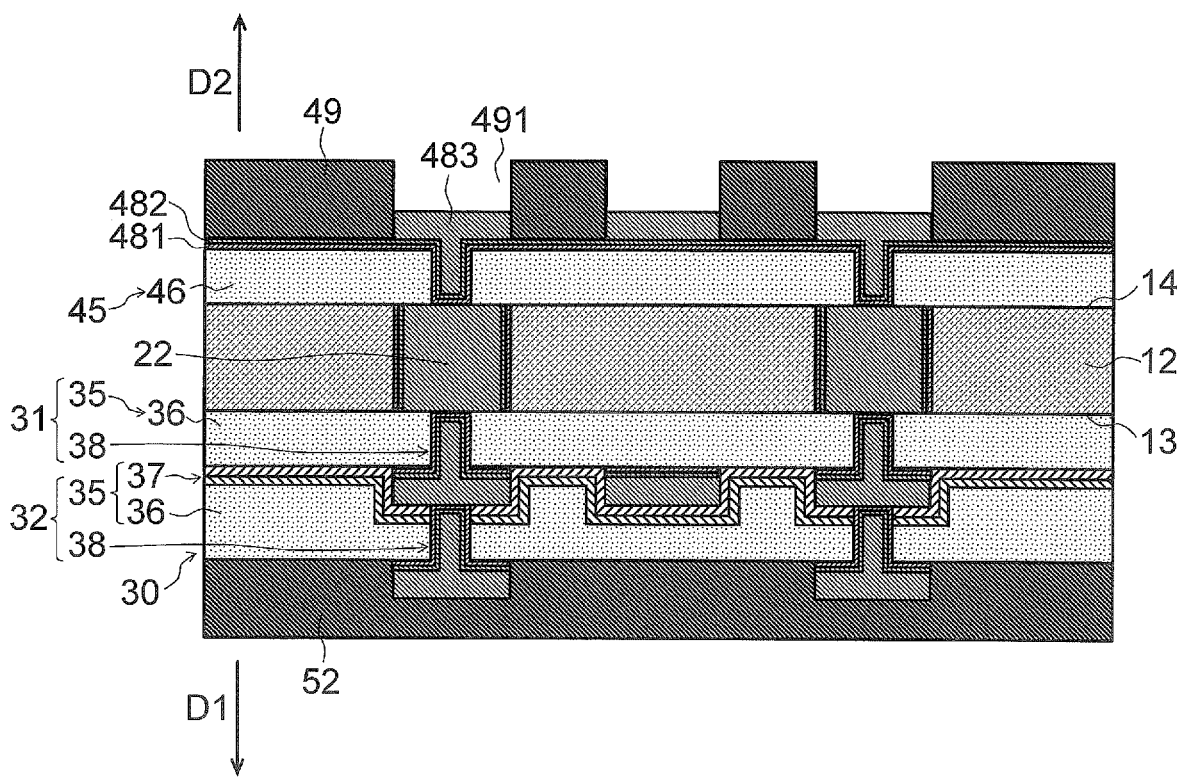
FIG. 28 is a view showing the first manufacturing method of the through electrode substrate according to the third modification example.

Following thereto, as shown in FIG. 27, a resist layer 49 provided with an opening 491 is formed on the seed layer 482. In addition, a protective layer 52 is formed on the first side D1 of the substrate 12. Following thereto, as shown in FIG. 28, the opening 491 of the resist layer 49 is supplied with a plating solution, so that a plated layer 483 is formed on the seed layer 482 by electrolytic plating.

Figure 29:
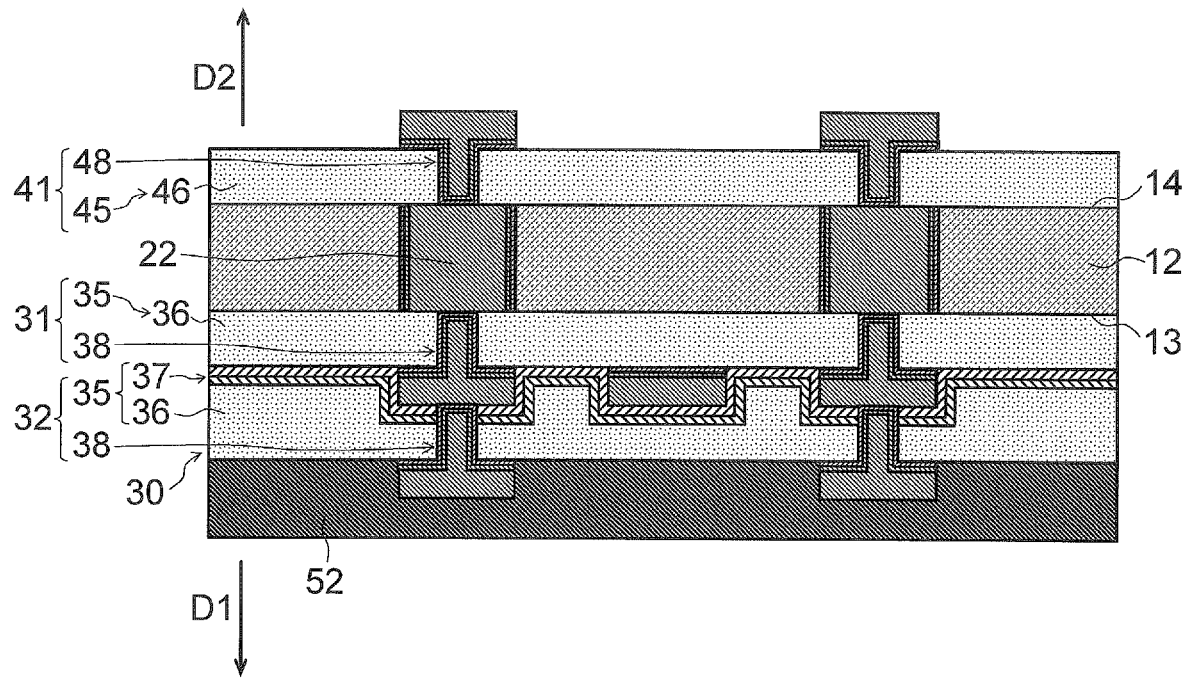
FIG. 29 is a view showing the first manufacturing method of the through electrode substrate according to the third modification example.

Thereafter, as shown in FIG. 29, the resist layer 39 is removed. Following thereto, portions of the barrier layer 481 and the seed layer 482, which are covered with the resist layer 49, are removed by wet etching, for example. In this manner, the electroconductive layer 48 including the barrier layer 481, the seed layer 482 and the plated layer 483 can be formed. Similarly to the plated layer 383, a step of annealing the plated layer 483 may be performed. An annealing temperature of the plated layer 483 is not less than 200° C., for example.

Figure 30:
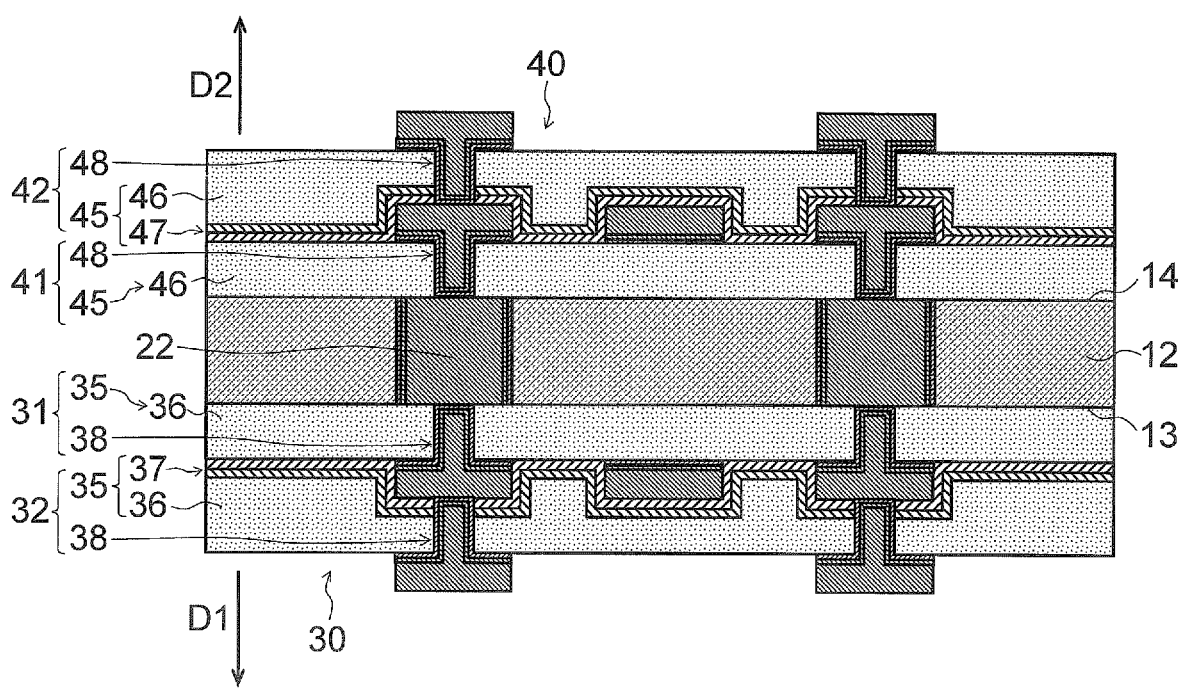
FIG. 30 is a view showing the first manufacturing method of the through electrode substrate according to the third modification example.

Following thereto, similarly to the step of forming the second wiring layer 32 on the first side D1, as shown in FIG. 30, a second wiring layer 42 is formed on the first wiring layer 41 on the second side D2. In this manner, the second wiring structure 40 including the first wiring layer 41 and the second wiring layer 42 can be formed on the second side D2 of the substrate 12.

Second Manufacturing Method of Through Electrode Substrate

As a method of manufacturing the through electrode substrate 10 comprising the first wiring structure 30 and the second wiring structure 40, a method of using a joint member can be employed, other than the method of utilizing the aforementioned protective layer 51 and the protective layer 52. Herebelow, another example of the method of manufacturing the through electrode substrate 10 according to the modification example is described with reference to FIGS. 31 to 34.

Figure 31:
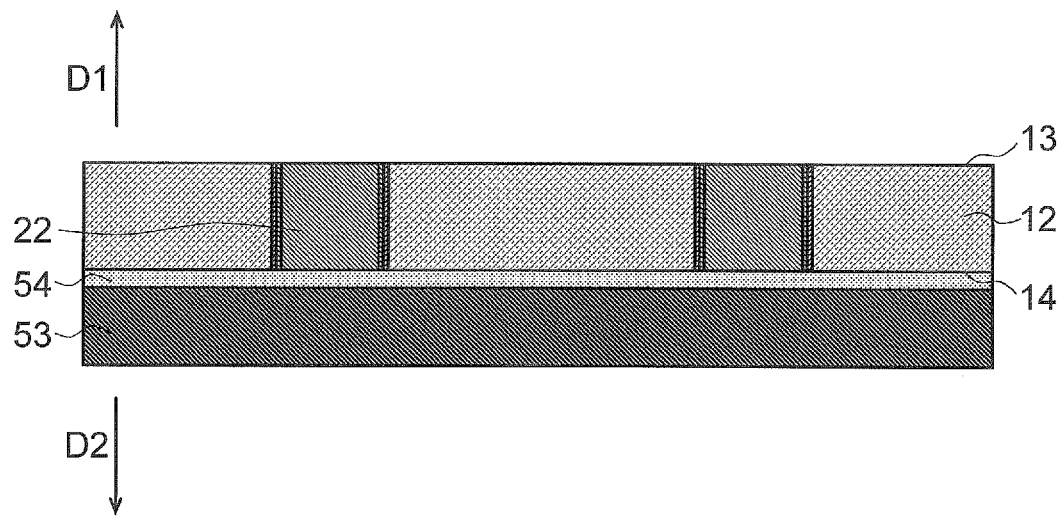
FIG. 31 is a view showing a second manufacturing method of the through electrode substrate according to the third modification example.

Firstly, similarly to the aforementioned first embodiment, the through hole 20 is formed in the substrate 12, and the through electrode 22 is formed in the through hole 20, so as to obtain the substrate 12 shown in FIG. 4. Following thereto, as shown in FIG. 31, a joint member 53 is attached to the second side D2 of the substrate 12. An adhesive layer 54 may be provided between the substrate 12 and the joint member 53, in order to increase an adhesive force between the substrate 12 and the joint member 53. The adhesive layer 54 contains, for example, polymer with carbon as a base skeleton. To be specific, the adhesive layer 54 is formed of an acryl-based resin, an epoxy resin, a UV setting resin or the like.

Figure 32:
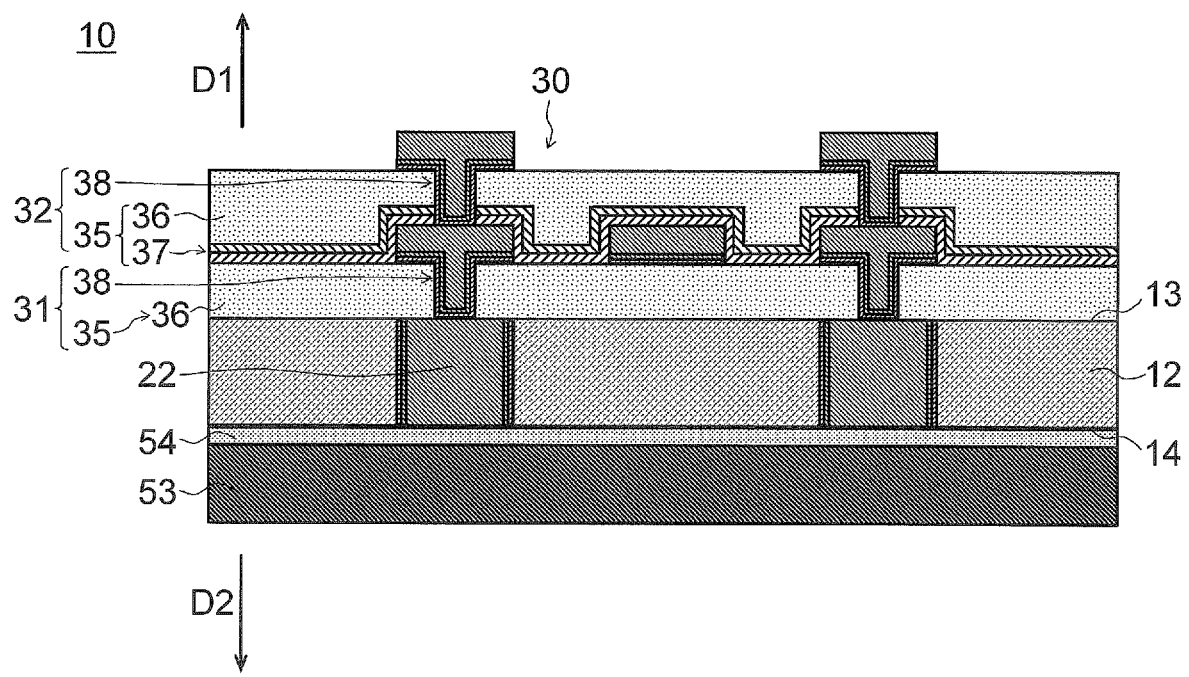
FIG. 32 is a view showing the second manufacturing method of the through electrode substrate according to the third modification example.

The joint member is a plate-like member having rigidity. As a material forming the joint member 53, an inorganic material having insulation properties, such as glass, silicon carbide or silicon can be used. In this case, a thickness of the joint member 53 is not less than 400 µm, for example. In addition, a metal material such as stainless can also be used as a material forming the joint member 53. In this case, a thickness of the joint member 53 is not less than 200 µm, for example. By attaching the joint member 53 on the second side D2 of the substrate 12, it can be prevented that the surface of the substrate 12 on the second side D2 is damaged, during the step of forming the first wiring structure 30 on the first side D1 of the substrate 12. Thus, while the substrate 12 is being transferred by using a manufacture line for a conventional color filter or the like, the first wiring structure 30 can be formed on the first side D1 of the substrate 12, as shown in FIG. 32.

Figure 33:
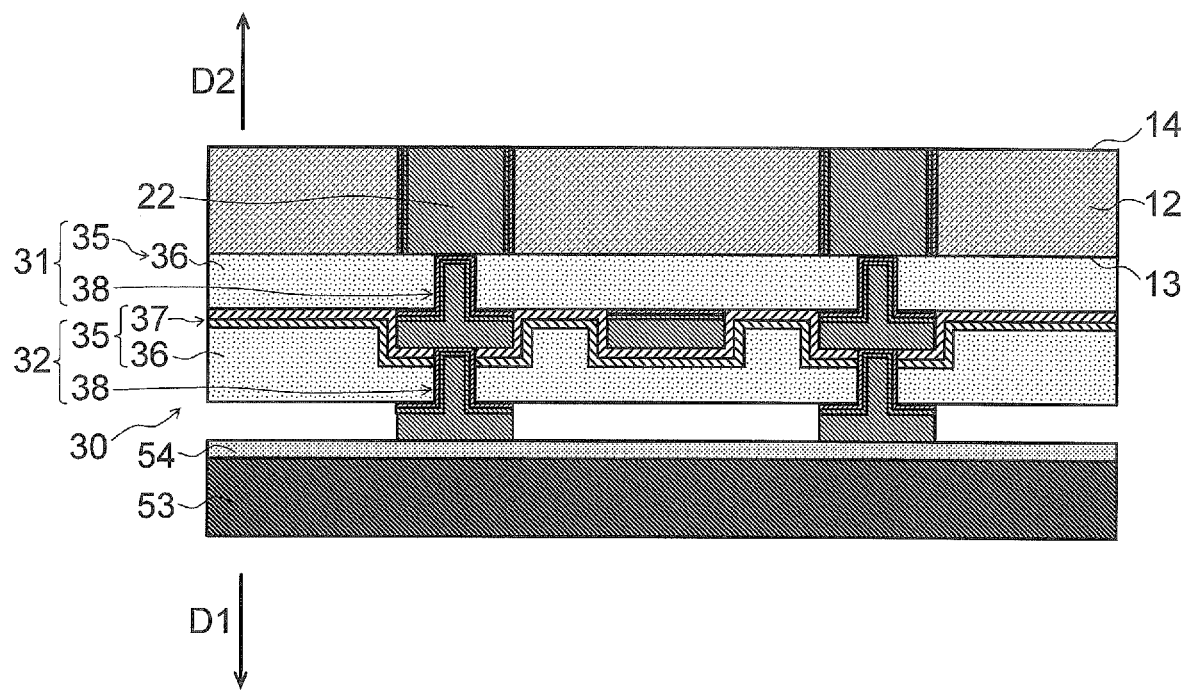
FIG. 33 is a view showing the second manufacturing method of the through electrode substrate according to the third modification example.
Figure 34:
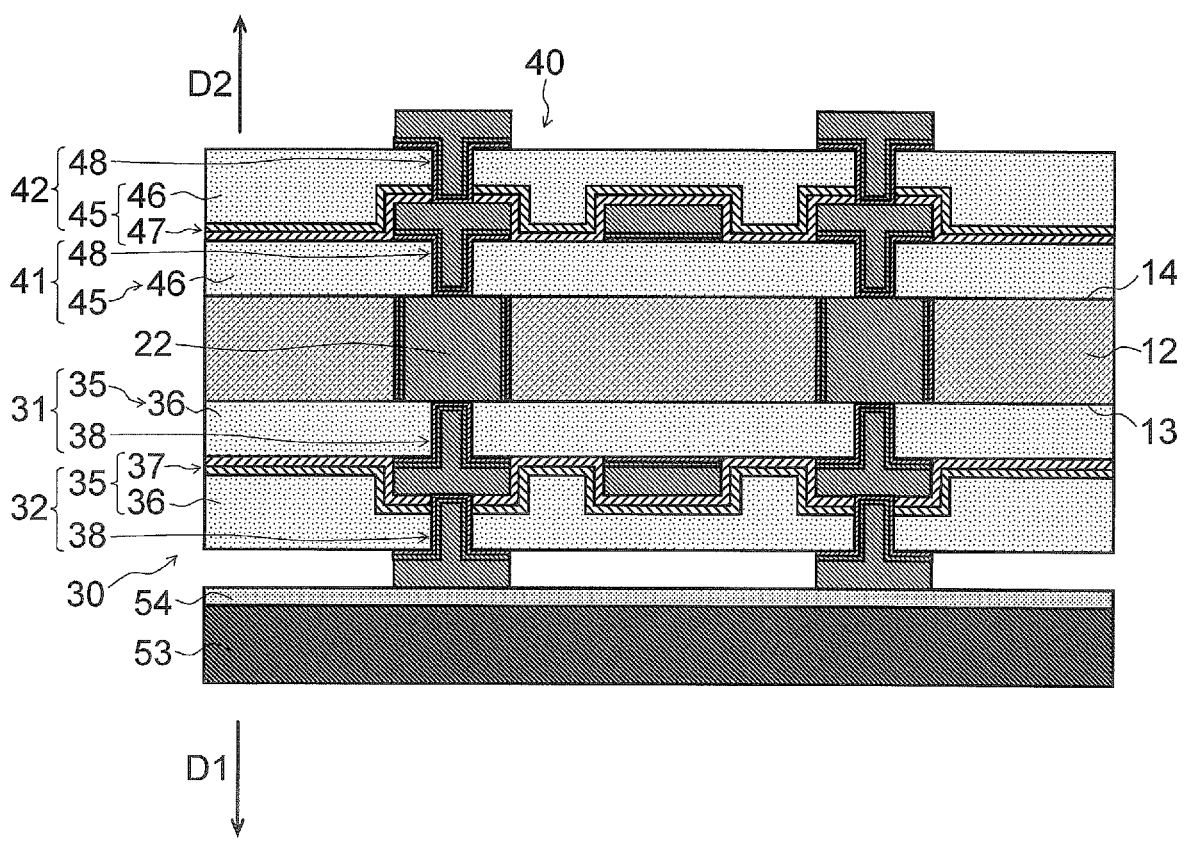
FIG. 34 is a view showing the second manufacturing method of the through electrode substrate according to the third modification example.

Following thereto, as shown in FIG. 33, the first surface 13 and the second surface 14 of the substrate 12 are reversed. In addition, the joint member 53 is detached from the second side D2 of the substrate 12, and is attached to the first side D1 of the substrate 12. The joint member 53 to be attached to the first side D1 of the substrate 12 and the joint member 53 to be attached to the second side D2 of the substrate 12 may be the same with each other or different from each other. Following thereto, as shown in FIG. 34, the second wiring structure 40 is formed on the second side D2 of the substrate 12.

According to the manufacturing method shown in FIGS. 31 to 34, with the use of the joint member 53, it can be prevented that, during a step of forming a wiring layer on one of the first side D1 and the second side D2 of the substrate 12, the surface on the other of the first side D1 or the second side D2 of the substrate 12 is damaged. Thus, the number of options that are employed in the manufacture of the through electrode substrate 10 can be increased.

Fourth Modification Example

In the aforementioned third modification example, the number of layers of the electroconductive layer 38 included in the first wiring structure 30 positioned on the first side D1 of the substrate 12, and the number of layers of the electroconductive layer 48 included in the second wiring structure 40 positioned on the second side D2 of the substrate 12 are the same with each other. However, the number of layers of the electroconductive layer 38 included in the first wiring structure 30 and the number of layers of the electroconductive structure 48 included in the second wiring structure 40 may be different from each other.

Figure 35:
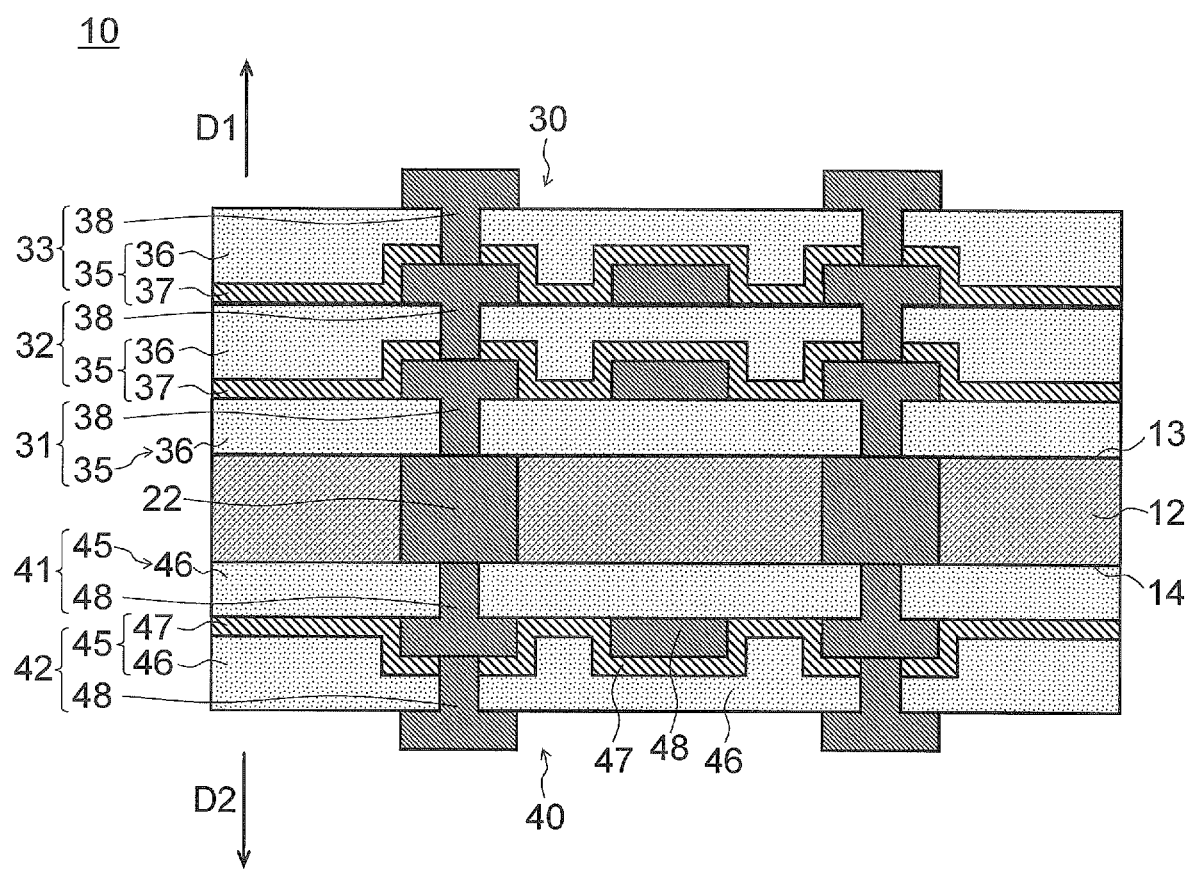
FIG. 35 is a sectional view of a through electrode substrate according to a fourth modification example.

FIG. 35 is a sectional view showing a through electrode substrate 10 according to this modification example. A first wiring structure 30 of the through electrode substrate 10 includes a first wiring layer 31, a second wiring layer 32 and a third wiring layer 33. Thus, the number of layers of the electroconductive layer 38 included in the first wiring structure 30 is three. On the other hand, a second wiring structure 40 of the through electrode substrate 10 includes a first wiring layer 41 and a second wiring layer 48. Thus, the number of layers of the electroconductive layer 48 included in the second wiring structure 40 is two.

As shown in FIG. 35, the second wiring layer 32 and the third wiring layer 33 of the first wiring structure 30 respectively include an organic layer 36 and an inorganic layer 37. Thus, it can be prevented that the substrate 12 is warped because of the first wiring structure 30. In addition, the second wiring layer 42 of the second wiring structure 40 includes an organic layer 46 and an inorganic layer 47. Thus, it can be prevented that the substrate 12 is warped because of the second wiring structure 40. Namely, in the respective first wiring structure 30 and the second wiring structure 40, generation of warp is prevented by the inorganic layer 37 and the inorganic layer 47. Thus, even when the number of layers of the wiring layer included in the first wiring structure 30, i.e., the number of layers of the electroconductive layer 38, and the number of layers of the wiring layer included in the second wiring structure 40, i.e., the number of layers of the electroconductive layer 48 differ from each other, it can be prevented that the substrate 12 is warped.

Second Embodiment

Next, a second embodiment is described with reference to FIGS. 36 to 40. The second embodiment differs from the aforementioned first embodiment only in that the through electrode 22 is a conformal via, and is substantially the same in other structure. In the second embodiment, the same part as that of the first embodiment is shown by the same reference number, and detailed description thereof is omitted. In addition, when the effect obtained in the first embodiment is apparently obtained also in the third embodiment, description thereof may be omitted.

Figure 36:
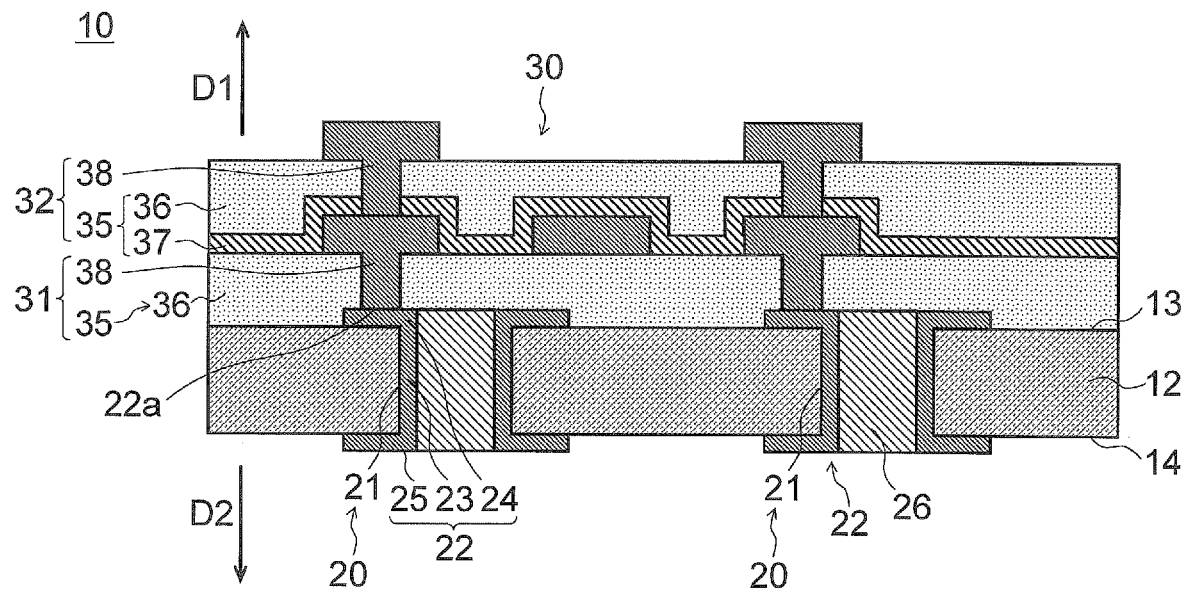
FIG. 36 is a sectional view showing a through electrode substrate according to a second embodiment.
Figure 37:
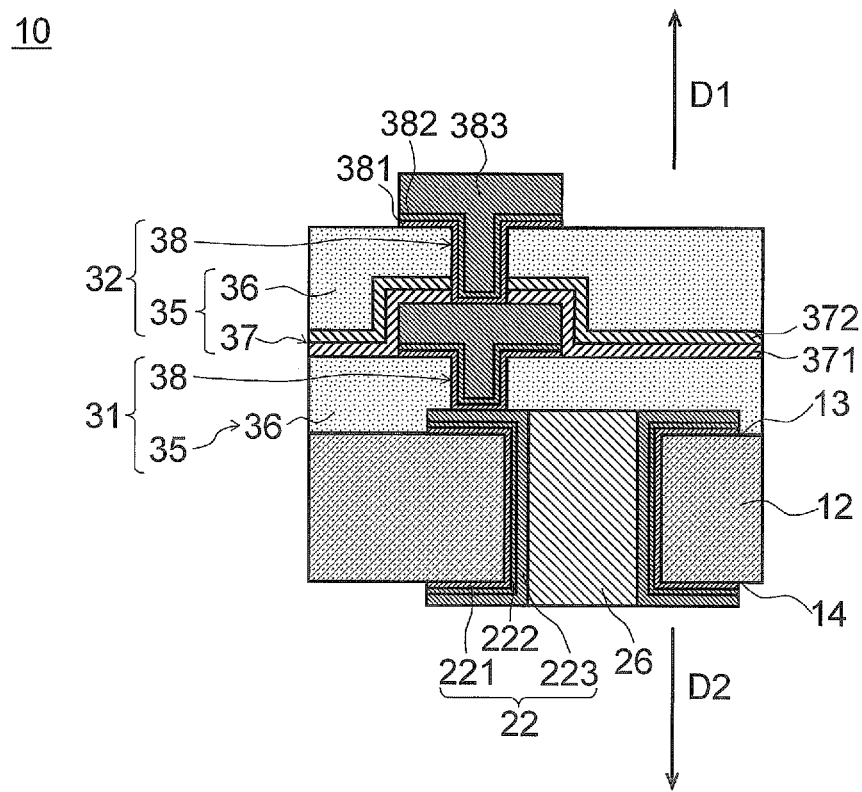
FIG. 37 is an enlarged sectional view of the through electrode substrate of FIG. 36.

FIG. 36 is a sectional view of a through electrode substrate 10 according to the second embodiment. FIG. 37 is an enlarged sectional view of the through electrode substrate 10 of FIG. 36. A through electrode 22 includes a sidewall portion 23, a first portion 24 and a second portion 25. The sidewall portion 23 extends along a sidewall 21 of the through hole 20. The first portion 24 is connected to the sidewall portion 23 from a first side D1 of the sidewall portion 23, and is provided on a first surface 13. As shown in FIG. 36, the electroconductive layer 38 of the first wiring layer 31 of the first wiring structure 30 is connected to the first portion 24 of the through electrode 22. In other words, the first portion 24 includes the first end surface 22a connected to the electroconductive layer 38 of the first wiring layer 31. The second portion 25 is connected to the sidewall portion 23 from a second side D2 of the sidewall portion 23, and is provided on the second surface 14.

As long as the through electrode 22 has electroconductive properties, a method of forming the through electrode 22 is not particularly limited. For example, the through electrode 22 may be formed by a physical film deposition method such as a vapor deposition method or a sputtering method, or may be formed by a chemical film deposition method or a plating method. In addition, the through electrode 22 may be composed of a single layer having electroconductive properties, or may include a plurality of layers having electroconductive properties. For example, similarly to the filled via, as shown in FIG. 37, the side wall portion 23, the first portion 24 and the second portion 25 may respectively include a barrier layer 221, a seed layer 222 and a plated layer 223 laminated in this order from the side of a substrate 12.

The through electrode substrate 10 may further comprises a filling member 26 positioned to the center side of the through hole 20 of the sidewall portion 23 of the through electrode 22. The "center side" means that, inside the through hole 20, a distance between the filling member 26 and the sidewall 21 is larger than a distance between the sidewall portion 23 and the sidewall 21. The filling member 26 contains an insulating resin material such as polyimide or benz cyclobutene, or an inorganic material such as silicon oxide or silicon nitride. By providing the through hole 20 with the filling member 26, it can be prevented that a plating solution, an organic material and an inorganic material remain as residue inside the through hole 20.

As shown in FIG. 36, when seen along the normal direction of the first surface 13 of the substrate 12, an opening of an insulation layer 35, which is for connecting the electroconductive layer 38 of the first wiring layer 31 and the through electrode 22, may not be overlapped with the through hole 20 of the substrate 12. Although not shown, when seen along the normal direction of the first surface 13 of the substrate 12, the opening of the insulation layer 35 may be partially overlapped with the through hole 20 of the substrate 12.

Manufacturing Method of Through Electrode Substrate

Figure 38:
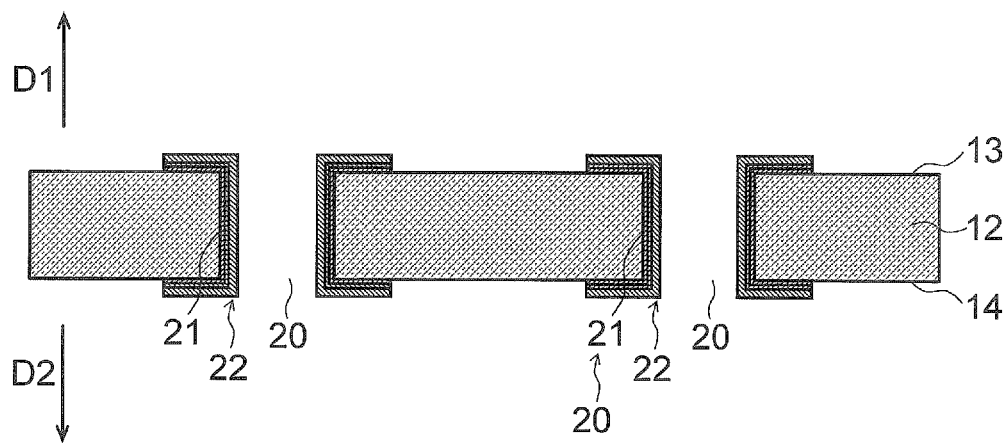
FIG. 38 is a view showing a manufacturing step of the through electrode substrate according to the second embodiment.

Herebelow, an example of a manufacturing method of the through electrode substrate 10 according to the second embodiment is described with reference to FIGS. 38 to 40.

Firstly, the through hole 20 is formed in the through electrode substrate 10. Following thereto, as shown in FIG. 38, the through electrode 22 including the sidewall portion 23, the first portion 24 and the second portion 25 is formed in the through hole 20. For example, the barrier layer 221 and the seed layer 222 are formed on the first surface 13, the second surface 14 and the sidewall 21 of the substrate 12, by a physical film deposition method such as a vapor deposition method or a sputtering method. Following thereto, a resist layer provided with an opening is formed on the seed layer 222. Following thereto, the opening of the resist layer is supplied with a plating solution, so as to form the plated layer 223 partially on the seed layer 222. Thereafter, the resist layer is removed, and portions of the barrier layer 221 and the seed layer 222, which are covered with the resist layer, are removed. In this manner, the through electrode 22 including the sidewall portion 23, the first portion 24 and the second portion 25 can be obtained.

Figure 39:
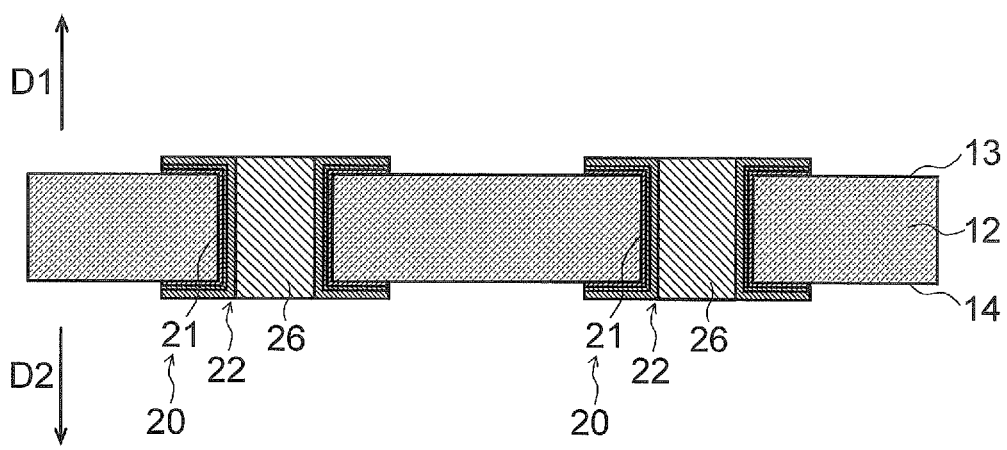
FIG. 39 is a view showing a manufacturing step of the through electrode substrate according to the second embodiment.
Figure 40:
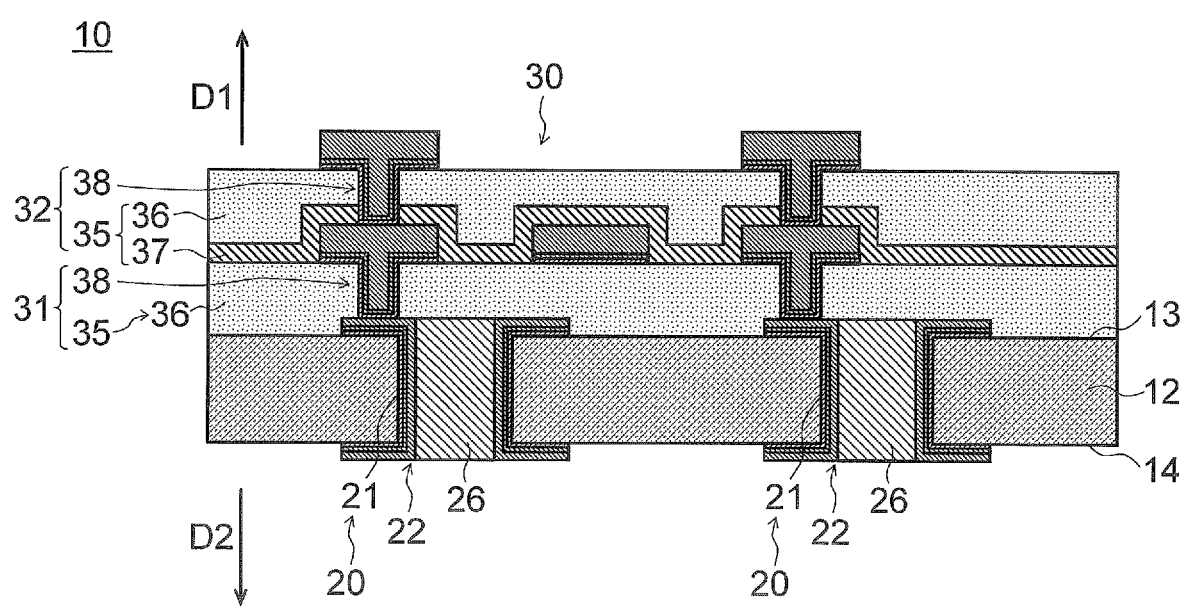
FIG. 40 is a view showing a manufacturing step of the through electrode substrate according to the second embodiment.

Next, as shown in FIG. 39, the through hole 20 is filled with the filling member 26. For example, firstly, a film including a resin layer forming the filling member 26 is disposed on the first side D1 and the second side D2 of the substrate 12. Following thereto, the film is pressurized so at to push the resin layer into the through hole 20. Thereafter, the resin layer inside the through hole 20 is cured. In addition, an unnecessary portion of the resin layer is removed. In this manner, the filling member 26 can be provided in the through hole 20.

After that, the first wiring structure 30 including the first wiring layer 31 and the second wiring layer 32 is formed on the first side D1 of the substrate 12. In this manner, as shown in FIG. 40, it is possible to obtain the through electrode substrate 10 comprising the through electrode 22 which is a conformal via.

Similarly to the aforementioned first embodiment, also in the through electrode substrate 10 according to the second embodiment, the second wiring layer 32 includes the inorganic layer 37 that covers the second portion 38b of the electroconductive layer 38 of the first wiring layer 31. Thus, a residual stress generated in the electroconductive layer 38 of the first wiring layer 31 can be reduced. Thus, it can be prevented that electric connection failure occurs between the electroconductive layer 38 of the first wiring layer 31 and the electroconductive layer 38 of the second wiring layer 32. Preferably, a ratio of the thickness of the inorganic layer 37 with respect to the whole thickness of the insulation layer 35 is not less than 10% and not more than 60%.

In addition, the organic layer 36 is positioned at least partially between the first portion 24 of the through electrode 22 and the electroconductive layer 38 of the first wiring layer 31. Thus, it can be prevented that a stress caused by thermal expansion of the through electrode 22 is transmitted to a portion of the electroconductive layer 38 of the first wiring layer 31, which is positioned on the organic layer 36. Thus, it can be prevented that a defect such as crack is generated in the inorganic layer 37.

First Modification Example

Figure 41:
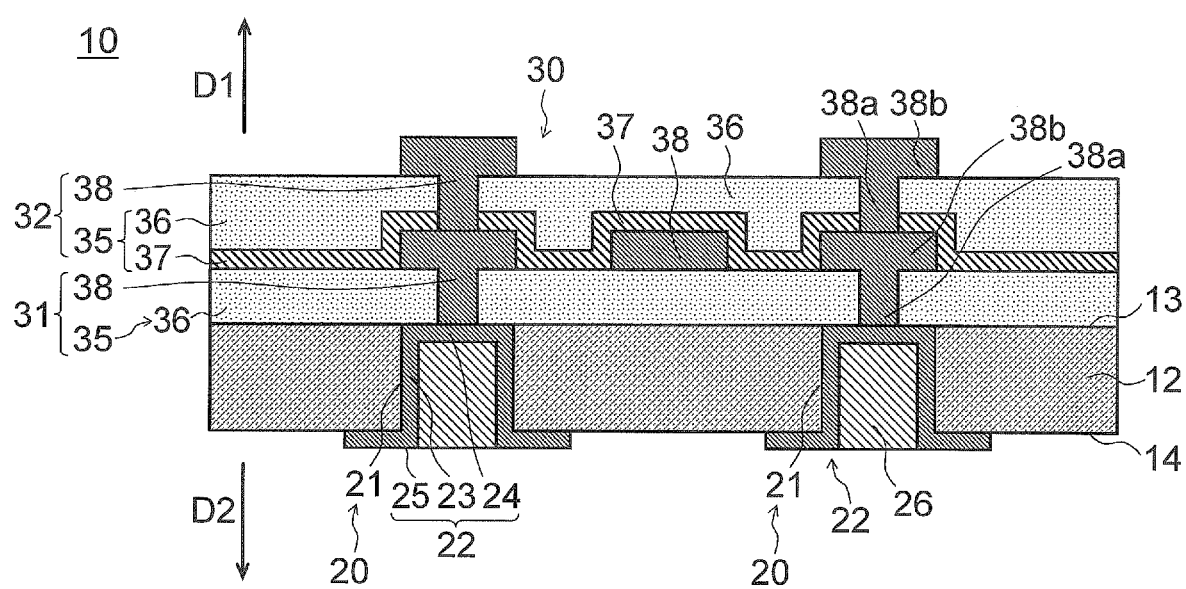
FIG. 41 is a sectional view showing a through electrode substrate according to a first modification example of the second embodiment.

In the aforementioned second embodiment, the first portion 24 of the through electrode 22 is positioned on the first surface 13 of the substrate 12. However, not limited thereto, as shown in FIG. 41, the first portion 24 of the through electrode 22 may extend along a plane direction of the first surface 13 of the substrate 12, such that the first portion 24 of the through electrode 22 is at least partially overlapped with the through hole 20 of the first surface 13, when seen along the normal direction of the first surface 13 of the substrate 12. In this case, the electroconductive layer 38 of the first wiring layer 31 may be connected to the first portion 24 of the through electrode 22 at a position overlapped with the through hole 20 of the substrate 12, when seen along the normal direction of the first surface 13 of the substrate 12.

Other Modification Examples

Similarly to the first modification example of the first embodiment, the first wiring structure 30 of the through electrode substrate 10 may further comprise the third wiring layer 33 positioned on the second wiring layer 32. The insulation layer 35 of the third wiring layer 33 may include the organic layer 36 and the inorganic layer 37. Alternatively, similarly to the second modification example of the first embodiment, one of the insulation layer 35 of the third wiring layer 33 and the insulation layer 35 of the second wiring layer 32 may not include the inorganic layer 37.

In addition, similarly to the third modification example of the first embodiment, the through electrode substrate 10 may further comprise the second wiring structure 40 including at least the first wiring layer 41 positioned on the second surface 14 of the substrate 12, and the second wiring layer 42 positioned on the first wiring layer 41. In addition, similarly to the fourth modification example of the first embodiment, the number of layers of the electroconductive layer 38 included in the first wiring structure 30, and the number of layers of the electroconductive layer 48 included in the second wiring structure 40 may differ from each other.

Third Embodiment

Next, a third embodiment is described. The third embodiment differs from the aforementioned first embodiment only in that the inorganic layer 37 of the first wiring structure is positioned to face the second portion 38b of the electroconductive layer 38 not from the first side D1 but from the second side D2, and is substantially the same in other structure. In the third embodiment, the same part as that of the first embodiment is shown by the same reference number, and detailed description thereof is omitted. In addition, when the effect obtained in the first embodiment is apparently obtained also in the third embodiment, description thereof may be omitted.

Figure 42:
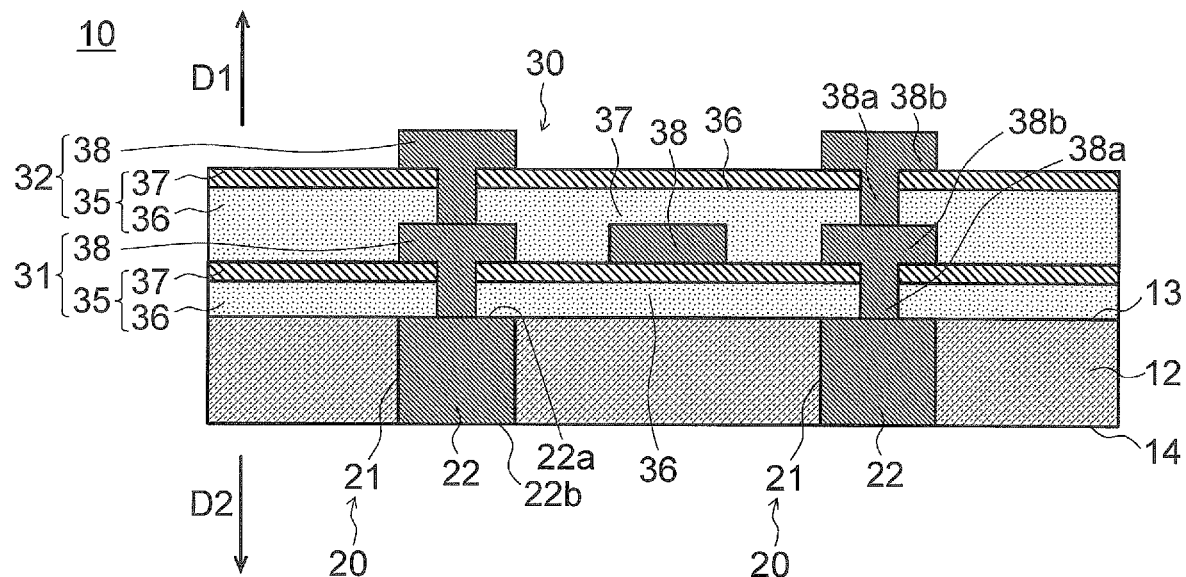
FIG. 42 is a sectional view showing a through electrode substrate according to a third embodiment.
Figure 43:
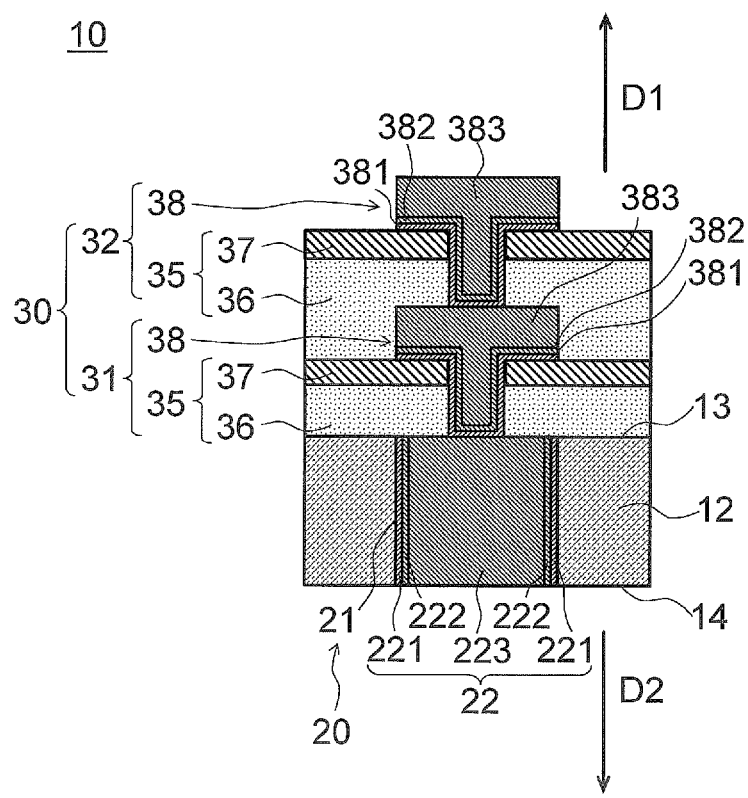
FIG. 43 is an enlarged sectional view showing the through electrode substrate of FIG. 42.

FIG. 42 is a sectional view showing a through electrode substrate 10 according to the third embodiment. FIG. 43 is an enlarged sectional view of the through electrode substrate 10 of FIG. 42. The insulation layer 35 of the first wiring layer 31 of the first wiring structure 30 includes an organic layer 36 and an inorganic layer 37 positioned to the first side D1 of the organic layer 36. The inorganic layer 37 may be at least partially in contact with the second portion 38b of the electroconductive layer 38 of the second wiring structure 32 from the second side D2. By providing such an inorganic layer 37, when constituent elements of the through electrode substrate 10 are thermally expanded or thermally shrunk because of change in atmospheric temperature, it can be prevented that the electroconductive layer 38 of the second wiring layer 32 is displaced in the normal direction of the first surface 13 of the through electrode substrate 10.

Similarly to the first wiring layer 31, the insulation layer 35 of the second wiring layer 32 may include an organic layer 36 and an inorganic layer 37. Similarly to the inorganic layer 37 of the first wiring layer 31, the inorganic layer 37 of the second wiring layer 32 may be positioned to the first side D1 of the organic layer 36. In this case, the inorganic layer 37 may be at least partially in contact with the second portion 38b of the electroconductive layer 38 of the second wiring layer 32 from the second side D2.

The organic layer 36 and the inorganic layer 37 of the insulation layer 35 of the first wiring layer 31 are provided with an opening positioned on the first end surface 22a of the through electrode 22. The electroconductive layer 38 of the first wiring layer 31 is connected to the first end surface 22a of the though electrode 22 through the opening of the insulation layer 35.

As shown in FIG. 43, the electroconductive layer 38 may include the barrier layer 381, the seed layer 382 and the plated layer 383, which are arranged side by side from the side of the sidewall of the opening of the insulation layer 35 to the center side of the opening. In this case, the inorganic layer 37 is in contact with the barrier layer 381 of the electroconductive layer 38, but is not in contact with the plated layer 383. Thus, when the barrier layer 381 is formed of a metal material other than copper, for example, when the barrier layer 381 is formed of titanium or titanium compound, the inorganic layer 37 is not in contact with copper. Thus, it is not necessary for a material forming the inorganic layer 37 to have high adhesion properties to copper. Thus, from the point of view of adhesion properties to the electroconductive layer 38, it is not necessary that the organic layer 37 according to this embodiment includes a layer formed of silicon nitride such as SiN. For example, the inorganic layer 37 may be a single layer formed of silicon oxide such as $SiO_2$. Although not shown, similarly to the inorganic layer 37 of the first embodiment, the inorganic layer 37 may include a first inorganic layer containing silicon nitride such as SiN, and a second inorganic layer containing silicon oxide such as $SiO_2$.

Manufacturing Method of Through Electrode Substrate

Herebelow, an example of a manufacturing method of the through electrode substrate 10 is described with reference to FIGS. 44 to 50.

Firstly, similarly to the aforementioned first embodiment, the through hole 20 is formed in the substrate 12, and the through electrode 22 is formed in the through hole 20, so as to obtain the substrate 12 shown in FIG. 4.

(Step of Forming Insulation Layer of First Wiring Layer)

Figure 44:
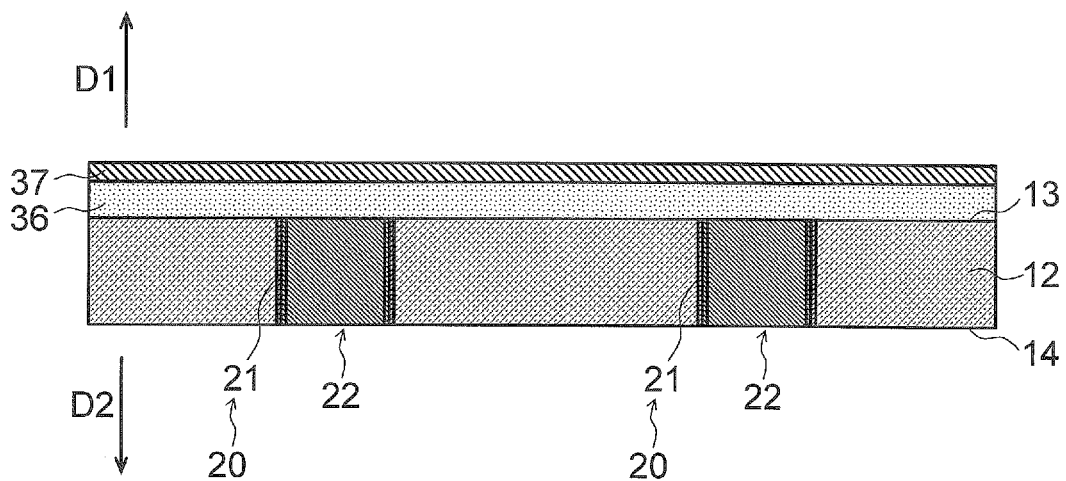
FIG. 44 is a view showing a manufacturing step of the through electrode substrate according to the third embodiment.

Next, as shown in FIG. 44, an organic material such as photosensitive polyimide is deposited on the first surface 13 of the substrate 12 by a spin coating method or the like, so as to form the organic layer 36. Following thereto, the organic layer 36 is baked to cure the organic layer 36. Next, as shown in FIG. 44, the inorganic layer 37 is formed on the organic layer 36 by plasma CVD.

Figure 45:
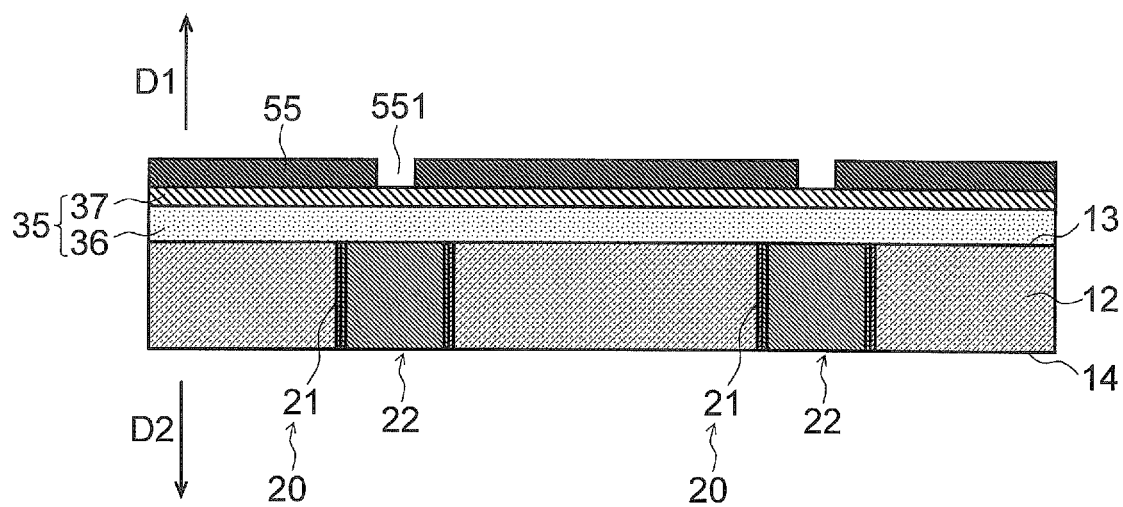
FIG. 45 is a view showing a manufacturing step of the through electrode substrate according to the third embodiment.
Figure 46:
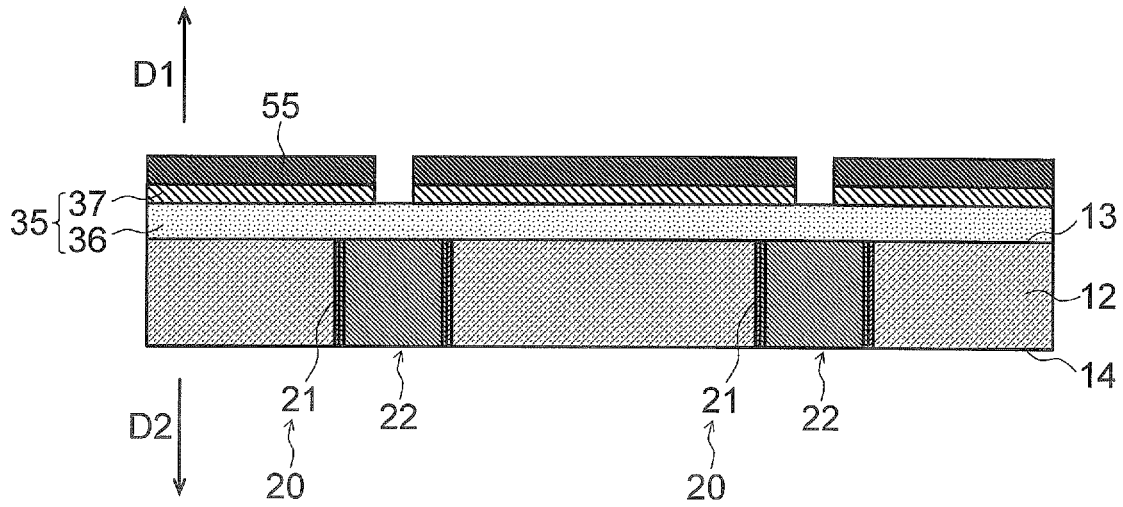
FIG. 46 is a view showing a manufacturing step of the through electrode substrate according to the third embodiment.
Figure 47:
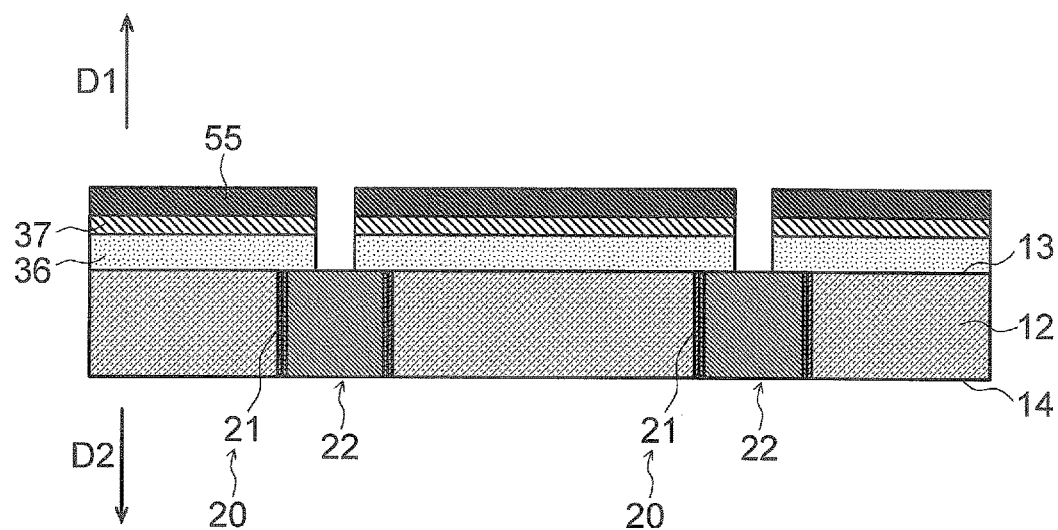
FIG. 47 is a view showing a manufacturing step of the through electrode substrate according to the third embodiment.
Figure 48:
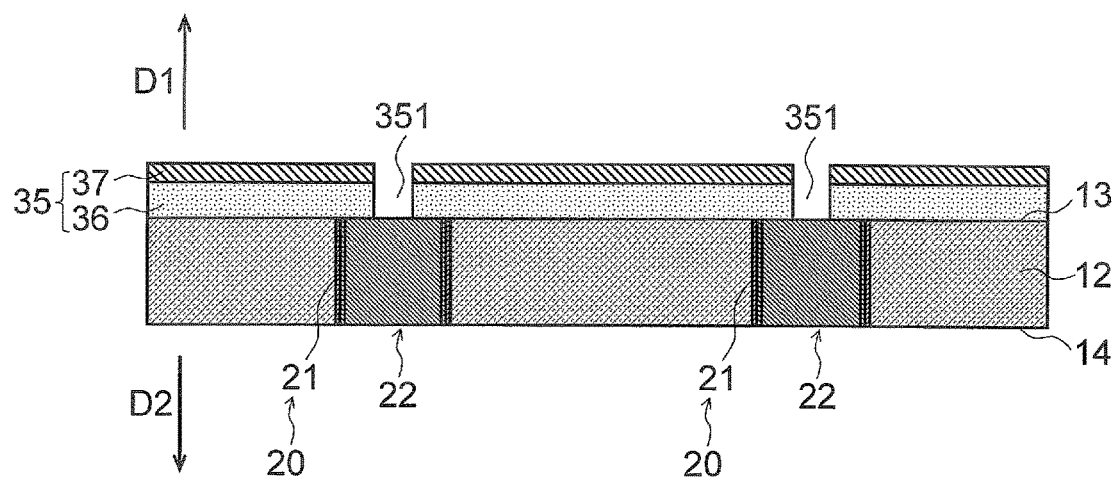
FIG. 48 is a view showing a manufacturing step of the through electrode substrate according to the third embodiment.

Following thereto, as shown in FIG. 45, a resist layer 55 provided with an opening 551 is formed on the inorganic layer 37. Following thereto, as shown in FIG. 46, the inorganic layer 37 exposed to the opening 551 of the resist layer 55 is etched by plasma etching, with the resist layer 55 being used as a mask. Following thereto, as shown in FIG. 47, a portion of the organic layer 36, which is exposed to the opening of the inorganic layer 37, is removed, with the inorganic layer 37 being used as a mask. Following thereto, as shown in FIG. 48, the resist layer 55 is removed. In this manner, an opening 351 positioned on the first end surface 22a of the through electrode 22 can be provided, so that the insulation layer 35 including the organic layer 36 and the inorganic layer 37 can be obtained.

(Step of Forming Electroconductive Layer of First Wiring Layer)

Figure 49:
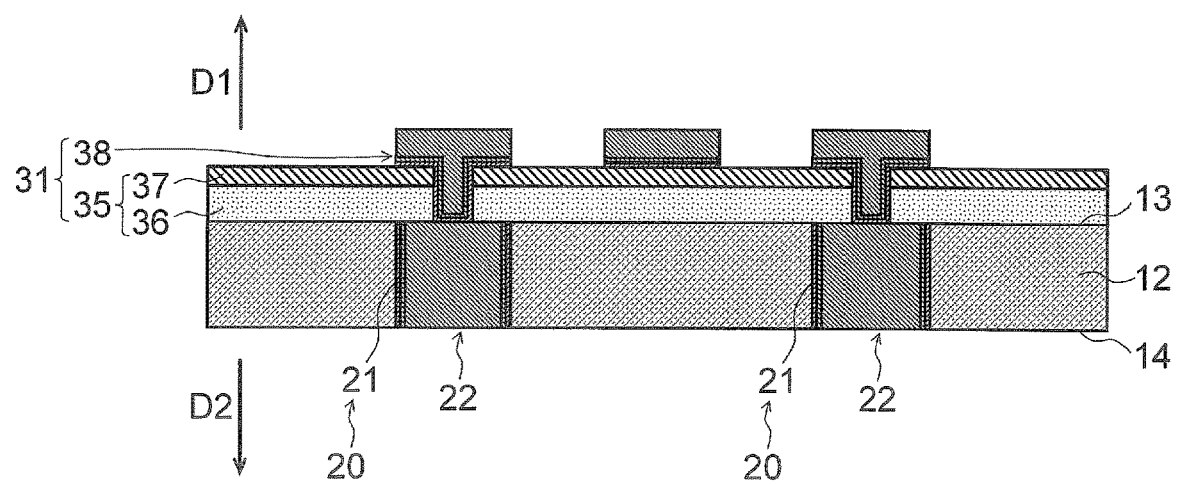
FIG. 49 is a view showing a manufacturing step of the through electrode substrate according to the third embodiment.

Following thereto, as shown in FIG. 49, the electroconductive layer 38 is formed on the opening of the insulation layer 35 and the insulation layer 35. Thus, the first wiring layer 31 having the insulation layer 35 including the organic layer 36 and the inorganic layer 37, and the electroconductive layer 38 connected to the first end surface of the through electrode 22 through the opening of the insulation layer 35 can be obtained.

Figure 50:
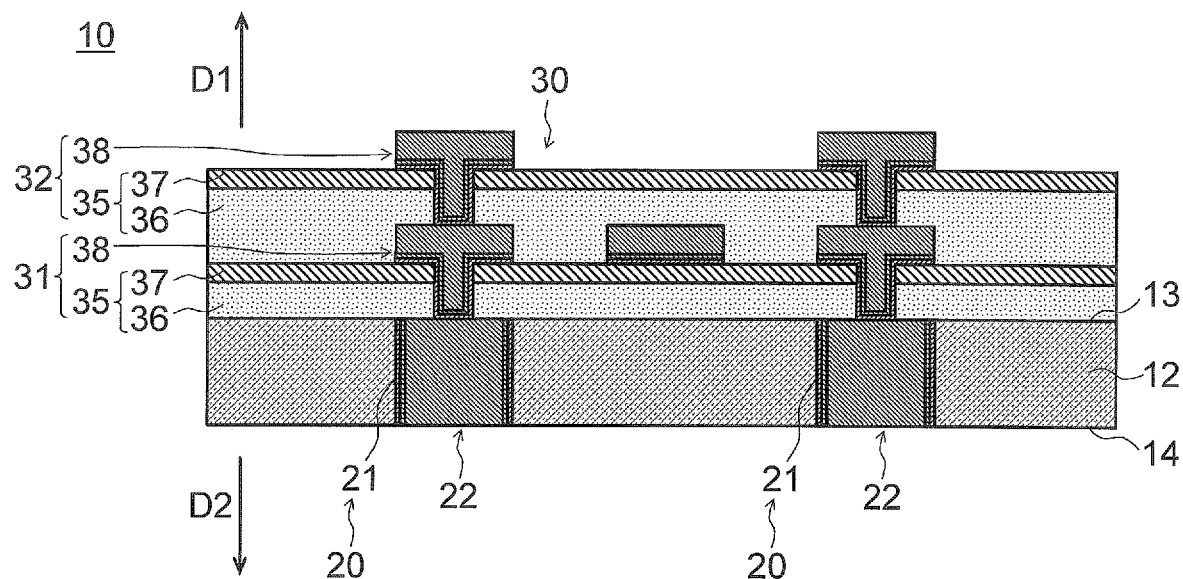
FIG. 50 is a view showing a manufacturing step of the through electrode substrate according to the third embodiment.

Next, similarly to the first wiring layer 31, as shown in FIG. 50, the second wiring layer 32 is formed on the first side D1 of the first wiring layer 31. In this manner, the first wiring structure 30, which has the first wiring layer 31 including the organic layer 36 and the inorganic layer 37, and the second wiring layer 32 including the organic layer 36 and the inorganic layer 37, can be provided on the substrate 12.

Similarly to the aforementioned first embodiment, also in the through electrode substrate 10 according to the third embodiment, each wiring layer of the first wiring structure 30 further includes the inorganic layer 37 in addition to the organic layer 36. For example, in the first wiring layer 31, the inorganic layer 37 is positioned to the first side D1 of the organic layer 36. A coefficient of thermal expansion of an inorganic material forming the inorganic layer 37 is smaller than a coefficient of thermal expansion of a metal material forming the through electrode 22 and the electroconductive layer 38, and a coefficient of thermal expansion of an organic material forming the organic layer 36. Thus, when a step in which an atmospheric temperature becomes not less than 200° C. is repeatedly performed, a residual stress generated in the electroconductive layer 38 of the first wiring layer 31 can be reduced. Thus, it can be prevented that electric connection failure occurs between the electroconductive layer 38 of the first wiring layer 31 and the electroconductive layer 38 of the second wiring layer 32. Preferably, a ratio of the thickness of the inorganic layer 37 with respect to the whole thickness of the insulation layer 35 is not less than 10% and not more than 60%.

In addition, the organic layer 36 is positioned between the first end surface 22a of the through electrode 22 and the inorganic layer 37 of the first wiring layer 31. A Young's modulus of the organic material forming the organic layer 36 is lower than a Young's modulus of the inorganic material forming the inorganic layer 37, and is e.g., not less than 3 GPa and not more than 7 GPa. Thus, even when the through electrode 22 expands toward the first side D1 because of elevation of an atmospheric temperature, it can be prevented that a stress caused by the thermal expansion of the through electrode 22 is transmitted to the inorganic layer 37 and a portion of the second portion 38b of the electroconductive layer 38 of the first wiring layer 31, which is positioned above the organic layer 36. Thus, it can be prevented that a defect such as crack is generated in the inorganic layer 37 between the inorganic layer 37 and the second portion 38b of the electroconductive layer 38. As a result, it can be prevented that the metal material, such as copper, forming the electroconductive layer 38 diffuses into the organic layer 36 through a crack of the inorganic layer 37.

The aforementioned third embodiment can be variously modified. Herebelow, modification examples are described with reference to the drawings according to need. In the below description and the drawings for the description, the same part as that of the third embodiment is shown by the same reference number, and detailed description thereof is omitted. In addition, when the effect obtained in the third embodiment is apparently obtained also in the modification examples, description thereof may be omitted.

First Modification Example

Figure 51:
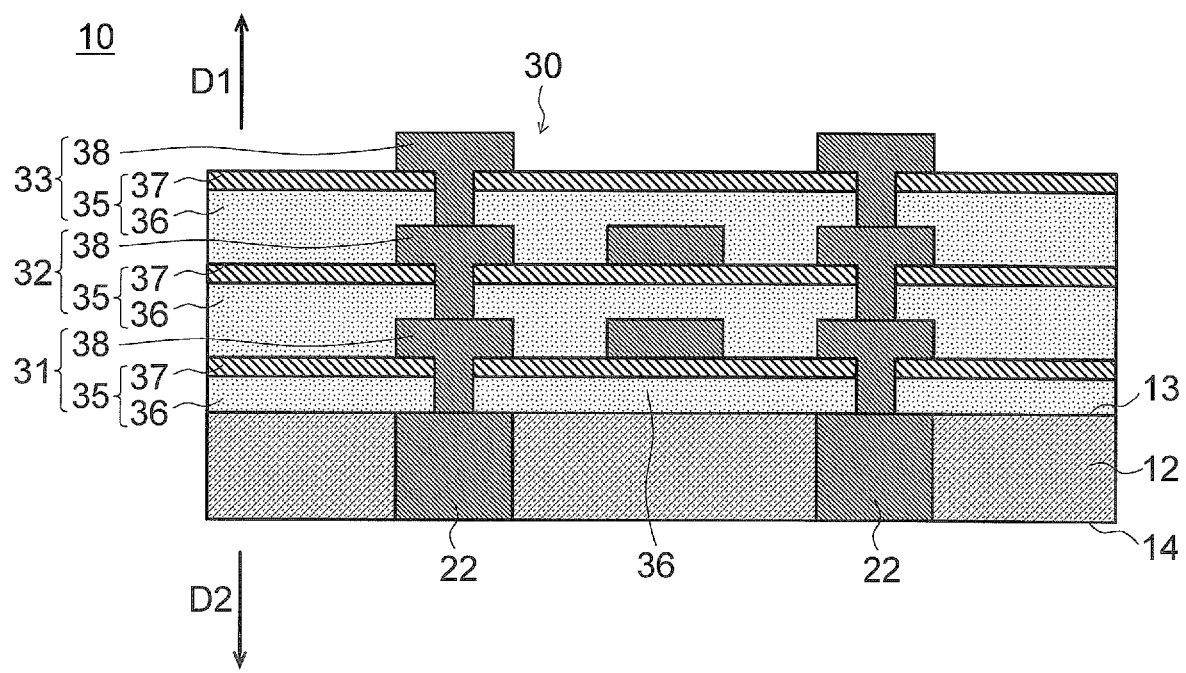
FIG. 51 is a sectional view showing a through electrode substrate according to a first modification example of the third embodiment.

FIG. 51 is a sectional view showing a through electrode substrate 10 according to a first modification example. As shown in FIG. 51, the first wiring structure 30 of the through electrode substrate 10 may further include a third wiring layer 33 positioned on the second wiring layer 32. The third wiring layer 33 has an insulation layer 35 provided with an opening positioned on the electroconductive layer 38 of the second wiring layer 32, and an electroconductive layer 38 connected to the electroconductive layer 38 of the second wiring layer 32 through the opening of the insulation layer 35. The insulation layer 35 of the third wiring layer 33 includes an organic layer 36, and an inorganic layer 37 positioned to the first side of the organic layer 36.

Second Modification Example

Figure 52:
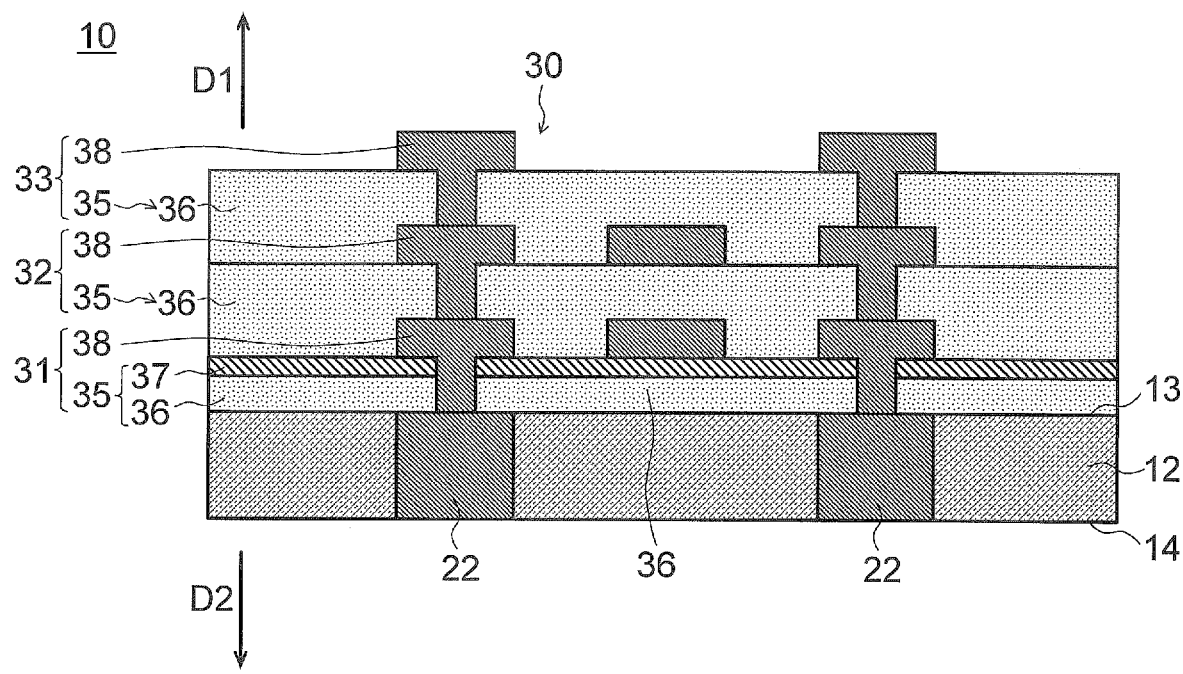
FIG. 52 is a sectional view showing a through electrode substrate according to a second modification example of the third embodiment.

In the first modification example shown in FIG. 51, the first wiring layer 31, all the second wiring layer 32 and the third wiring layer 33 have the inorganic layer 37. However, not limited thereto, at least one of the plurality of wiring layers of the first wiring structure 30 may include the inorganic layer 37. For example as shown in FIG. 52, the insulation layer 35 of the first wiring layer 31 includes the organic layer 37, but the insulation layer 35 of the second wiring layer 32 and the insulation layer 35 of the third wiring layer 33 may not include the inorganic layer 37. Since at least one of the plurality of wiring layers of the first wiring structure 30 includes the inorganic layer 37, it can be prevented that the substrate 12 is warped. In addition, a residual stress generated in the electroconductive layer 38, which is positioned to the first side D1 of the inorganic layer 37, can be reduced, whereby it can be prevented that a defect such as a void is formed in the electroconductive layer 38.

Third Modification Example

Figure 53:
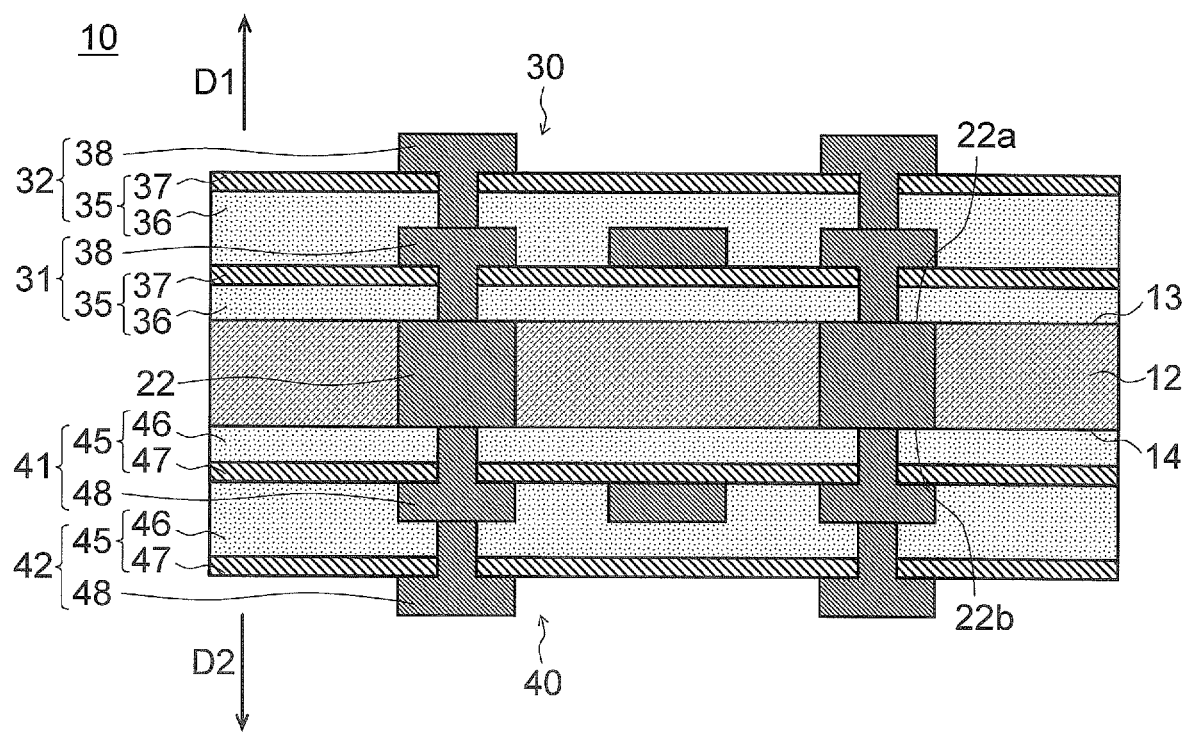
FIG. 53 is a sectional view showing a through electrode substrate according to a third modification example of the third embodiment.

As shown in FIG. 53, a through electrode 10 may further comprise a second wiring structure 40 including at least a first wiring layer 41 positioned on the second surface 14 of the substrate 12, and a second wiring layer 42 positioned on the first wiring layer 41.

Similarly to the first wiring layer 31 of the first wiring structure 30, the first wiring layer 41 includes an insulation layer 45 and an electroconductive layer 48. The insulation layer 45 is provided with an opening positioned on the second end surface 22b of the through electrode 22. The electroconductive layer 48 is connected to the second end surface 22b of the through electrode 22 through the opening of the insulation layer 45. The insulation layer 45 includes an organic layer 46, and an inorganic layer 47 positioned to the second side D2 of the organic layer 46.

Similarly to the first wiring layer 41, the second wiring layer 42 has the insulation layer 45 and the electroconductive layer 48. The insulation layer 45 is provided with an opening positioned on the electroconductive layer 48 of the first wiring layer 41. The electroconductive layer 48 is connected to the electroconductive layer 48 of the first wiring layer 41 through the opening of the insulation layer 45. The insulation layer 45 includes the organic layer 46, and the inorganic layer 47 positioned to the second side D2 of the organic layer 46.

Fourth Modification Example

In the aforementioned third modification example, the number of layers of the electroconductive layer 38 included in the first wiring structure 30 positioned on the first side D1 of the substrate 12, and the number of layers of the electroconductive layer 48 included in the second wiring structure 40 positioned on the second side D2 of the substrate 12 are the same with each other. However, as shown in FIG. 54, the number of layers of the electroconductive layer 38 included in the first wiring structure 30, and the number of layers of the electroconductive layer 48 included in the second wiring structure 40 may differ from each other.

Figure 54:
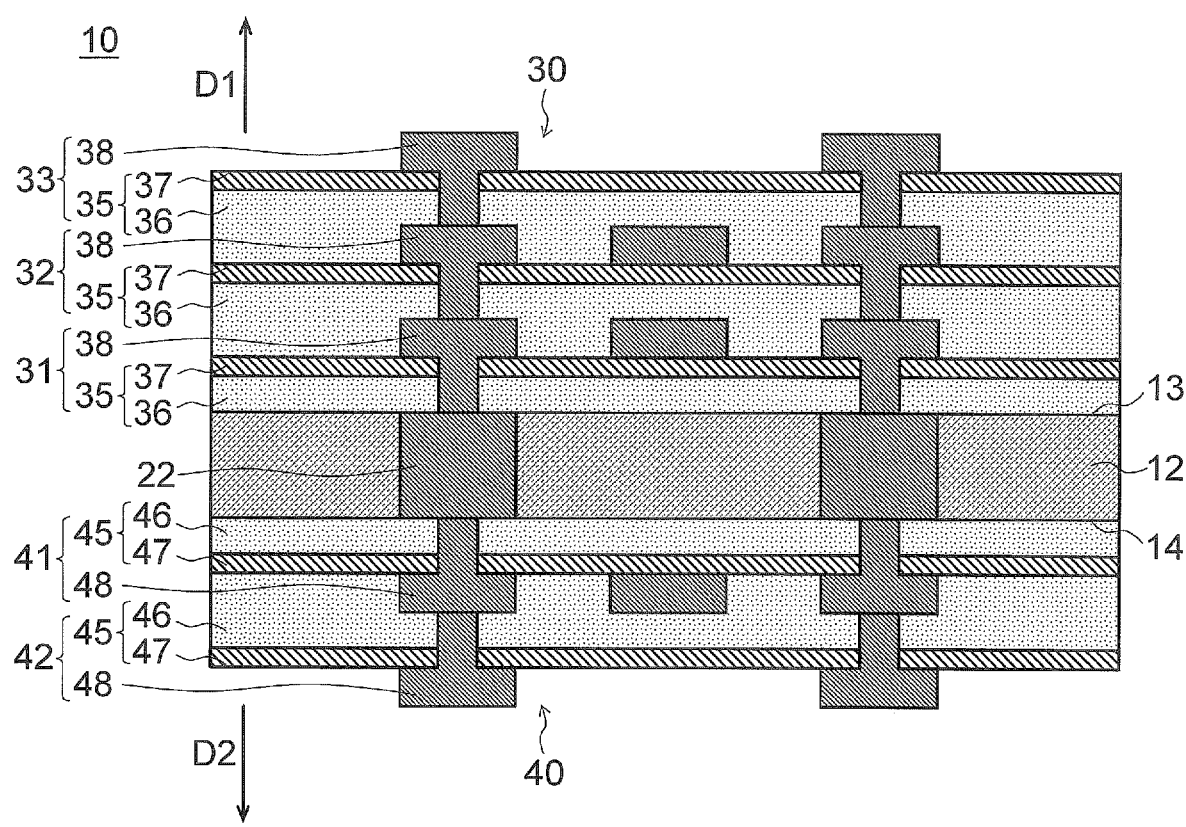
FIG. 54 is a sectional view showing a through electrode substrate according to a fourth modification example of the third embodiment.

As shown in FIG. 54, the first wiring layer 31, the second wiring layer 32 and the third wiring layer 33 of the first wiring structure 30 respectively include the organic layer 36 and the inorganic layer 37. Thus, it can be prevented that the substrate 12 is warped because of the first wiring structure 30. In addition, the first wiring layer 41 and the second wiring layer 42 of the second wiring structure 40 also respectively include the organic layer 46 and the inorganic layer 47. Thus, it can be prevented that the substrate 12 is warped because of the second wiring structure 40. In this manner, in the respective first wiring structure 30 and the second wiring structure 40, generation of warp is prevented by the inorganic layer 37 and the inorganic layer 47. Thus, even when the number of layers of the wiring layer included in the first wiring structure 30, i.e., the number of layers of the electroconductive layer 38, and the number of layers of the wiring layer included in the second wiring structure 40, i.e., the number of layers of the electroconductive layer 48 differ from each other, it can be prevented that the substrate 12 is warped.

Fourth Embodiment

Next, a fourth embodiment is described with reference to FIGS. 55 and 56. The second embodiment differs from the aforementioned third embodiment only in that the through electrode 22 is a conformal via, and is substantially the same in other structure. In the fourth embodiment, the same part as that of the third embodiment is shown by the same reference number, and detailed description thereof is omitted. In addition, when the effect obtained in the third embodiment is apparently obtained also in the third embodiment, description thereof may be omitted.

Figure 55:
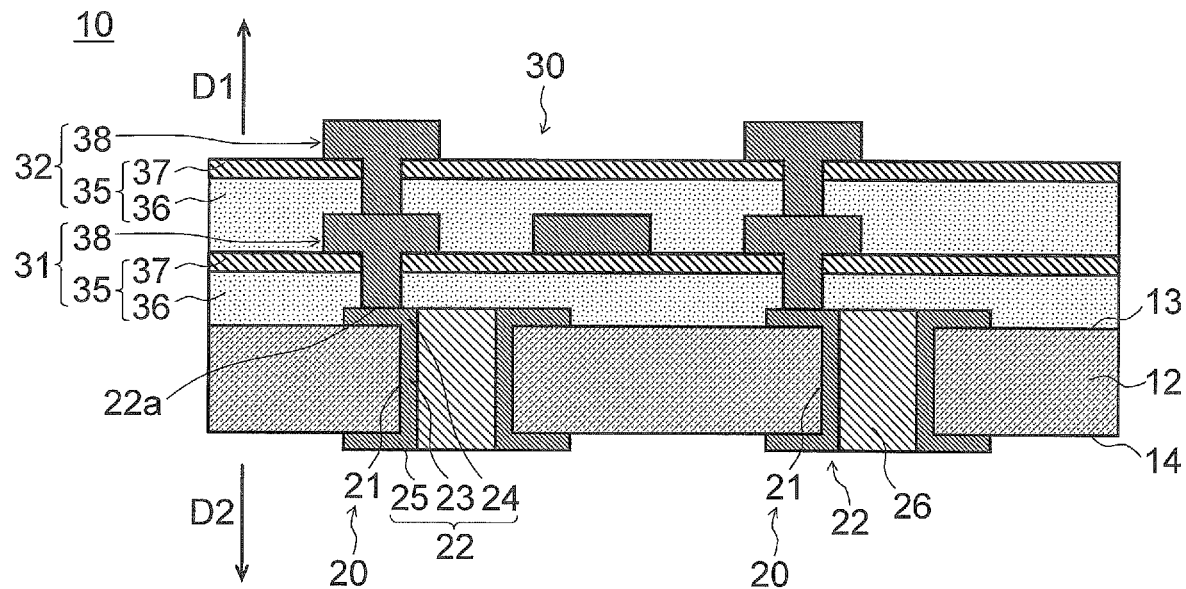
FIG. 55 is a sectional view showing a through electrode substrate according to a fourth embodiment.
Figure 56:
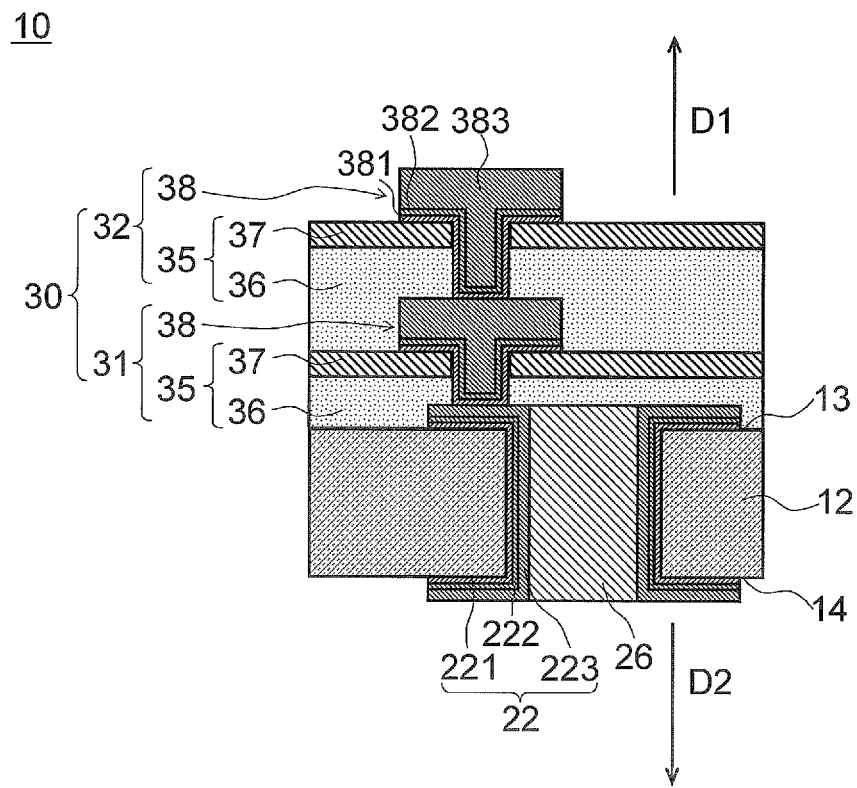
FIG. 56 is an enlarged sectional view showing the through electrode substrate of FIG. 55.

FIG. 55 is a sectional view showing a through electrode substrate 10 according to the fourth embodiment. FIG. 56 is an enlarged sectional view of the through electrode substrate 10 of FIG. 55. Similarly to the aforementioned second embodiment, the through electrode 22 includes the sidewall portion 23, the first portion 24 and the second portion 25. In addition, the through electrode substrate 10 may further comprises a filling member 26 positioned to the center side of the through hole 20 of the sidewall portion 23 of the through electrode 22.

Similarly to the aforementioned third embodiment, also in the fourth embodiment, the first wiring layer 31 includes the inorganic layer 37 positioned to the first side D1 of the organic layer 36. Thus, when a step in which an atmospheric temperature becomes not less than 200° C. is repeatedly performed, a residual stress generated in the electroconductive layer 38 of the first wiring layer 31 can be reduced. Thus, it can be prevented that electric connection failure occurs between the electroconductive layer 38 of the first wiring layer 31 and the electroconductive layer 38 of the second wiring layer 32. Preferably, a ratio of the thickness of the inorganic layer 37 with respect to the whole thickness of the insulation layer 35 is not less than 10% and not more than 60%.

In addition, the organic layer 36 is positioned at least partially between the first portion 24 of the through electrode 22 and the inorganic layer 37 of the first wiring layer 31. Thus, it can be prevented that a stress caused by the thermal expansion of the through electrode 22 is transmitted to the inorganic layer 37 of the first wiring layer 31. Thus, it can be prevented that a defect such as crack is generated in the inorganic layer 37 between the inorganic layer 37 and the electroconductive layer 38.

First Modification Example

Figure 57:
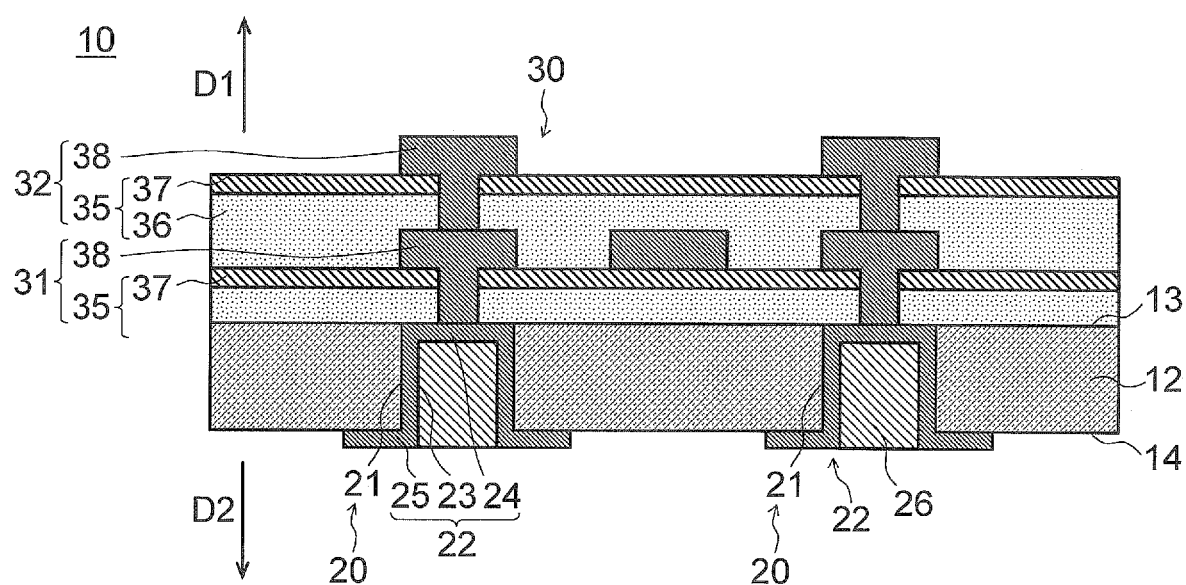
FIG. 57 is a sectional view of a through electrode substrate according to a first modification example of the fourth embodiment.

In the aforementioned fourth embodiment, the first portion 24 of the through electrode 22 is positioned on the first surface 13 of the substrate 12. However, not limited thereto, as shown in FIG. 57, the first portion 24 of the through electrode 22 may extend along a plane direction of the first surface 13 of the substrate 12, such that the first portion 24 of the through electrode 22 is at least partially overlapped with the through hole 20 of the first surface 13, when seen along the normal direction of the first surface 13 of the substrate 12. In this case, the electroconductive layer 38 of the first wiring layer 31 may be connected to the first portion 24 of the through electrode 22 at a position overlapped with the through hole 20 of the substrate 12, when seen along the normal direction of the first surface 13 of the substrate 12.

Other Modification Examples

Similarly to the first modification example of the third embodiment, the first wiring structure 30 of the through electrode substrate 10 may further comprise the third wiring layer 33 positioned on the second wiring layer 32. The insulation layer 35 of the third wiring layer 33 may include the organic layer 36 and the inorganic layer 37. Alternatively, similarly to the second modification example of the third embodiment, there may be a wiring layer that does not include the inorganic layer 37.

In addition, similarly to the third modification example of the third embodiment, the through electrode substrate 10 may further comprise the second wiring structure 40 including at least the first wiring layer 41 positioned on the second surface of the substrate 12, and the second wiring layer 42 positioned on the first wiring layer 41. In addition, similarly to the fourth modification example of the third embodiment, the number of layers of the electroconductive layer 38 included in the first wiring structure 30, and the number of layers of the electroconductive layer 48 included in the second wiring structure 40 may differ from each other.

Fifth Embodiment

In the fourth modification example of the first embodiment, the other modification examples of the second embodiment, the fourth modification example of the third embodiment and the other modification examples of the fourth embodiment, the number of layers of the electroconductive layer 38 included in the first wiring structure 30, and the number of layers of the electroconductive layer 48 included in the second wiring structure 40 differ from each other. In this embodiment, a structural example of a through electrode substrate 10 is further described, in which the number of layers of the electroconductive layer 38 included in the first wiring structure 30, and the number of layers of the electroconductive layer 48 included in the second wiring structure 40 differ from each other.

Figure 68:
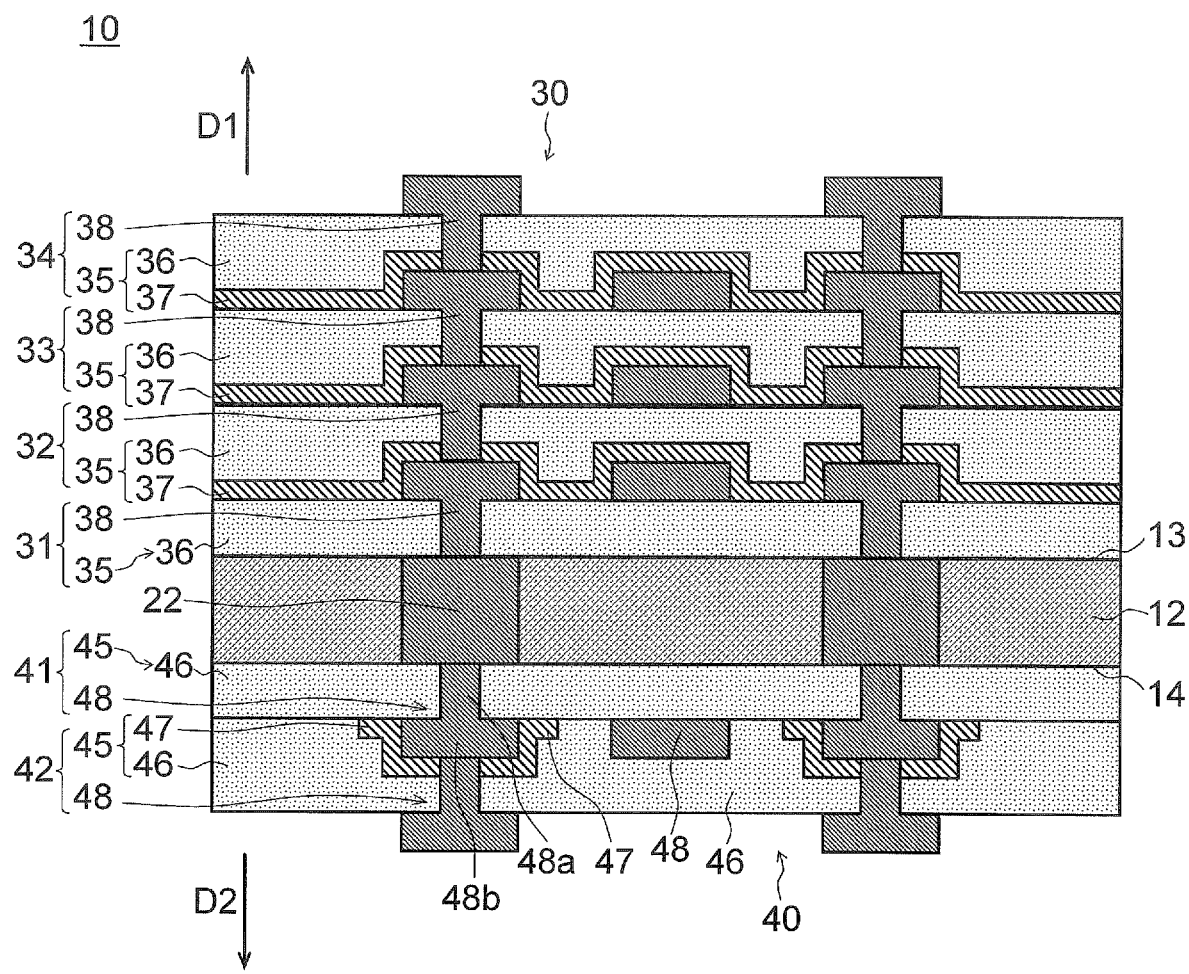
FIG. 68 is a sectional view showing an example of a through electrode substrate according to a fifth embodiment.

FIG. 68 is a sectional view showing an example of a through electrode substrate 10 according to this embodiment. The through electrode substrate 10 shown in FIG. 68 is a further modification example of the through electrode substrate 10 according to the fourth modification example of the first embodiment shown in FIG. 35.

In FIG. 35, the inorganic layer 47 included in the second wiring structure 40, which has the smaller number of electroconductive layers than the first wiring structure 30, covers the organic layer 46 and the second portion 48b of the electroconductive layer 48 from the second side D2. However, not limited thereto, as shown in FIG. 68, the inorganic layer 47 covers the second portion 48b of the electroconductive layer 48 from the second side D2, but may not cover the whole area of the organic layer 46. In other words, the organic layer 46 may include a portion that is not covered with the inorganic layer 47 from the second side D2. As a result, a ratio of a portion of the organic layer 46 of the second wiring structure 40, which is covered with the inorganic layer 47, is lower than a ratio of a portion of the organic layer 46 of the first wiring structure 30, which is covered with the inorganic layer 37. A difference between the ratios is not less than 1%, for example. The difference between the ratios may be not more than 20%. In the example shown in FIG. 68, a portion around a portion of the second portion 48b of the electroconductive layer 48 of the first wiring layer 41, which is in contact with the electroconductive layer 48 of the second wiring layer 42, is covered with the inorganic layer 47 from the second side D2.

Also in the example shown in FIG. 68, similarly to the aforementioned first embodiment and the second embodiment, the second wiring layer 42 of the second wiring structure 40 includes the inorganic layer 47 that covers the second portion 48b of the electroconductive layer 48 of the first wiring layer 41. Thus, a residual stress generated in the electroconductive layer 48 of the second wiring layer 41 can be reduced, whereby it can be prevented that a defect such as a void is formed in the electroconductive layer 48 of the second wiring layer 41 and the electroconductive layer 48 of the second wiring layer 42. In addition, a Young's modulus of the inorganic material forming the inorganic layer 47 is high, e.g., not less than 70 GPa. This also contributes the reduction in residual stress generated in the electroconductive layer 48 of the first wiring layer 41. Due to these facts, it can be prevented that electric connection failure occurs between the electroconductive layer 48 of the first wiring layer 41 and the electroconductive layer 48 of the second wiring layer 42.

As described above, the inorganic layer 47 of the second wiring structure 40 is provided in order to improve reliability of electric connection, rather than to prevent warp. Thus, a thickness of the organic layer 47 of the second wiring structure 40 may be equivalent to a thickness of the inorganic layer 37 of the first wiring structure 30, but may be smaller than the thickness of the inorganic layer 37 of the first wiring structure 30. For example, the thickness of the inorganic layer 47 of the second wiring structure 40 may be at least not less than 30% of the thickness of the inorganic layer 37 of the first wiring structure.

In addition, in the example shown in FIG. 68, the organic layer 46 of the first wiring layer 41 of the second wiring structure 40 includes a portion that is not covered with the inorganic layer 47 from the second side D2. Thus, it is easy for a gas generated in the through electrode 22 to escape outside the through electrode substrate 10 through the organic layer 46 of the first wiring layer 41. As a result, it can be prevented that the electroconductive layer 48 of the first wiring layer 41 is pushed up or blown off.

In the example shown in FIG. 68, the number of layers of the electroconductive layer 48 of the second wiring structure 40 is smaller than the number of layers of the electroconductive layer 38 of the first wiring structure 30. Thus, the number of layers of the organic layer 46 of the second wiring structure 40 is smaller than the number of layers of the organic layer 36 of the first wiring structure 30. Therefore, the degree of warp generated in the second wiring structure 40 caused by the thermal expansion of the organic layer is smaller than the degree of warp generated in the first wiring structure 30. Thus, the impact given to the warp of the substrate 12 as a whole by the fact that the organic layer 46 of the first wiring layer 41 of the second wiring structure 40 includes a portion that is not covered with the inorganic layer 47 from the second side D2 is considered to be insignificant.

In the example shown in FIG. 68, the number of layers of the electroconductive layer 38 included in the first wiring structure 30 is four, while the number of layers of the electroconductive layer 48 included in the second wiring structure 40 is two. However, as long as the number of layers of the electroconductive layer 38 is larger than the number of layers of the electroconductive layer 48, the specific numbers of the layers are optional. For example, when the number of layers of the electroconductive layer 48 is two, the number of layers of the electroconductive layer 38 may be three or five.

In addition, in the example shown in FIG. 68, the through electrode 22 is a filled via. However, not limited thereto, similarly to the aforementioned second embodiment, the through electrode 22 may be a conformal via.

First Modification Example

Figure 69:
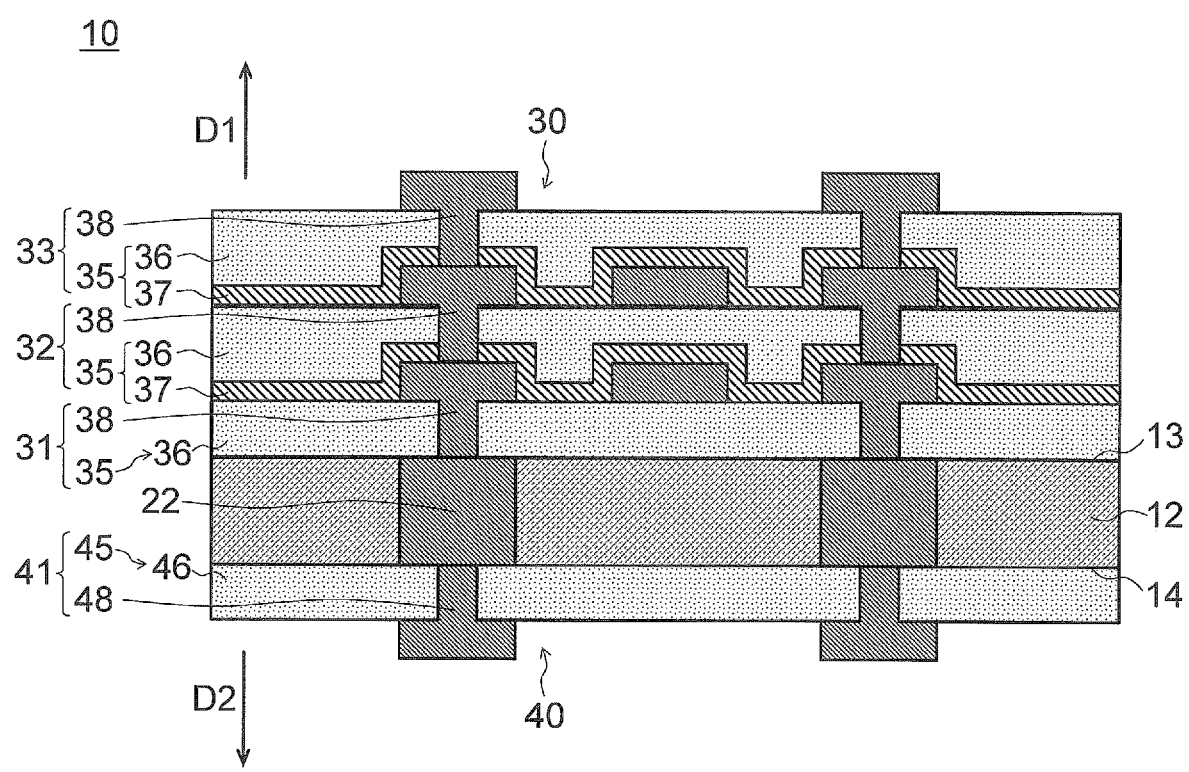
FIG. 69 is a sectional view showing an example of the through electrode substrate according to the fifth embodiment.

In the example shown in FIG. 68, the second wiring structure 40 has the inorganic layer 47 that covers the electroconductive layer 48 from the second side D2 but does not cover the whole area of the organic layer 46. However, not limited thereto, in the second wiring structure 40, there may be a wiring layer in which neither the electroconductive layer 48 nor the organic layer 46 is covered with the inorganic layer 47. For example, as shown in FIG. 69, when the number of layers of the electroconductive layer 48 included in the second wiring structure 40 is one, neither the electroconductive layer 48 nor the organic layer 46 of the first wiring layer 41 may be covered with the inorganic layer 47. For example, the second wiring structure 40 may have a wiring layer that does not include the inorganic layer 47.

When the number of layers of the electroconductive layer 48 included in the second wiring structure 40 is one, the number of layers of the organic layer 46 included in the second wiring structure 40 is also small, e.g., one. Thus, in the through electrode substrate 10 shown in FIG. 69, the degree of warp generated in the second wiring structure 40 caused by the thermal expansion of the organic layer is further smaller than that of the through electrode substrate 10 shown in FIG. 68. Thus, the impact given to the warp of the substrate 12 as a whole by the fact that the second wiring structure 40 does not include the inorganic layer 47 is considered to be insignificant.

In addition, according to the through electrode substrate 10 shown in FIG. 69, since the second wiring structure 40 does not include the inorganic layer 47, the number of steps required for manufacturing the second wiring structure 40 can be decreased. Thus, the manufacturing cost of the through electrode substrate 10 can be lowered.

In the example shown in FIG. 69, the number of layers of the electroconductive layer 38 included in the first wiring structure 30 is three, while the number of layers of the electroconductive layer 48 included in the second wiring structure 40 is one. However, as long as the number of layers of the electroconductive layer 38 is larger than the number of layers of the electroconductive layer 48, the specific numbers of the layers are optional. For example, when the number of layers of the electroconductive layer 48 is one, the number of layers of the electroconductive layer 38 may be two or four.

In addition, in the example shown in FIG. 69, the through electrode 22 is a filled via. However, not limited thereto, similarly to the aforementioned second embodiment, the through electrode 22 may be a conformal via.

Second Modification Example

Figure 70:
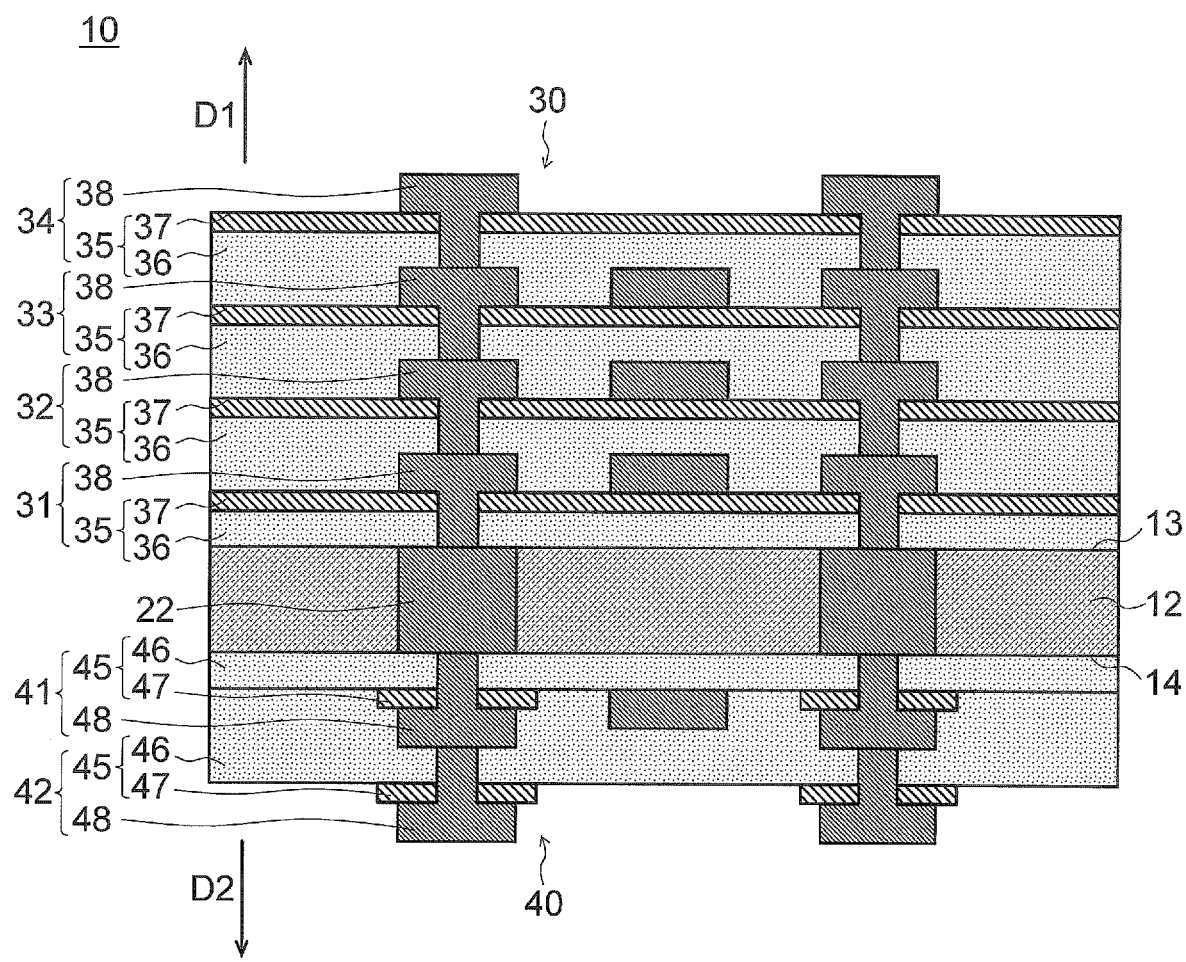
FIG. 70 is a sectional view showing an example of the through electrode substrate according to the fifth embodiment.

FIG. 70 is a sectional view showing a through electrode substrate 10 according to a second modification example of this embodiment. The through electrode substrate 10 shown in FIG. 70 is a further modification example of the through electrode substrate 10 according to the fourth modification example of the third embodiment shown in FIG. 54.

In the example shown in FIG. 54, the inorganic layer 47 included in the second wiring structure 40, which has the smaller number of layers of the electroconductive layer than that of the first wiring structure 30, is in contact with the second portion 48*b* of the electroconductive layer 48 from the first side D1, and covers the organic layer 46 from the second side D2. However, not limited thereto, as shown in FIG. 70, the inorganic layer 47 is in contact with the second portion 48*b* of the electroconductive layer 48 from the second side D2, but may not cover the whole area of the organic layer 46. In other words, the organic layer 46 may include a portion that is not covered with the inorganic layer 47 from the second side D2. As a result, a ratio of a portion of the organic layer 46 of the first wiring layer 41 of the second wiring structure 40, which is covered with the inorganic layer 47 of the first wiring layer 41, is lower than a ratio of a portion of the organic layer 36 of the first wiring layer 31 of the first wiring structure 30, which is covered with the inorganic layer 37 of the first wiring layer 31. A difference between the ratios is not less than 1%, for example. The difference between the ratios may be not more than 20%. In the example shown in FIG. 70, a portion of the organic layer 46 of the first wiring layer 41, which is positioned between the through electrode 22 and the electroconductive early 48 of the second wiring layer 42, and a portion therearound are covered with the inorganic layer 47 from the second side D2.

A thickness of the organic layer 47 of the second wiring structure 40 may be equivalent to a thickness of the inorganic layer 37 of the first wiring structure 30, but may be smaller than the thickness of the inorganic layer 37 of the first wiring structure 30. For example, the thickness of the inorganic layer 47 of the second wiring structure 40 may be at least not less than 30% of the thickness of the inorganic layer 37 of the first wiring structure.

Also in the example shown in FIG. 70, similarly to the aforementioned third embodiment and the fourth embodiment, the first wiring layer 41 of the second wiring structure 40 includes the inorganic layer 47 that is in contact with the second portion 48*b* of the electroconductive layer 48 of the first wiring layer 41 from the first side D1. Thus, when constituent elements of the through electrode substrate 10 are thermally expanded or thermally shrunk because of change in atmospheric temperature, it can be prevented that the electroconductive layer 48 of the first wiring layer 41 is displaced in the normal direction of the first surface 13 of the through electrode substrate 10.

In addition, in the example shown in FIG. 70, the organic layer 46 of the first wiring layer 41 of the second wiring structure 40 includes a portion that is not covered with the inorganic layer 47 from the second side D2. Thus, it is easy for a gas generated in the through electrode 22 to escape outside the through electrode substrate 10 through the organic layer 46 of the first wiring layer 41. As a result, it can be prevented that the electroconductive layer 48 of the first wiring layer 41 is pushed up or blown off.

In the example shown in FIG. 70, the number of layers of the electroconductive layer 48 of the second wiring structure 40 is smaller than the number of layers of the electroconductive layer 38 of the first wiring structure 30. Thus, the number of layers of the organic layer 46 of the second wiring structure 40 is smaller than the number of layers of the organic layer 36 of the first wiring structure 30. Therefore, the degree of warp generated in the second wiring structure 40 caused by the thermal expansion of the organic layer is smaller than the degree of warp generated in the first wiring structure 30. Thus, the impact given to the warp of the substrate 12 as a whole by the fact that the organic layer 46 of the first wiring layer 41 of the second wiring structure 40 includes a portion that is not covered with the inorganic layer 47 from the second side D2 is considered to be insignificant.

In the example shown in FIG. 70, the number of layers of the electroconductive layer 38 included in the first wiring structure 30 is four, while the number of layers of the electroconductive layer 48 included in the second wiring structure 40 is two. However, as long as the number of layers of the electroconductive layer 38 is larger than the number of layers of the electroconductive layer 48, the specific numbers of the layers are optional. For example, when the number of layers of the electroconductive layer 48 is two, the number of layers of the electroconductive layer 38 may be three or five.

In addition, in the example shown in FIG. 70, the through electrode 22 is a filled via. However, not limited thereto, similarly to the aforementioned fourth embodiment, the through electrode 22 may be a conformal via.

Third Modification Example

Figure 71:
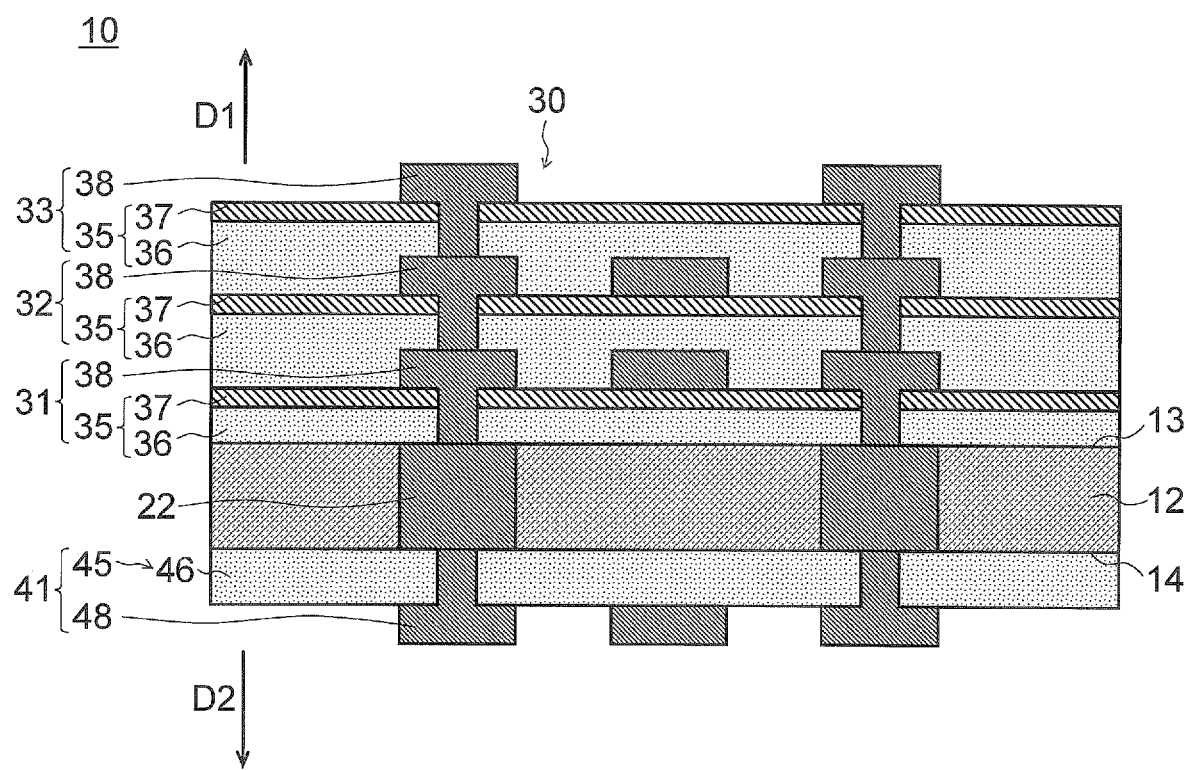
FIG. 71 is a sectional view showing an example of the through electrode substrate according to the fifth embodiment.

In the example shown in FIG. 70, the second wiring structure 40 has the inorganic layer 47 that is in contact with the electroconductive layer 48 from the first side D2. However, not limited thereto, in the second wiring structure 40, there may be a wiring layer in which neither the electroconductive layer 48 nor the organic layer 46 is in contact with the inorganic layer 47. For example, as shown in FIG. 71, when the number of layers of the electroconductive layer 48 included in the second wiring structure 40 is one, neither the electroconductive layer 48 nor the organic layer 46 of the first wiring layer 41 may be in contact with the inorganic layer 47. For example, the second wiring structure 40 may have a wiring layer that does not include the inorganic layer 47.

When the number of layers of the electroconductive layer 48 included in the second wiring structure 40 is one, the number of layers of the organic layer 46 included in the second wiring structure 40 is also small, e.g., one. Thus, in the through electrode substrate 10 shown in FIG. 71, the degree of warp generated in the second wiring structure 40 caused by the thermal expansion of the organic layer is further smaller than that of the through electrode substrate 10 shown in FIG. 70. Thus, the impact given to the warp of the substrate 12 as a whole by the fact that the second wiring structure 40 does not include the inorganic layer 47 is considered to be insignificant.

In addition, according to the through electrode substrate 10 shown in FIG. 71, since the second wiring structure 40 does not include the inorganic layer 47, the number of steps required for manufacturing the second wiring structure 40 can be decreased. Thus, the manufacturing cost of the through electrode substrate 10 can be lowered.

In the example shown in FIG. 71, the number of layers of the electroconductive layer 38 included in the first wiring structure 30 is three, while the number of layers of the electroconductive layer 48 included in the second wiring structure 40 is one. However, as long as the number of layers of the electroconductive layer 38 is larger than the number of layers of the electroconductive layer 48, the specific numbers of the layers are optional. For example, when the number of layers of the electroconductive layer 48 is one, the number of layers of the electroconductive layer 38 may be two or four.

In addition, in the example shown in FIG. 71, the through electrode 22 is a filled via. However, not limited thereto, similarly to the aforementioned fourth embodiment, the through electrode 22 may be a conformal via.

Modification Examples of Shape of Through Hole

Figure 58:
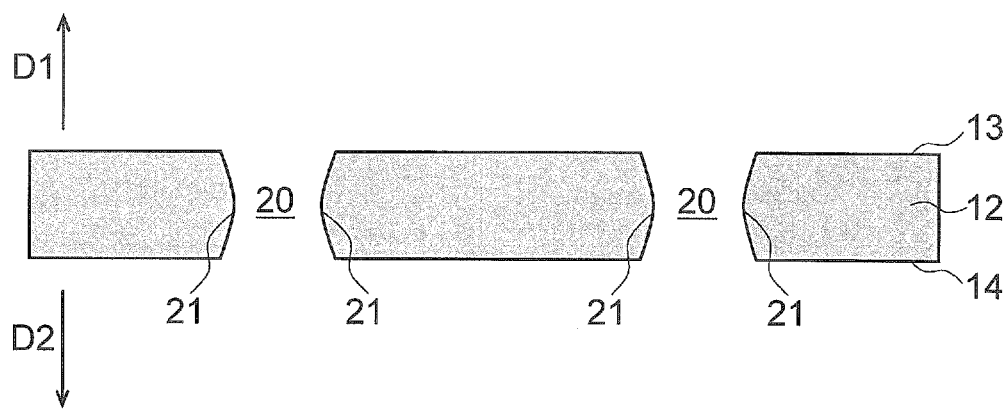
FIG. 58 is a sectional view showing a modification example of a through hole of a substrate.

In the aforementioned respective embodiment, although the through electrode 22 provided in the substrate 12 runs parallel to the direction orthogonal to the normal direction of the first surface 13 of the substrate 12, the shape of the through hole 20 is not specifically limited. For example, as shown in FIG. 58, the through hole 20 may have a shape that narrows between the first surface 13 and the second surface 14. Alternatively, as shown in FIG. 59, the through hole 20 may have a tapered shape in which the size of the through hole 20 decreases from one side of the first surface 13 and the second surface 14 to the other side.

Figure 60:
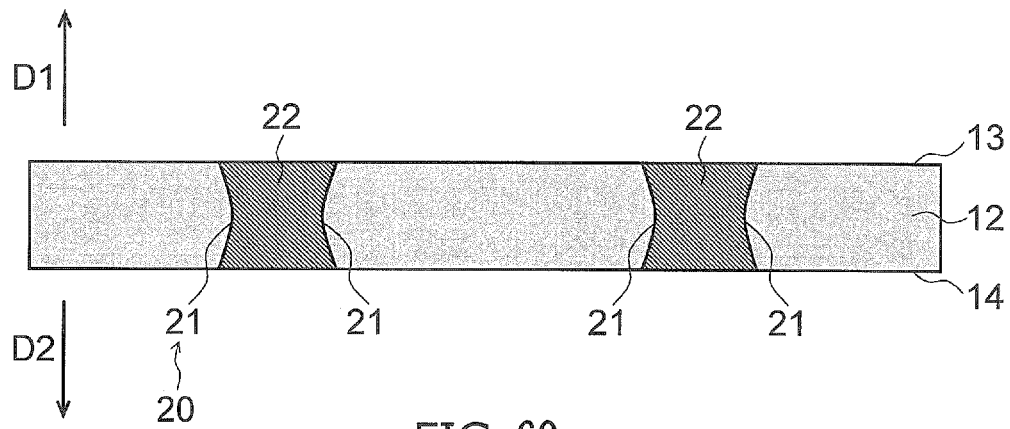
FIG. 60 is a sectional view showing an example of a through electrode provided in the through hole shown in FIG. 58.
Figure 61:
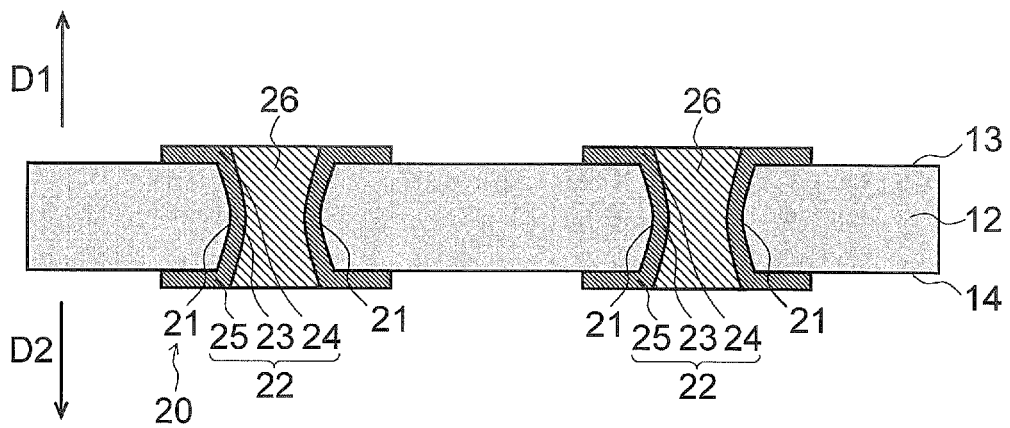
FIG. 61 is a sectional view showing an example of a through electrode provided in the through hole shown in FIG. 58.
Figure 62:
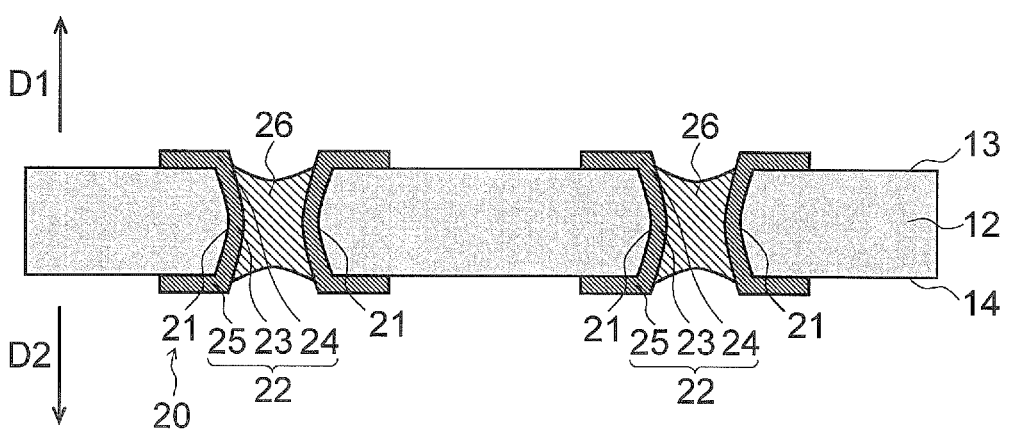
FIG. 62 is a sectional view showing an example of a through electrode provided in the through hole shown in FIG. 58.

The through electrode 22 provided in the through hole 20 shown in FIG. 58 may be a filled via as shown in FIG. 60, or may be a conformal via as shown in FIG. 61 or 62. In the case where the through electrode 22 is a conformal via, as shown in FIG. 61, the through hole 20 may be filled with the filling member 26. Alternatively, as shown in FIG. 62, in the through hole 20, there may be a gap which is not filled with the filling member 26.

Figure 59:
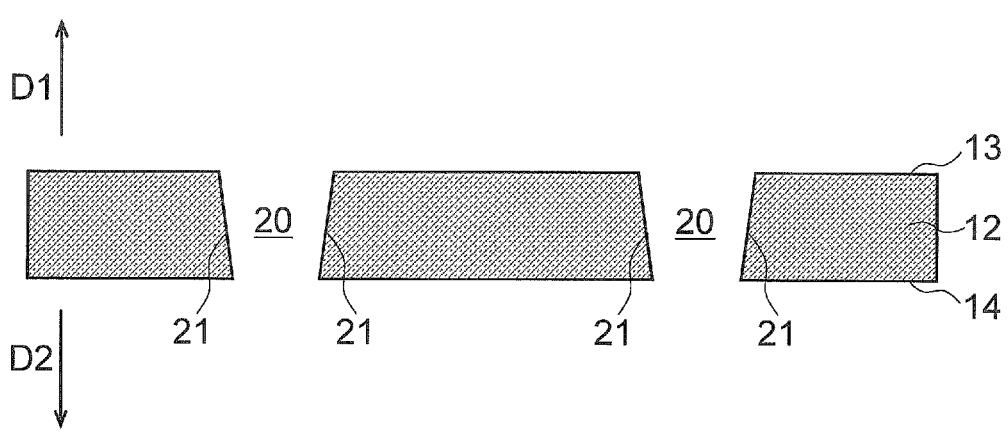
FIG. 59 is a sectional view showing a modification example of a through hole of a substrate.
Figure 63:
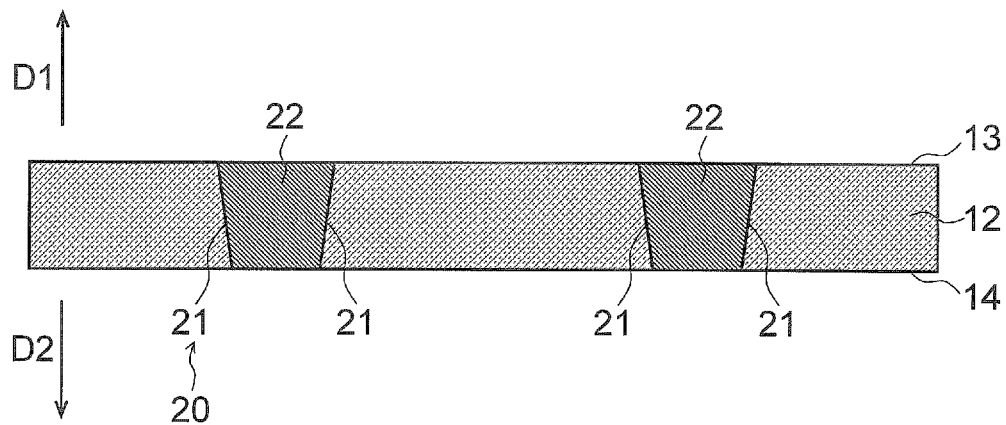
FIG. 63 is a sectional view showing an example of a through electrode provided in the through hole shown in FIG. 59.
Figure 64:
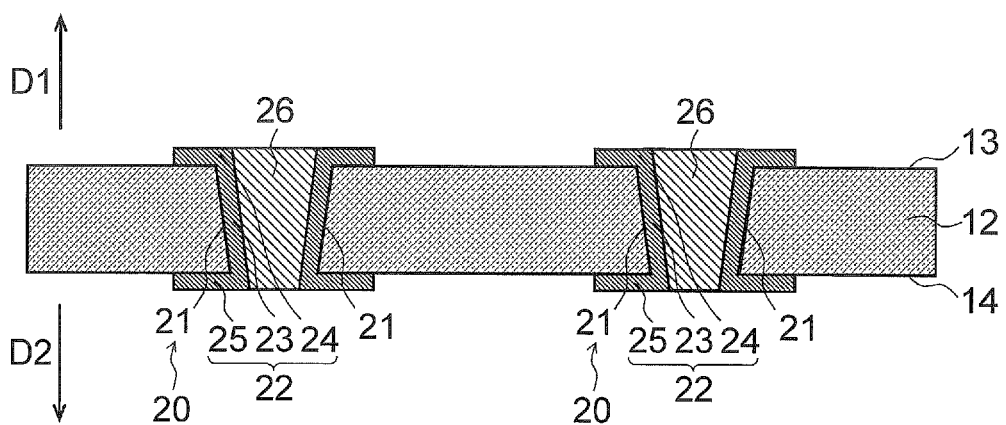
FIG. 64 is a sectional view showing an example of a through electrode provided in the through hole shown in FIG. 59.
Figure 65:
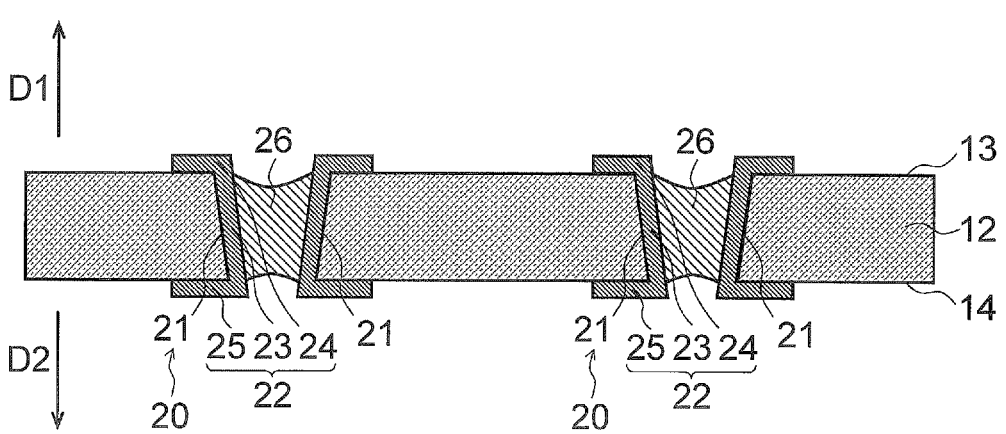
FIG. 65 is a sectional view showing an example of a through electrode provided in the through hole shown in FIG. 59.

The through electrode 22 provided in the through hole 20 shown in FIG. 59 may also be a filled via as shown in FIG. 63, or may be a conformal via as shown in FIG. 64 or 65. In the case where the through electrode 22 is a conformal via, as shown in FIG. 64, the through hole 20 may be filled with the filling member 26. Alternatively, as shown in FIG. 65, in the through hole 20, there may be a gap which is not filled with the filling member 26.

Figure 66:
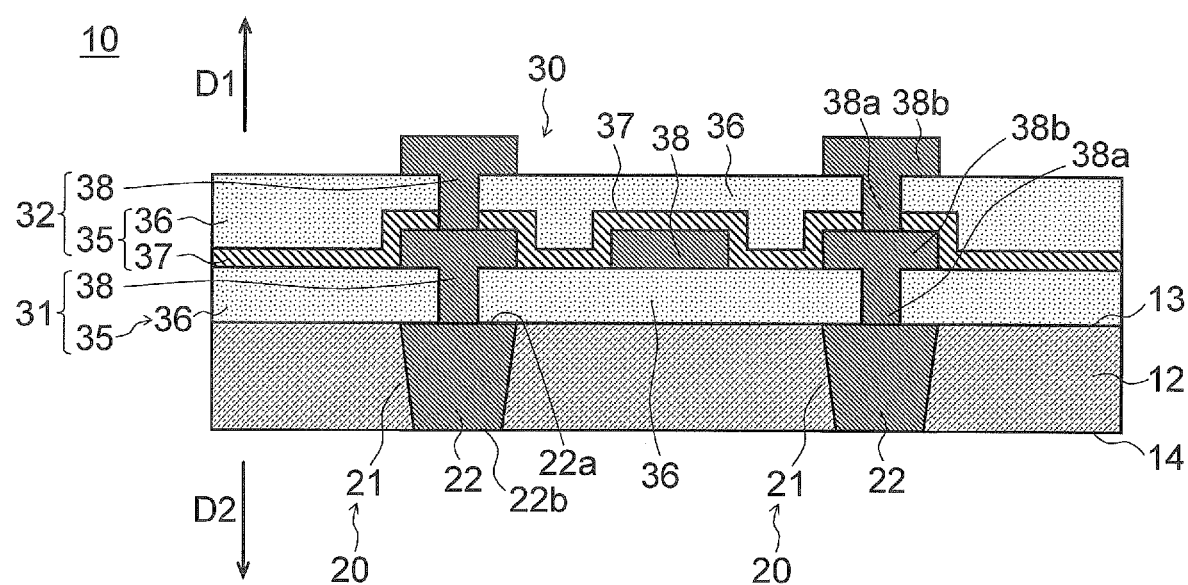
FIG. 66 is a sectional view showing an example in which the substrate and through hole shown in FIG. 63 and a first wiring structure shown in FIG. 1 are combined.
Figure 67:
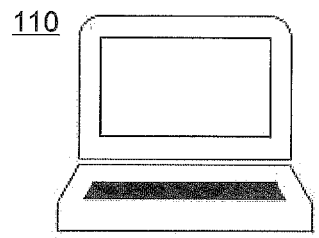
FIG. 67 is a view showing examples of products on which the through electrode substrate is loaded.
Figure 67:
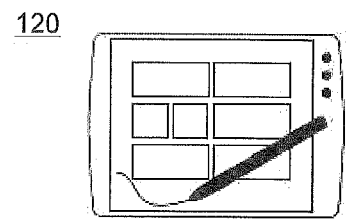
Figure 67:
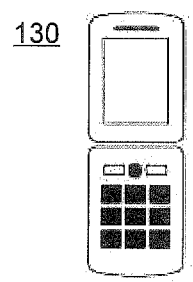
Figure 67:
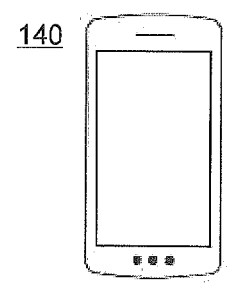
Figure 67:
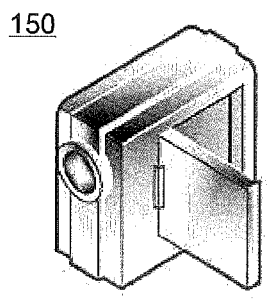
Figure 67:
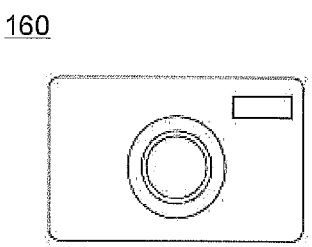
Figure 67:
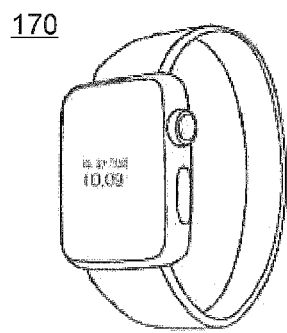
Figure 67:
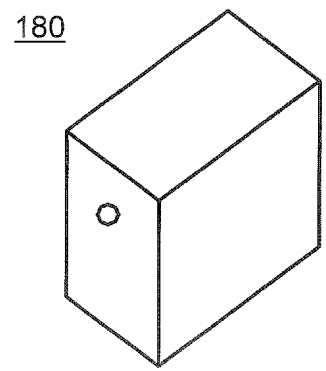

The substrate 12 and the through electrode 22 shown in FIGS. 60 to 65 may be optionally combined with the first wiring structure 30 and the second wiring structure in the aforementioned respective embodiments. FIG. 66 shows an example in which the substrate 12 and the through electrode 22 shown in FIG. 63 are combined with the first wiring structure 30 in the first embodiment.

Examples of Product on which Through Electrode Substrate is Loaded

FIG. 97 is a view showing examples on which the through electrode substrate 10 according to the embodiment can be loaded. The through electrode substrate 10 according to the embodiment can be used in various products. For example, the through electrode substrate 10 can be loaded on a note-type personal computer 110, a tablet terminal 120, a mobile phone 130, a smart phone 140, a digital video camera 150, a digital camera 160, a digital watch 170, a server 180 and so on.

10 Through electrode substrate
12 Substrate
13 First surface
14 Second surface
20 Through hole
21 Sidewall
22 Through electrode
22a First end surface
22b Second end surface
221 Barrier layer
222 Seed layer
223 Plated Layer
23 Sidewall portion
24 First portion
25 Second portion
26 Filling member
30 First wiring structure
31 First wiring layer
32 Second wiring layer
35 Insulation layer
36 Organic layer
361 Opening
37 First inorganic layer
371 First inorganic layer
372 Second inorganic layer
373 Opening
38 Electroconductive layer
381 Barrier layer
382 Seed layer
383 Plated layer
39 Resist layer
391 Opening
40 Second wiring structure
41 First wiring layer
42 Second wiring layer
45 Insulation layer
46 Organic layer
47 Inorganic layer
471 First inorganic layer
472 Second inorganic layer
48 Electroconductive layer
481 Barrier layer
482 Seed layer
483 Plated layer
49 Resist layer
51 Protective layer
52 Protective layer
53 Joint member
54 Adhesive layer
60 Mounting substrate
61 Element
62 Terminal
D1 First side
D2 Second side

What is claimed is:

1. A through electrode substrate comprising:
a first side of the through electrode substrate;
a second side of the through electrode substrate opposite the first side;
a substrate including a first surface facing the first side, and a second surface facing the second side, the substrate being provided with a through hole;
a through electrode positioned in the through hole of the substrate, the through electrode having a first end surface facing the first side and a second end surface facing the second side; and
a first wiring structure including at least a first wiring layer positioned on the first surface of the substrate, and a second wiring layer positioned on the first wiring layer, wherein
the first wiring layer has a first insulation layer provided with a first opening positioned on the first end surface of the through electrode, and a first electroconductive layer connected to the first end surface of the through electrode through the first opening of the first insulation layer, the second wiring layer has a second insulation layer provided with a second opening positioned on the first electroconductive layer of the first wiring layer, and a second electroconductive layer connected to the first electroconductive layer of the first wiring layer through the second opening of the second insulation layer, the first electroconductive layer of the first wiring layer is connected to the first end surface at a position overlapped with the through hole of the substrate when seen along the normal direction of the first surface of the substrate, the first insulation layer of the first wiring layer includes at least an organic layer, which is in contact with the first end surface of the through electrode, the second insulation layer of the second wiring layer includes an inorganic layer having insulation properties, and the inorganic layer of the second insulation layer of the second wiring layer is positioned toward the first side relative to the organic layer of the first insulation layer of the first wiring layer.

2. The through electrode substrate according to claim 1, wherein
the inorganic layer of the second insulation layer of the second wiring layer is in contact with the first electroconductive layer of the first wiring layer.

3. The through electrode substrate according to claim 1, wherein
the inorganic layer of the second insulation layer of the second wiring layer at least partially covers the first electroconductive layer of the first wiring layer.

4. The through electrode substrate according to claim 1, wherein
the second insulation layer of the second wiring layer further has an organic layer positioned toward the first side relative to the inorganic layer of the second insulation layer of the second wiring layer.

5. The through electrode substrate according to claim 1, wherein
the first wiring structure further includes a third wiring layer positioned on the second wiring layer,
the third wiring layer includes: a third insulation layer including an inorganic layer and an organic layer, the third insulation layer being provided with a third opening positioned on the second electroconductive layer of the second wiring layer; and a third electroconductive layer connected to the second electroconductive layer of the second wiring layer through the third opening of the third insulation layer, and
the organic layer of the third insulation layer of the third wiring layer is positioned toward the first side relative to the inorganic layer of the third insulation layer of the third wiring layer.

6. The through electrode substrate according to claim 1, wherein
the through electrode substrate further comprises a second wiring structure including at least a first wiring layer positioned on the second surface of the substrate, and a second wiring layer positioned on the first wiring layer,
the first wiring layer of the second wiring structure has a first insulation layer provided with a first opening positioned on the second end surface of the through electrode, and a first electroconductive layer connected to the second end surface of the through electrode through the first opening of the first insulation layer of the second wiring structure, the second wiring layer of the second wiring structure has a second insulation layer provided with a second opening positioned on the first electroconductive layer of the first wiring layer, and a second electroconductive layer connected to the first electroconductive layer of the first wiring layer through the second opening of the second insulation layer of the second wiring structure, and the first insulation layer of the first wiring layer of the second wiring structure includes at least an organic layer.

7. The through electrode substrate according to claim 6, wherein
the second insulation layer of the second wiring layer of the second wiring structure includes an inorganic layer having insulation properties, and
the inorganic layer of the second insulation layer of the second wiring layer of the second wiring structure at least partially covers the first electroconductive layer of the first wiring layer of the second wiring structure.

8. The through electrode substrate according to claim 7, wherein
the number of layers of the second electroconductive layer included in the second wiring structure is smaller than the number of layers of the first electroconductive layer included in the first wiring structure, and
the organic layer of the first wiring layer of the second wiring structure includes a portion that is not covered with the inorganic layer of the second wiring layer of the second wiring structure.

9. The through electrode substrate according to claim 8, wherein
a ratio of a portion of the organic layer of the first wiring layer of the second wiring structure, which portion is covered with the inorganic layer of the second wiring layer of the second wiring structure, is lower than a ratio of a portion of the organic layer of the first wiring layer of the first wiring structure, which portion is covered with the inorganic layer of the second wiring layer of the first wiring structure.

10. The through electrode substrate according to claim 1, wherein
the through electrode substrate further comprises a second wiring structure including at least a first wiring layer positioned on the second surface of the substrate,
the first wiring layer of the second wiring structure has a first insulation layer provided with a first opening positioned on the second end surface of the through electrode, and a first electroconductive layer connected to the second end surface of the through electrode through the first opening of the first insulation layer,
the first insulation layer of the first wiring layer of the second wiring structure includes at least an organic layer, and
the first electroconductive layer and the organic layer of the first wiring layer of the second wiring structure is not covered with an inorganic layer having insulation properties.

11. The through electrode substrate according to claim 1, wherein
the first insulation layer of the first wiring layer includes the inorganic layer positioned toward the first side relative to the organic layer.

12. The through electrode substrate according to claim 11, wherein
the inorganic layer of the first insulation layer of the first wiring layer is at least partially in contact with the first electroconductive layer of the first wiring layer from the second side.

13. The through electrode substrate according to claim 1, wherein
the organic layer contains at least polyimide, epoxy or acryl.

14. The through electrode substrate according to claim 1, wherein
the inorganic layer contains at least silicon oxide or silicon nitride.

15. A mounting substrate comprising:
the through electrode substrate according to claim 1; and
an element loaded on the through electrode substrate.

* * * * *